US009425407B2

(12) United States Patent
Hwang et al.

(10) Patent No.: US 9,425,407 B2
(45) Date of Patent: Aug. 23, 2016

(54) HETEROCYCLIC COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Seok-Hwan Hwang, Yongin (KR); Soo-Yon Kim, Yongin (KR); Jong-Woo Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 14/198,372

(22) Filed: Mar. 5, 2014

(65) Prior Publication Data

US 2015/0090964 A1 Apr. 2, 2015

(30) Foreign Application Priority Data

Sep. 27, 2013 (KR) ........................ 10-2013-0115720

(51) Int. Cl.

*H01L 51/00* (2006.01)
*H01L 51/50* (2006.01)

(52) U.S. Cl.

CPC ........ *H01L 51/0058* (2013.01); *H01L 51/0052* (2013.01); *H01L 51/0067* (2013.01); *H01L 51/0073* (2013.01); *H01L 51/0074* (2013.01); *H01L 51/5012* (2013.01); *H01L 51/5016* (2013.01); *H01L 51/5072* (2013.01); *H01L 51/5092* (2013.01)

(58) Field of Classification Search

None
See application file for complete search history.

(56) References Cited

U.S. PATENT DOCUMENTS

| | | | |
|---|---|---|---|
| 5,645,948 A | 7/1997 | Shi et al. | |
| 6,465,115 B2 | 10/2002 | Shi et al. | |
| 6,596,415 B2 | 7/2003 | Shi et al. | |
| 2003/0165715 A1 | 9/2003 | Yoon et al. | |
| 2005/0002857 A1 | 1/2005 | Pez et al. | |
| 2007/0200490 A1 | 8/2007 | Kawamura et al. | |
| 2009/0019768 A1 | 1/2009 | Toseland et al. | |
| 2015/0014656 A1* | 1/2015 | Lim | C07B 59/002 257/40 |

FOREIGN PATENT DOCUMENTS

| | | |
|---|---|---|
| JP | 10-017860 A | 1/1998 |
| JP | 11-087067 A | 3/1999 |
| KR | 2003-0067773 | 8/2003 |
| KR | 10-2012-0051598 A | 5/2012 |
| KR | 10-2012-0101558 | 9/2012 |

OTHER PUBLICATIONS

Tang, C.W., et al., *Organic electroluminescent diodes*, Applied Physics Letters, Sep. 21, 1987, vol. 51, No. 12, pp. 913-915.

Adachi, C., et al., *Confinement of charge carriers and molecular excitons within 5-nm-thick emitter layer in organic electroluminescent devices with a double heterostructure*, Applied Physics Letters, Aug. 6, 1990, vol. 57, No. 6, pp. 531-533.

Tao, Y.T., et al., *Sharp green electroluminescence from 1H-pyrazolo[3,4-b] quinoline-based light emitting diodes*, Applied Physics Letters, Sep. 11, 2000, vol. 77, No. 11, pp. 1575-1577.

Sakamoto, Y., et al., *Synthesis, Characterization, and Electron-Transport Property of Perfluorinated Phenylene Dendrimers*, Journal of American Chemical Society, Feb. 15, 2000, vol. 122, pp. 1832-1833.

Yamaguchi, S., et al., *Diphenylamino-Substituted 2,5-Diarylsiloles for Single-Layer Organic Electroluminescent Devices*, Chemistry Letters, (2001), pp. 98-99.

Johansson, N., et al., *Solid-State Amplified Spontaneous Emission in Some Spiro-Type Molecules: A New Concept for the Design of Solid-State Lasing Molecules*, Advanced Materials, Mar. 6, 1998, vol. 10, No. 14, pp. 1136-1141.

Internet Material: 2009 Fall Assembly and Symposium. vol. 34, No. 2, 2009; Publication Date, Oct. 8, 2009-Oct. 9, 2009; Title: A novel conjugated polymer based on 4H-benzo[def]carbazole backbone for OLED, 1 page.

* cited by examiner

*Primary Examiner* — J. L. Yang
(74) *Attorney, Agent, or Firm* — Lewis Roca Rothgerber Christie LLP

(57) ABSTRACT

A compound represented by Formula 1 or Formula 2 and an organic light-emitting device including the same:

Formula 1

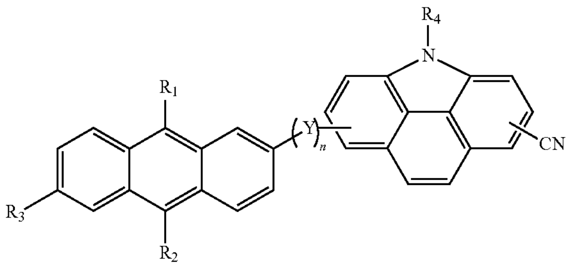

Formula 2

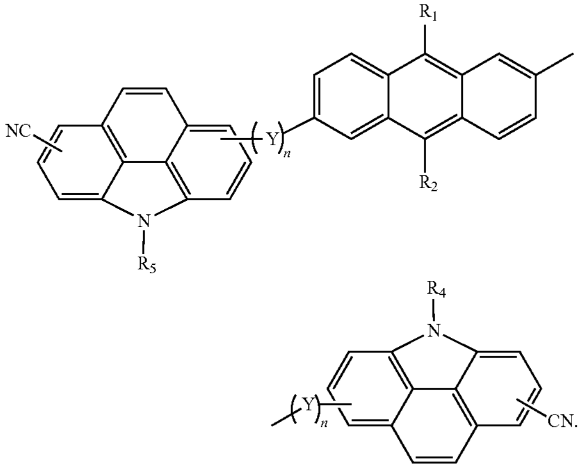

21 Claims, 1 Drawing Sheet

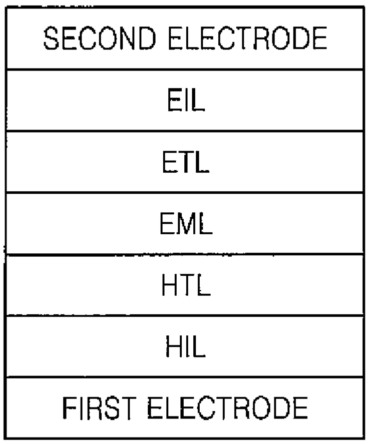
SECOND ELECTRODE
EIL
ETL
EML
HTL
HIL
FIRST ELECTRODE

HETEROCYCLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2013-0115720, filed on Sep. 27, 2013, in the Korean Intellectual Property Office, the disclosure of which is incorporated herein in its entirety by reference.

BACKGROUND

1. Field

One or more embodiments of the present invention relate to a heterocyclic compound and an organic light-emitting device including the same.

2. Description of the Related Art

Organic light emitting devices are self-emission devices that have wide viewing angles, high contrast ratios, short response time, and excellent brightness, driving voltage, and response speed characteristics, and produce full-color images.

A typical organic light-emitting device has a structure including a substrate, and an anode, a hole transport layer, an emission layer, an electron transport layer, and a cathode which are sequentially stacked on the substrate. The hole transport layer, the emission layer, and the electron transport layer are organic thin films formed of organic compounds.

A driving principle of an organic light-emitting device having such a structure is described below.

When a voltage is applied between the anode and the cathode, holes injected from the anode pass the hole transport layer and migrate toward the emission layer, and electrons injected from the cathode pass the electron transport layer and migrate toward the emission layer. Carriers, such as holes and electrons, are recombined in the emission layer to produce excitons. These excitons change from an excited state to a ground state, thereby generating light.

SUMMARY

One or more aspects of embodiments of the present invention are directed toward novel compounds and organic light-emitting devices that have high efficiency, low voltage, high brightness, and a long lifespan due to the inclusion of the novel compounds.

According to an embodiment of the present invention, a compound is represented by Formula 1 or Formula 2 below:

Formula 1

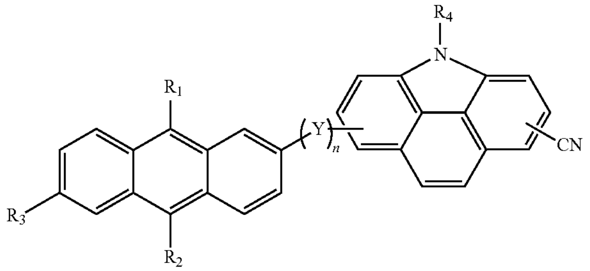

Formula 2

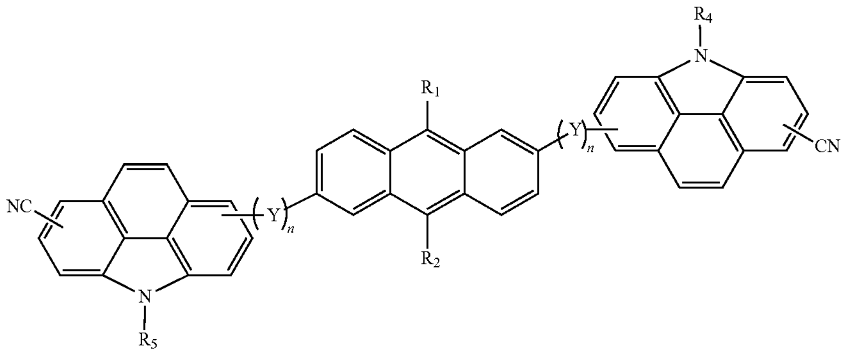

wherein in Formulae 1 and 2, $R_1$ to $R_5$ are each independently a hydrogen, a deuterium, a substituted or unsubstituted C1 to C60 alkyl group, a substituted or unsubstituted C2 to C60 alkenyl group, a substituted or unsubstituted C2 to C60 alkynyl group, a substituted or unsubstituted C3 to C60 cycloalkyl group, a substituted or unsubstituted C3 to C60 cycloalkenyl group, a substituted or unsubstituted C5 to C60 cycloalkynyl group, a substituted or unsubstituted C6 to C60 aryl group, a substituted or unsubstituted C2 to C60 heteroaryl group (excluding a substituted or unsubstituted benzoimidazol group), or a substituted or unsubstituted C6 to C60 arylamino group;

Y is a substituted or unsubstituted C6 to C60 arylene group, or a substituted or unsubstituted C2 to C60 heteroarylene group; and n is 0 or 1.

According to another embodiment of the present invention, an organic light-emitting device includes a first electrode, a second electrode facing the first electrode, and an organic layer between the first electrode and the second electrode, wherein the organic layer includes the compound described above.

According to another embodiment of the present invention, a flat display apparatus includes the organic light-emitting device described above, wherein the first electrode of the organic light-emitting device is electrically connected to a source electrode or a drain electrode of a thin film transistor.

BRIEF DESCRIPTION OF THE DRAWINGS

These and/or other aspects will become apparent and more readily appreciated from the following description of the embodiments, taken in conjunction with the drawing, which is a schematic view of an organic light-emitting device according to an embodiment of the present invention.

DETAILED DESCRIPTION

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. Expressions such as “at least one of,” when preceding a list of elements, modify the entire list of elements and do not modify the individual elements of the list. Further, the use of “may” when describing embodiments of the present invention refers to “one or more embodiments of the present invention.”

A compound according to an embodiment of the present invention is represented by Formula 1 or Formula 2:

Formula 1

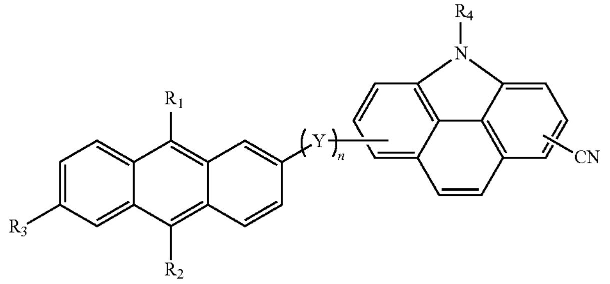

Formula 2

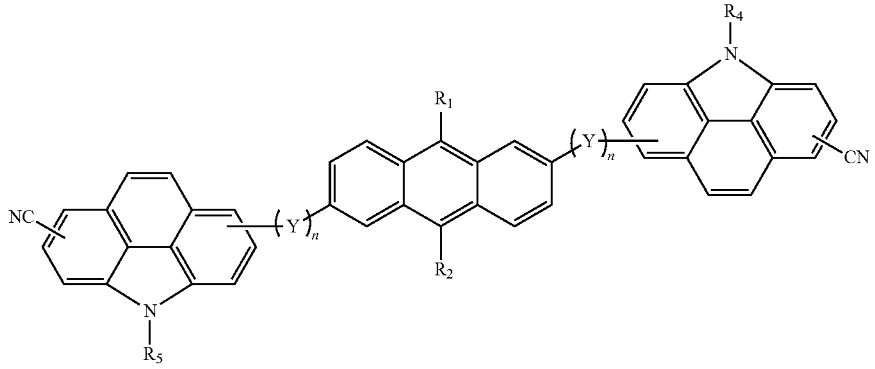

wherein in Formulae 1 and 2, $R_1$ to $R_5$ are each independently a hydrogen, a deuterium, a substituted or unsubstituted C1 to C60 alkyl group, a substituted or unsubstituted C2 to C60 alkenyl group, a substituted or unsubstituted C2 to C60 alkynyl group, a substituted or unsubstituted C3 to C60 cycloalkyl group, a substituted or unsubstituted C3 to C60 cycloalkenyl group, a substituted or unsubstituted C5 to C60 cycloalkynyl group, a substituted or unsubstituted C6 to C60 aryl group, a substituted or unsubstituted C2 to C60 heteroaryl group (excluding a substituted or unsubstituted benzoimidazol group), or a substituted or unsubstituted C6 to C60 arylamino group; and Y is a substituted or unsubstituted C6 to C60 arylene group, or a substituted or unsubstituted C2 to C60 heteroarylene group; and n is 0 or 1.

Organic light emitting devices are self-emission devices that have wide viewing angles, high contrast ratios, and short response time. Due to such characteristics, organic light-emitting devices are getting much attention. Light-emitting devices are categorized as an inorganic light-emitting device (in which an emission layer includes an inorganic compound) and an organic light-emitting device (in which an emission layer includes an organic compound). Also, the organic light-emitting device embodies full-color images. In general, an organic light-emitting device has a stack structure of anode/organic emission layer/cathode, and additionally, a hole injection layer, a hole transport layer, an electron injection layer, or an electron transport layer may be further stacked between the anode and the emission layer or between the emission layer and the cathode. In the latter case, the organic light-emitting device may have a stack structure of anode/hole transport layer/organic emission layer/cathode, or anode/hole transport layer/organic emission layer/electron transport layer/cathode. As a material for the organic emission layer, an anthracene derivative is known. As an electron transport material, $Alq_3$, TBPi, PBD, PF-6P, or PyPySPyPy are known.

For example, in consideration of stability with respect to electrons and electron movement speed characteristics, the electron transport material may be, as an organic mono molecular material, selected from organometallic complexes. From among those materials, Alq3 has the highest stability and the highest electron affinity. However, when Alq3 is used in a blue light-emitting device, due to exciton diffusion-derived emission, color purity deteriorates. Also, a Flavon derivative, which is manufactured by Sanyo company, or a germanium and silicon chloropentadiene derivative, which is manufactured by Chisso company, are known. Examples of the organic mono-molecular material are a 2-biphenyl-4-yl-5-(4-t-butylphenyl)-1,3,4-oxadiazole (PBD) derivative linked to a spiro compound, and 2,2',2"-(benzene-1,3,5-triyl)-tris(1-phenyl-1H-benzimidazole) (TPBI) having a hole blocking capability and an excellent electron transport capability. In particular, a benzo imidazole derivative, which was manufactured by LG Chemical Ltd., is known as having excellent durability.

However, an organic light-emitting device including an electron transport layer having the organic mono-molecular material has a short emission lifespan, and low preservative durability and reliability. This is due to physical or chemical change of an organic material, photochemical or electrochemical change of an organic material, oxidation of a cathode, exfoliation, and/or durability.

These problems can be overcome by providing a novel heterocyclic compound and organic light-emitting device including an organic film having the compound. The novel compound having a hetero-ring substituted with a cyano group according to embodiments of the present invention has excellent electric characteristics, a high charge transport capability, a high glass transition temperature, crystallization-prevention characteristics, and may be used as an electron transport material that is suitable for red, green, blue, and white fluorescent and phosphorescent device, and when the novel compound is used in manufacturing an organic light-emitting device, the manufactured organic light-emitting device has high efficiency, low voltage, high brightness, and a long lifespan.

Hereinafter, substituents of Formula 1 and Formula 2 are described in more detail.

According to an embodiment of the present invention, $R_1$ and $R_2$ in Formulae 1 and 2 are each independently a substituted or unsubstituted C1 to C20 alkyl group or one of Formulae 2a to 2c:

2a

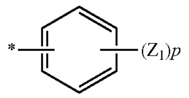

2b

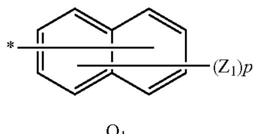

2c

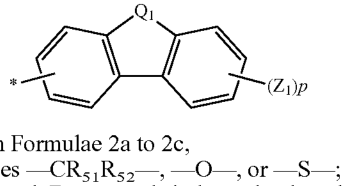

wherein in Formulae 2a to 2c, $Q_1$ indicates —$CR_{51}R_{52}$—, —O—, or —S—;

$R_{51}$, $R_{52}$, and $Z_1$ are each independently a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they (e.g., a plurality of $Z_3$) may be identical or different;

p is an integer of 1 to 7; and * indicates a binding site.

According to another embodiment of the present invention, $R_3$ in Formula 1 may be a hydrogen, a deuterium, or any one of Formulae 3a to 3f:

3a

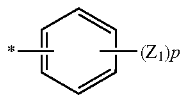

3b

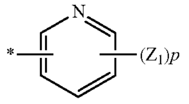

3c

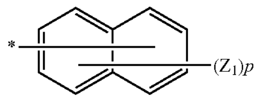

3d

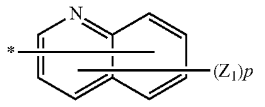

3e

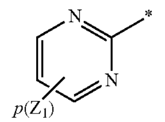

3f

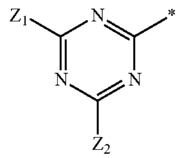

wherein in Formulae 3a to 3f, $Z_1$ and $Z_2$ are each independently a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they may be identical or different;

p is an integer of 1 to 7; and * indicates a binding site.

According to an embodiment of the present invention, $R_4$ and $R_5$ in Formulae 1 and 2 are each independently one of Formulae 4a to 4b:

4a

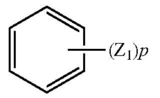

4b

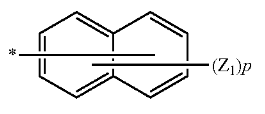

wherein in Formulae 4a and 4b, $Z_1$ is a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they may be identical or different;

p is an integer of 1 to 7; and * indicates a binding site.

According to another embodiment of the present invention, Y in Formulae 1 and may be any one of Formulae 5a to 5c:

5a

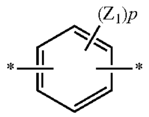

5b

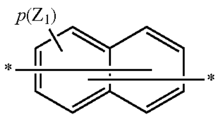

5c

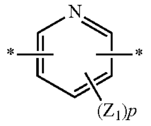

wherein in Formulae 5a to 5c, $Z_1$ is a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they may be identical or different; p is an integer of 1 to 6; and * indicates a binding site.

According to another embodiment of the present invention, the compounds represented by Formula 1 and Formula 2 may be used (utilized) as an electron injection material or electron transport material for an organic light-emitting device.

According to another embodiment of the present invention, $R_4$ and $R_5$ in Formula 2 may be identical.

According to another embodiment of the present invention, $R_1$ and $R_2$ in Formula 1 and Formula 2 may be each independently a phenyl group, a naphthyl group, a phenanthryl group, a biphenyl group, a fluorophenyl group, a cyano phenyl group, or a fluorenyl group.

Hereinafter, definitions of representative substituents from among substituents used herein will be presented (the number of carbon numbers restricting a substituent is not limited, and does not limit properties of the substituent, and unless defined otherwise, the definition of the substituent is consistent with a general definition thereof).

The unsubstituted $C_1$ to $C_{60}$ alkyl group used (utilized) herein may be a linear or branched alkyl group, and non-limiting examples thereof are a methyl group, an ethyl group, a propyl group, an isobutyl group, a sec-butyl group, a pentyl group, an iso-amyl group, a hexyl group, a heptyl group, an octyl group, a nonanyl group, and a dodecyl group, and at least one hydrogen atom of the alkyl group may be substituted with a deuterium atom, a halogen atom, a hydroxyl group, a nitro group, a cyano group, an amino group, an amidino group, a hydrazine group, a hydrazone group, a carboxyl group or a salt thereof, a sulfonic acid group or a salt thereof, a phosphoric acid group or a salt thereof, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, a C6 to $C_{16}$ aryl group, or a $C_2$ to $C_{16}$ heteroaryl group.

The unsubstituted $C_2$ to $C_{60}$ alkenyl group used herein refers to an unsubstituted alkyl group having one or more carbon double bonds at a center or end thereof. Examples of the unsubstituted $C_2$-$C_{60}$ alkenyl group are an ethenyl group, a prophenyl group, and a butenyl group. At least one hydrogen atom of the unsubstituted alkenyl group may be substituted with the same substituents as described in connection with the substituted alkyl group.

The unsubstituted $C_2$ to $C_{60}$ alkynyl group used herein refers to an unsubstituted alkyl group having one or more carbon triple bonds at a center or end thereof. Examples thereof are acetylene, propylene, phenylacetylene, naphthylacetylene, isopropylacetylene, t-butylacetylene, and diphenylacetylene. At least one hydrogen atom of these alkenyl groups may be substituted with the same substituents as described in connection with the substituted alkyl group.

The unsubstituted $C_3$ to $C_{60}$ cycloalkyl group used herein refers to a $C_3$ to $C_{60}$ cyclic alkyl group, and at least one hydrogen atom of the cycloalkyl group may be substituted with the same substituents as described in connection with the $C_1$ to $C_{60}$ alkyl group.

The unsubstituted C1 to C60 alkoxy group used herein refers to a group represented by —OA (wherein A is the unsubstituted $C_1$ to $C_{60}$ alkyl group), and non-limiting examples thereof are ethoxy, isopropyloxy, butoxy, and pentoxy. At least one hydrogen atom of the unsubstituted alkoxy group may be substituted with the same substituents as described in connection with the alkyl group.

The unsubstituted C6 to C60 aryl group used herein refers to a carbocyclic aromatic system having at least one aromatic ring, and when the number of rings is two or more, the rings may be fused to each other or may be linked to each other via, for example, a single bond. The term 'aryl' includes an aromatic system, such as phenyl, naphthyl, or anthracenyl. Also, at least one hydrogen atom of the aryl group may be substituted with the same substituents described in connection with the $C_1$ to $C_{60}$ alkyl group.

Examples of the substituted or unsubstituted C6 to C60 aryl group are a phenyl group, a C1 to C10 alkylphenyl group (for example, an ethylphenyl group), a biphenyl group, a C1 to C10 alkylbiphenyl group, a C1 to C10 alkoxybiphenyl group, o-, m-, and p-tolyl groups, o-, m- and p-cumenyl groups, a mesityl group, a phenoxyphenyl group, (α,α-dimethylbenzene)a phenyl group, (N,N'-dimethyl)aminophenyl group, (N,N'-diaphenyl group)aminophenyl group, a pentalenyl group, an indenyl group, a naphthyl group, a C1 to C10 alkylnaphthyl group (for example, a methyla naphthyl group), a C1 to C10 alkoxynaphthyl group (for example, a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethylchrycenyl group, a pycenyl group, a perylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group.

The unsubstituted C2-C60 heteroaryl group used herein includes at least one hetero atom selected from nitrogen (N), oxygen (O), phosphorous (P), and sulfur (S), and when the group has two or more rings, the rings may be fused to each other or may be linked to each other via, for example, a single bond. Examples of the unsubstituted C2-C60 heteroaryl group are a pyrazolyl group; an imidazolyl group, a oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophene group. Also, at least one hydrogen atom of the heteroaryl may be substituted with the same substituents described in connection with the $C_1$ to $C_{60}$ alkyl group.

The unsubstituted C6 to $C_{60}$ aryloxy group used herein refers to a group represented by —$OA_1$, wherein $A_1$ is the $C_6$ to $C_{60}$ aryl group. An example of the aryloxy group is a phenoxy group. At least one hydrogen atom of the aryloxy group may be substituted with the same substituents described in connection with the $C_1$ to $C_{60}$ alkyl group.

The unsubstituted $C_6$ to $C_{60}$ arylthio group used herein refers to a group represented by —$SA_1$, wherein $A_1$ is the $C_6$ to $C_{60}$ aryl group. Examples of the arylthio group are a benzenethio group and a naphthylthio group. At least one hydrogen atom of the arylthio group may be substituted with the same substituents described in connection with the $C_1$ to $C_{60}$ alkyl group.

The unsubstituted $C_6$ to $C_{60}$ condensed polycyclic group used herein refers to a substituent having two or more rings formed by fusing at least one aromatic ring and/or at least one non-aromatic ring or a substituent in which an unsaturated group is present in a ring but a conjugated system does not exist, and the condensed polycyclic group overall does not have an orientation, which is why the condensed polycyclic group is distinguished from the aryl group or the heteroaryl group.

Detailed examples of the compound represented by Formula 1 or Formula 2 are compounds illustrated below, but are not limited thereto.

1

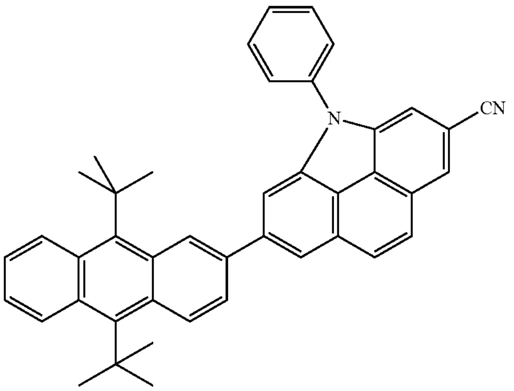

2

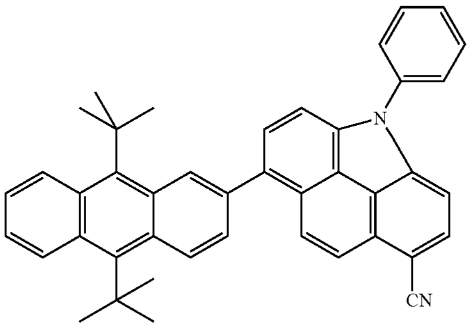

3

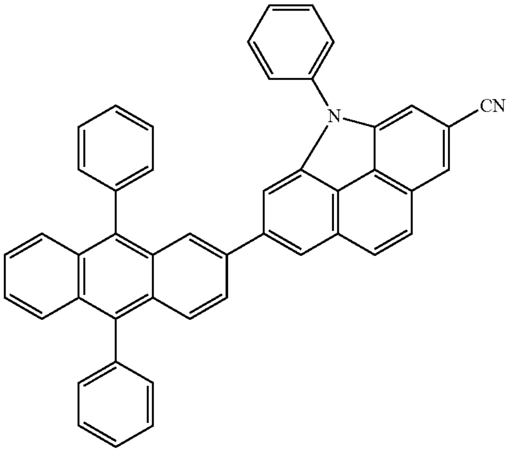

4

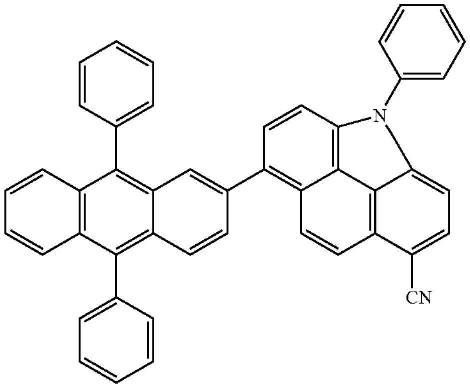

5

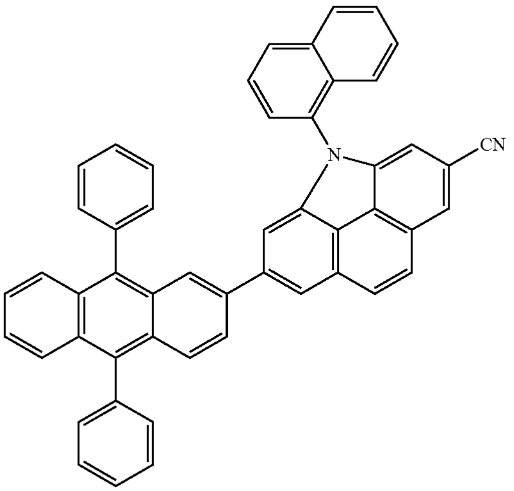

6

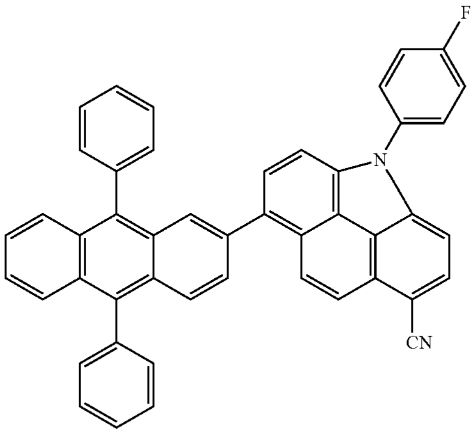

-continued
7
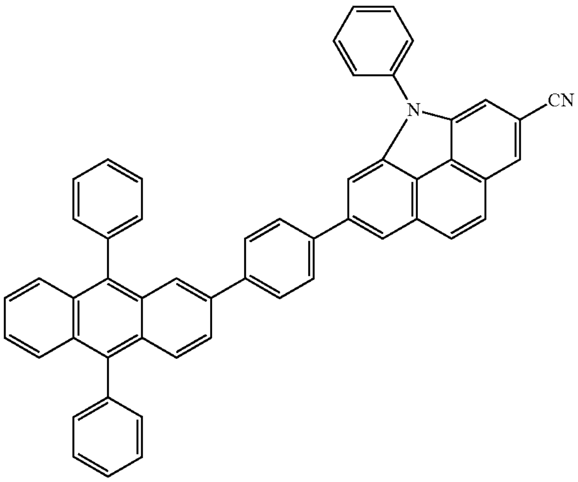
8
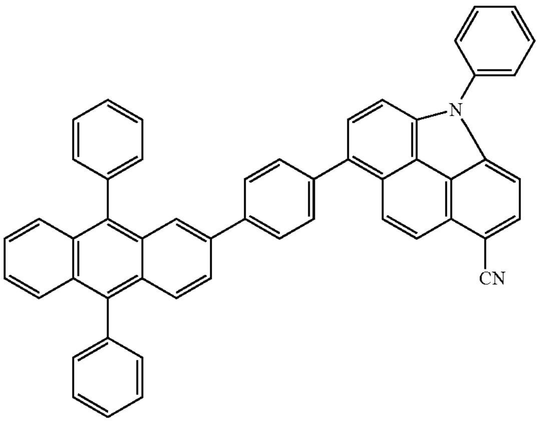
9
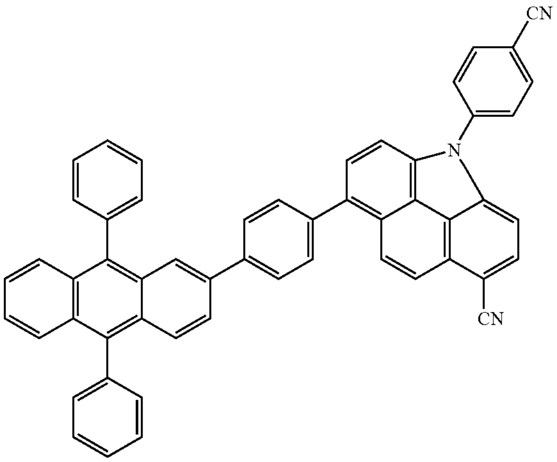
10
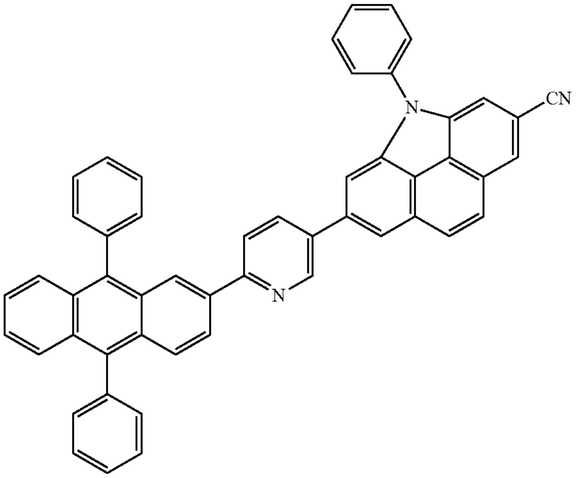
11
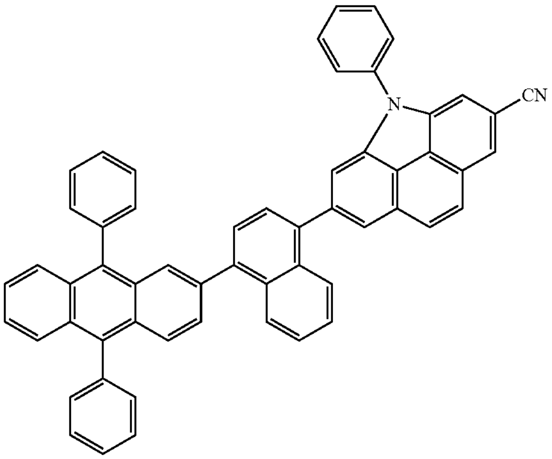
12
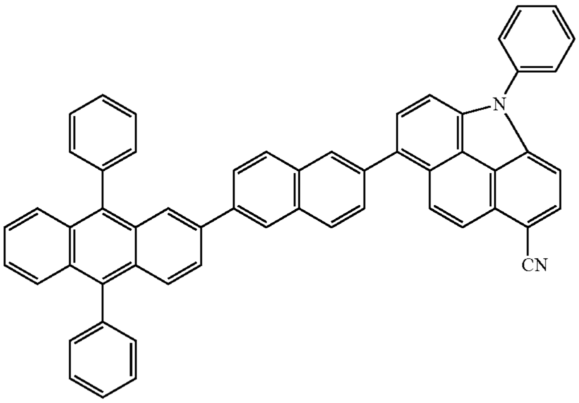

-continued
13
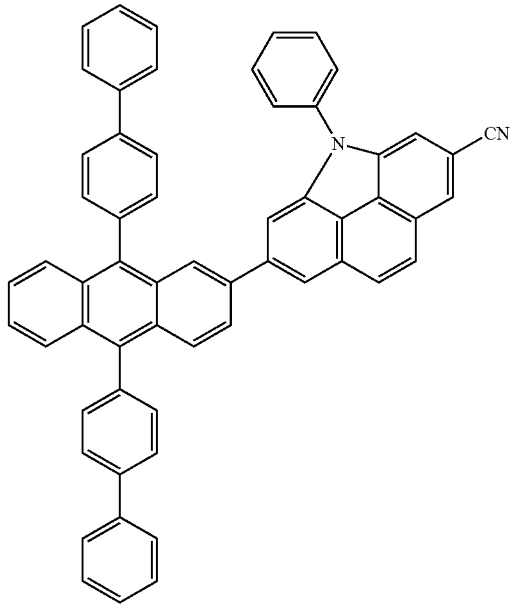
14
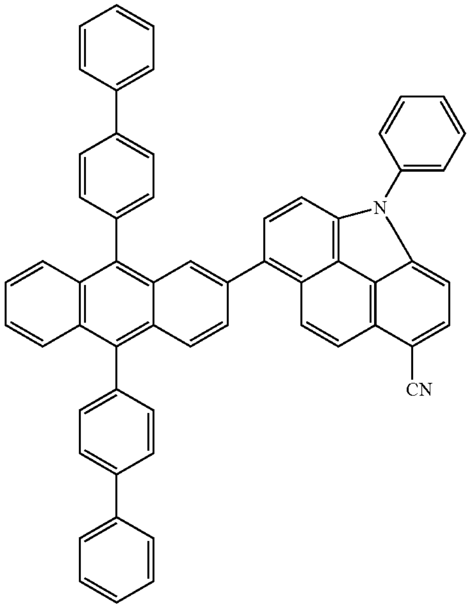
15
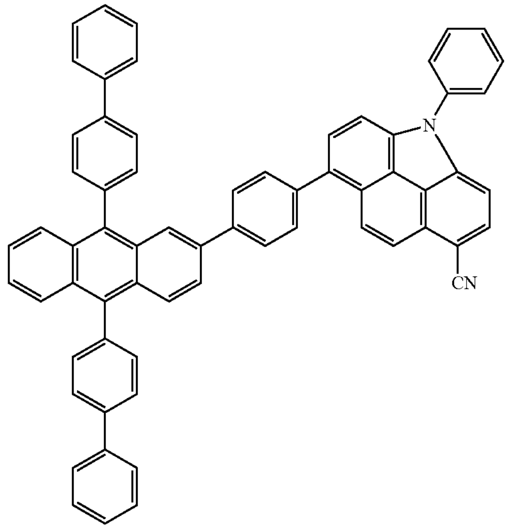
16
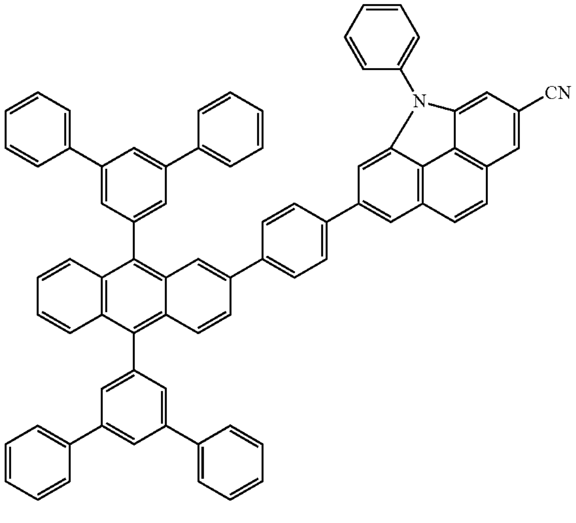

-continued
17
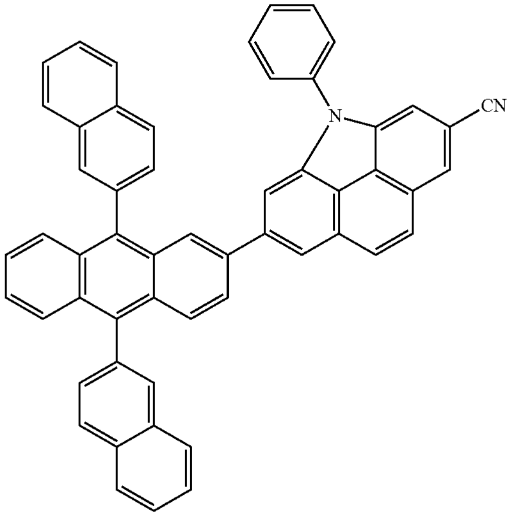
18
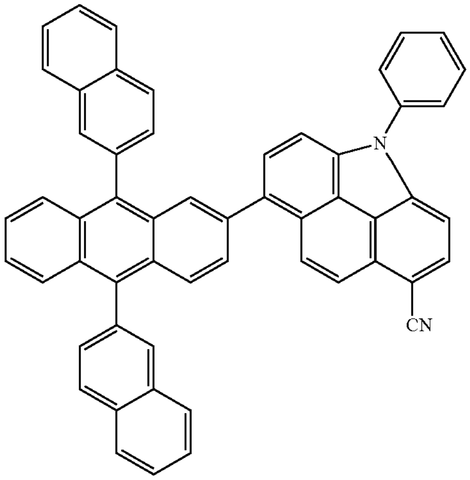
19
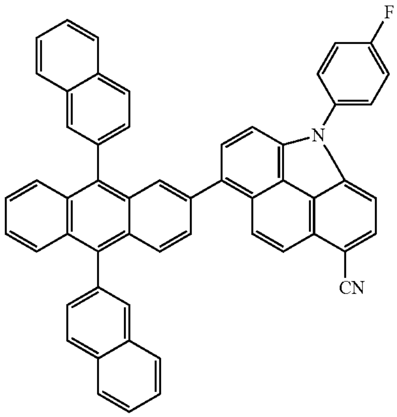
20
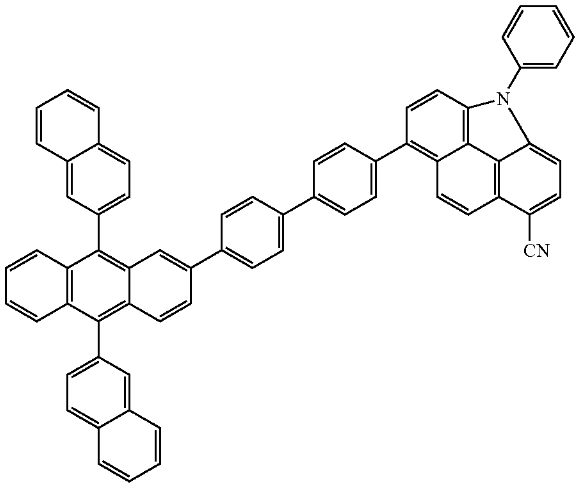
21
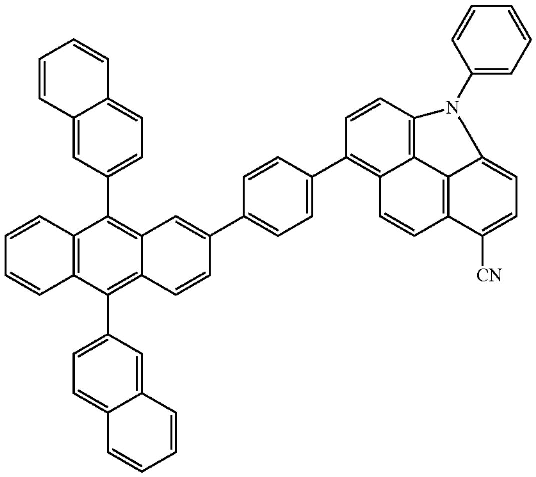
22
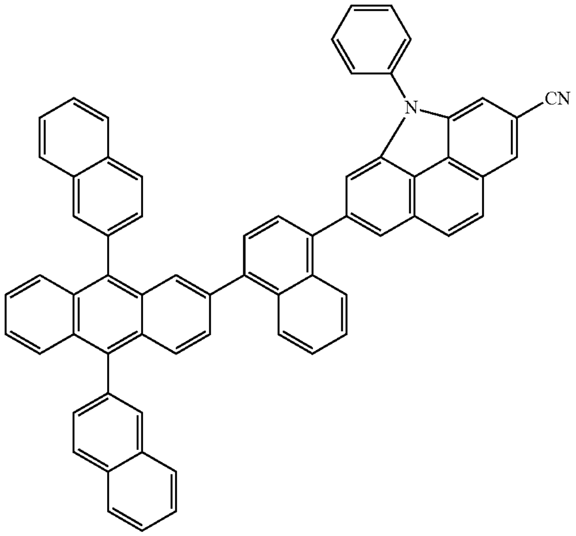

-continued
23
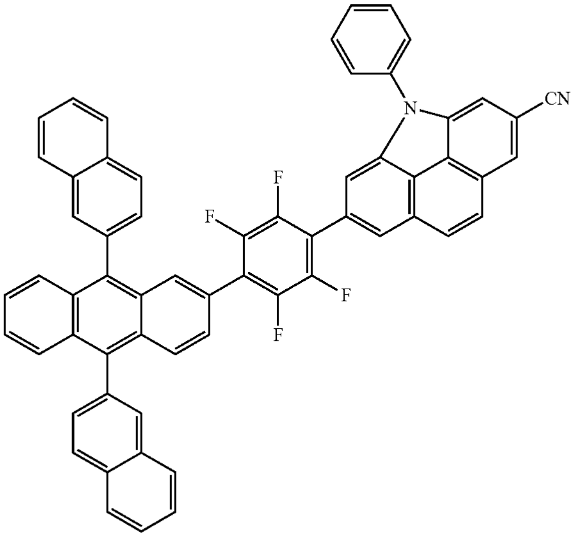
24
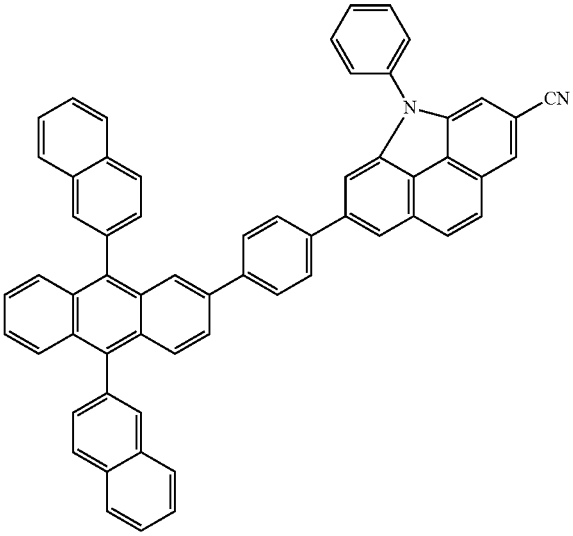
25
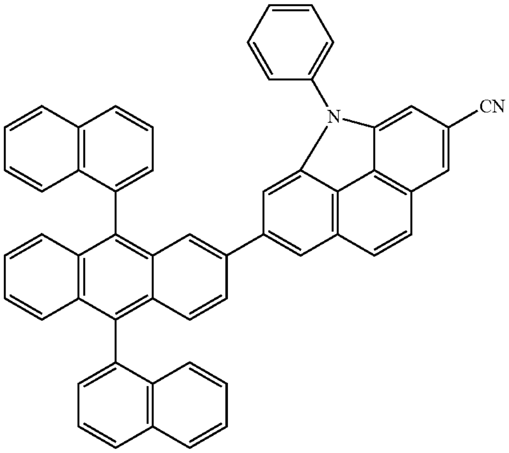
26
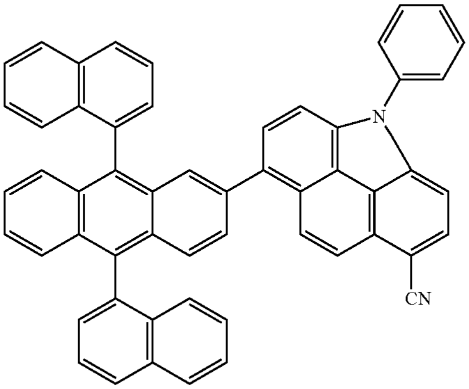
27
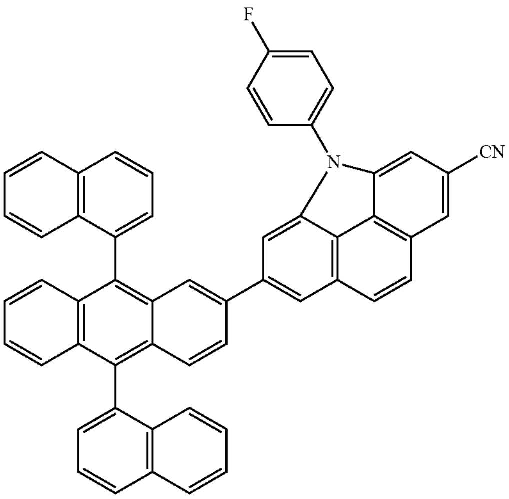
28
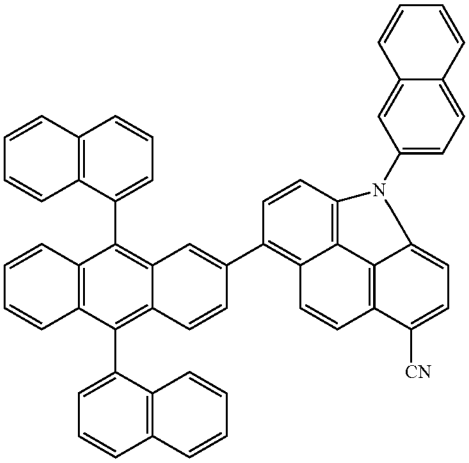

-continued
29
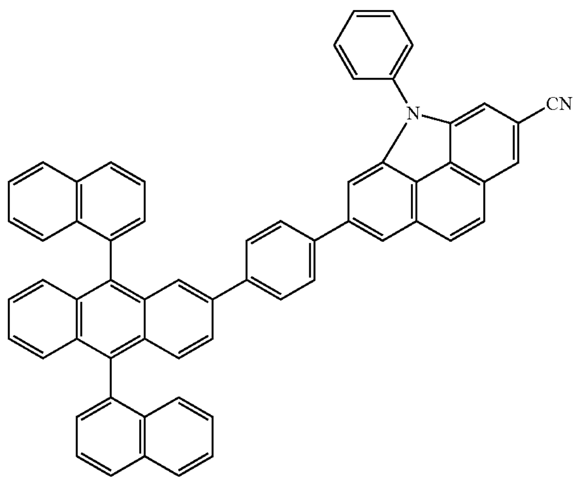
30
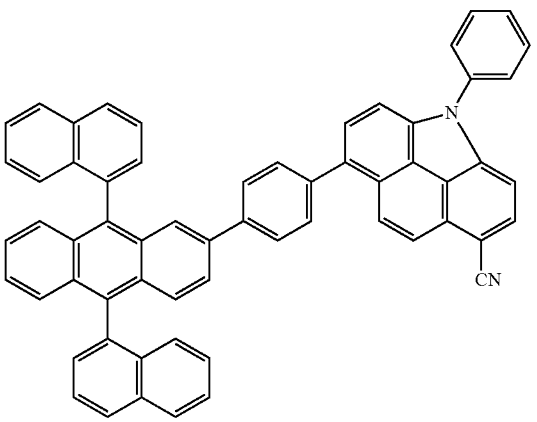
31
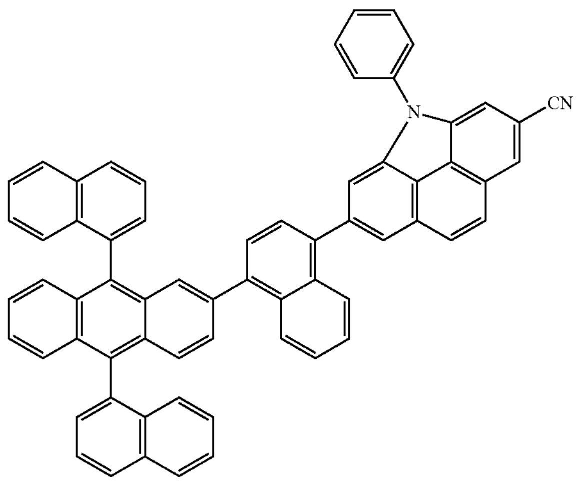
32
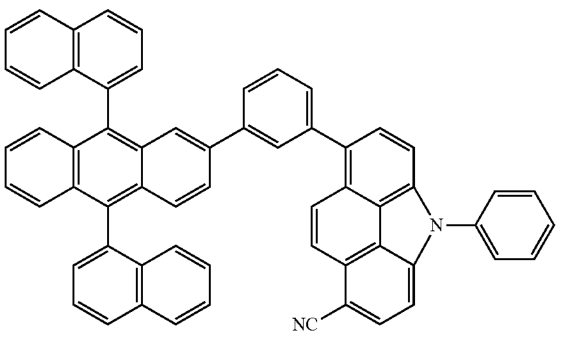
33
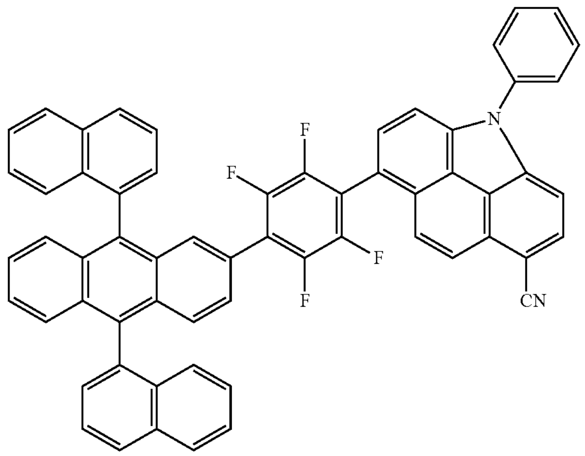
34
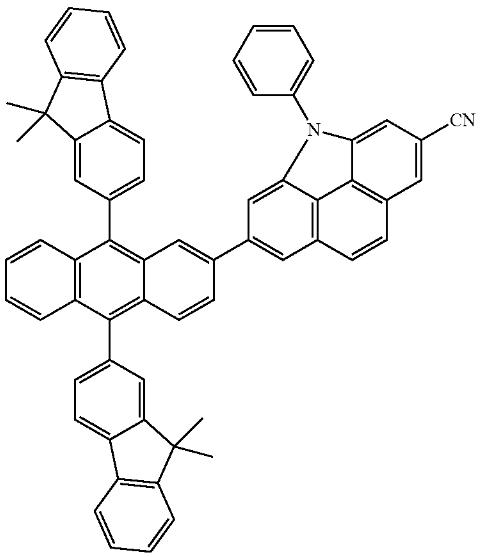

-continued
35
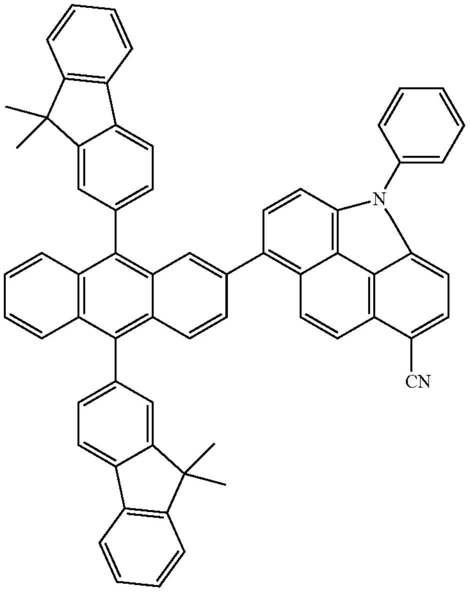
36
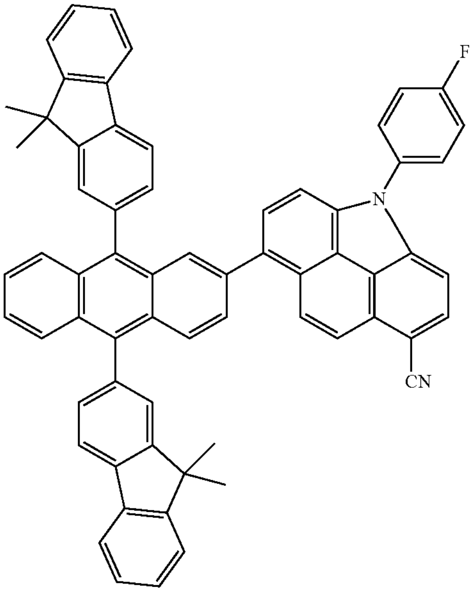
37
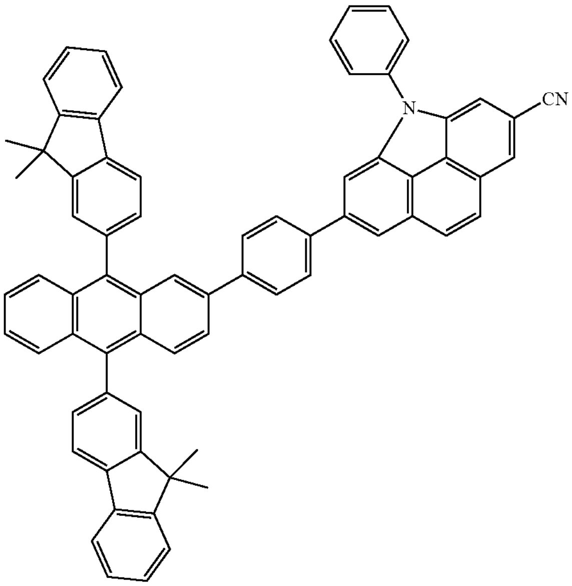
38
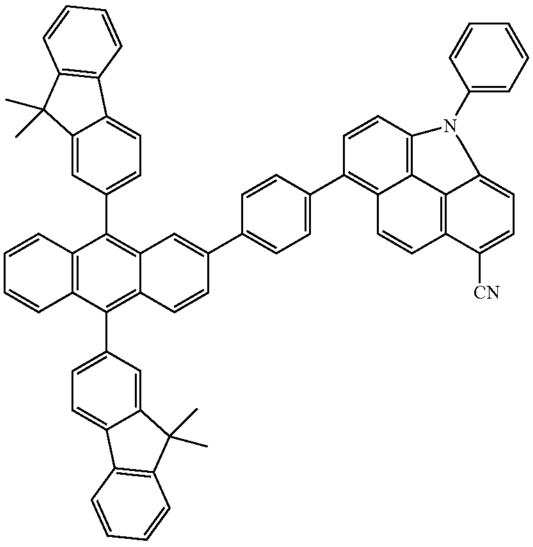

-continued
39
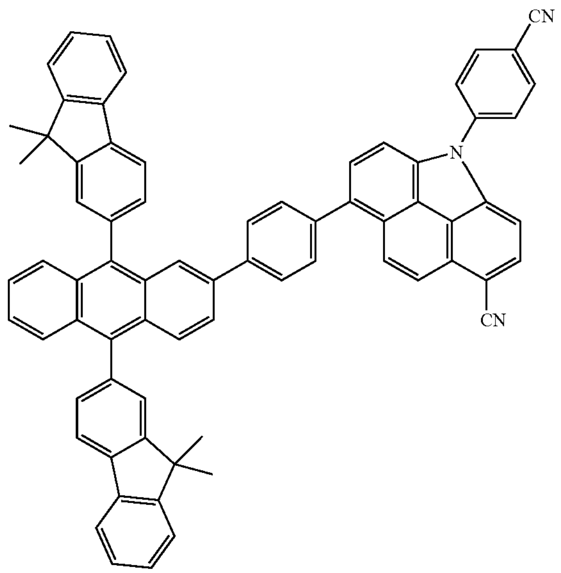
40
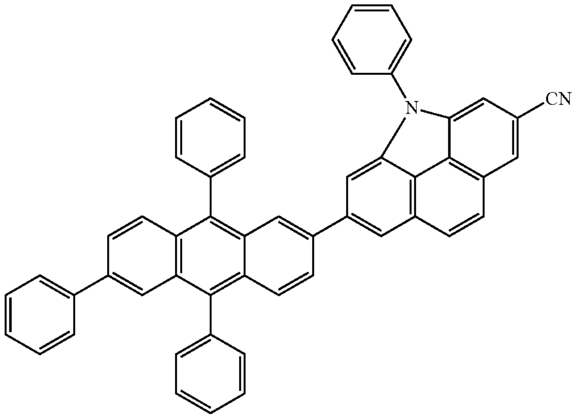
41
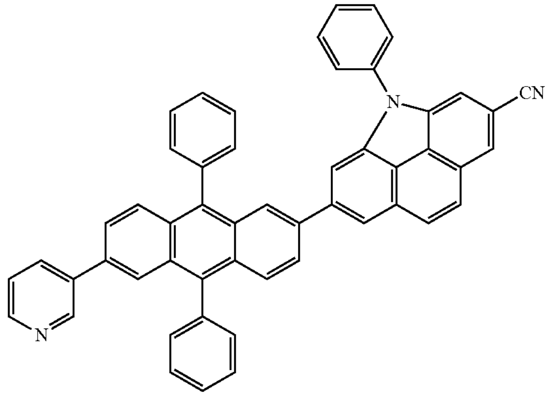
42
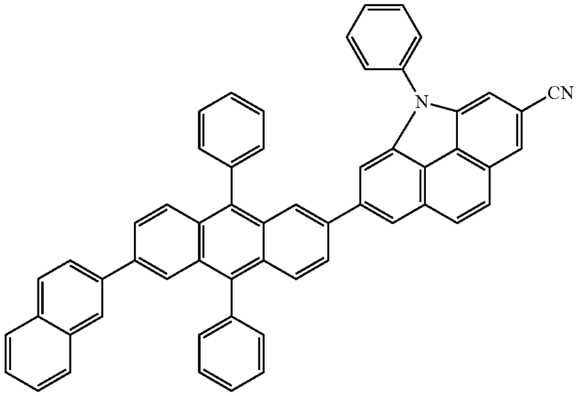
43
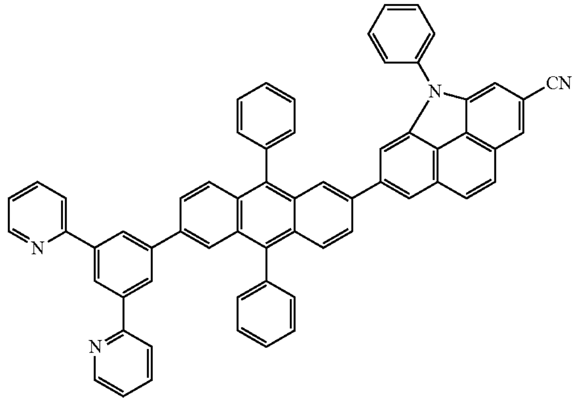
44
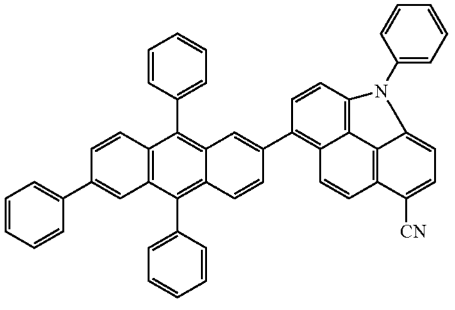

-continued
45
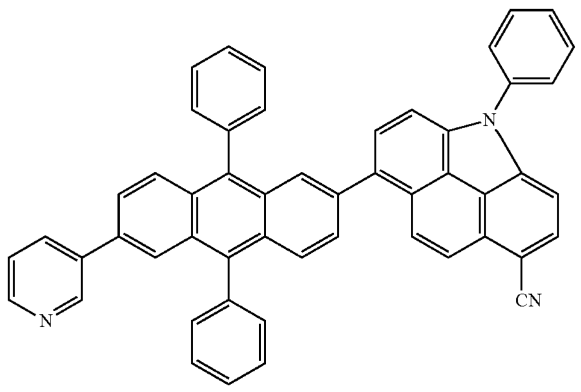
46
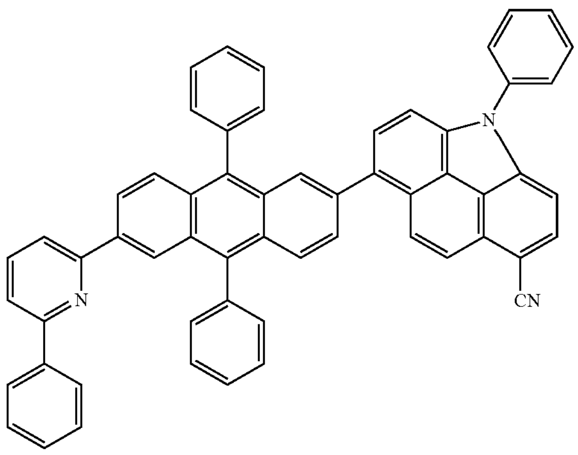
47
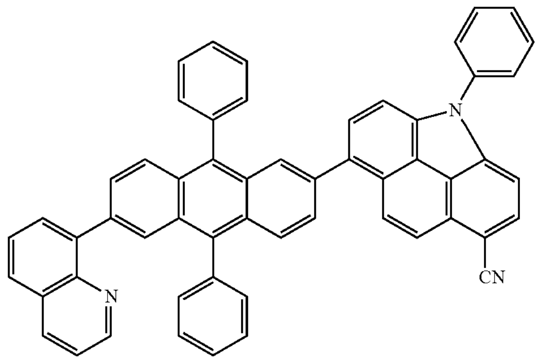
48
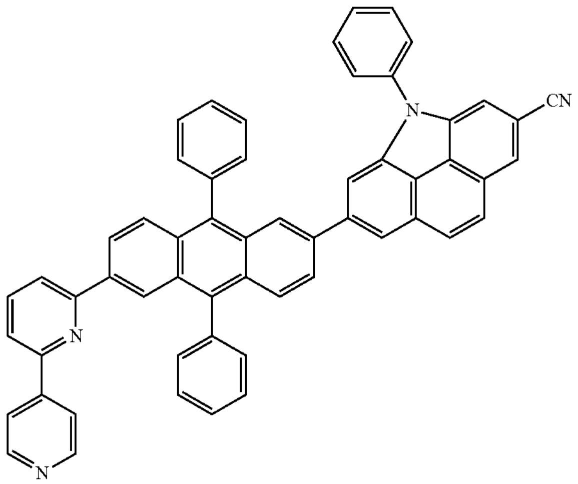
49
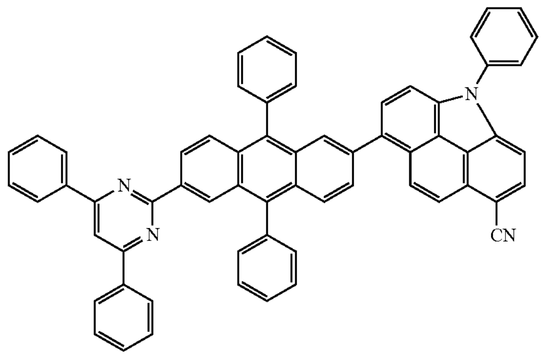
50
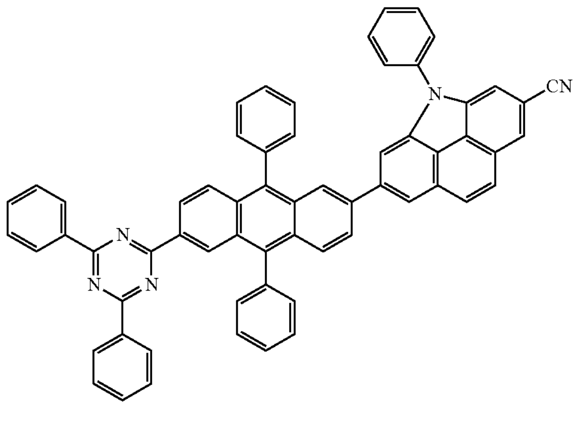

-continued
51
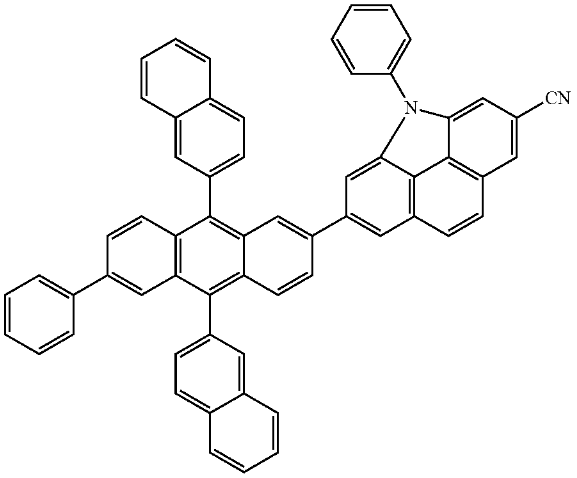
52
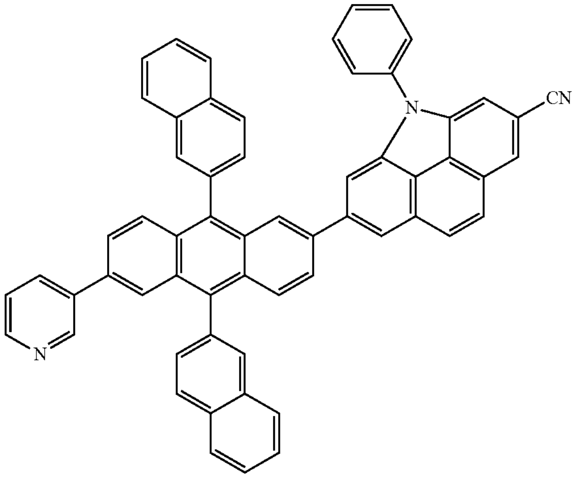
53
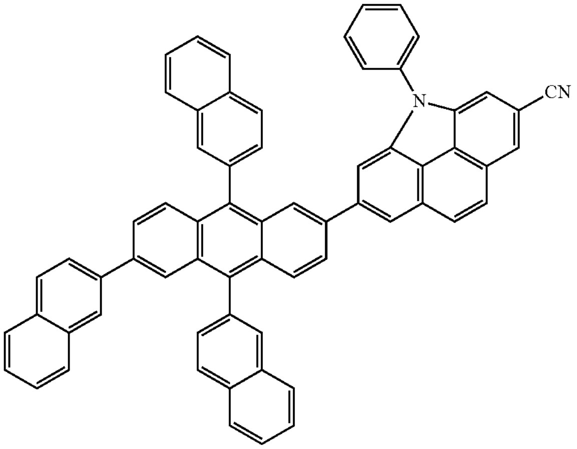
54
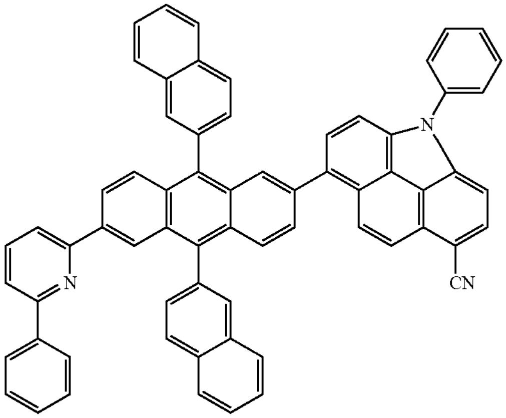
55
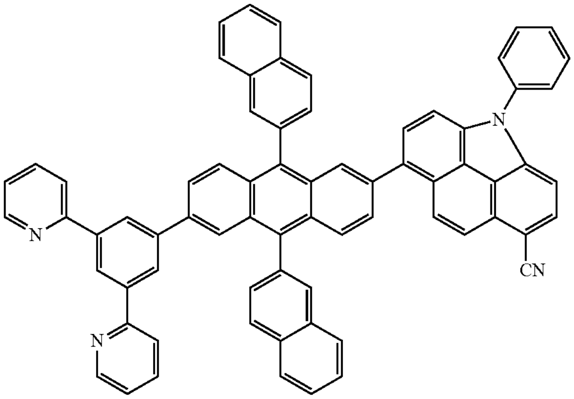
56
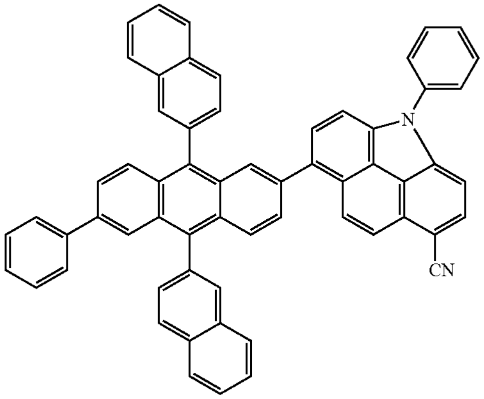

-continued
57
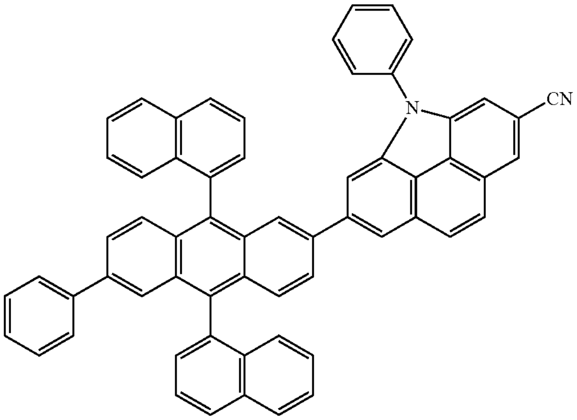
58
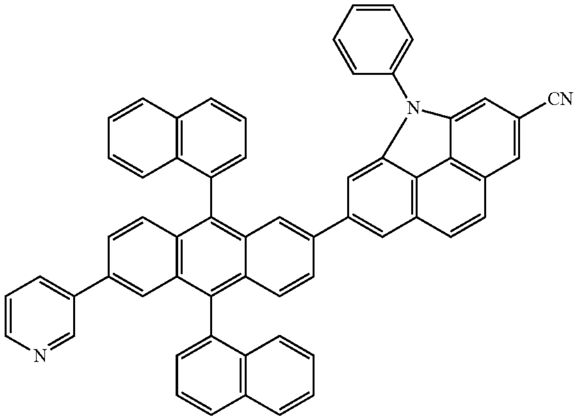
59
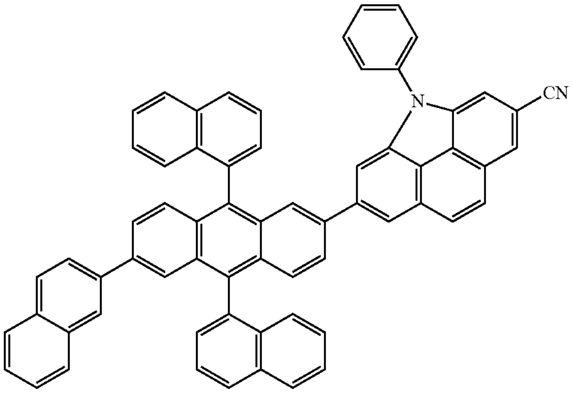
60
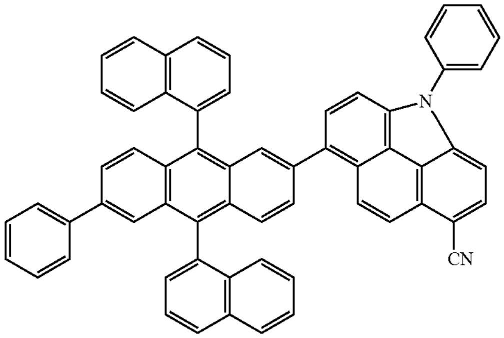
61
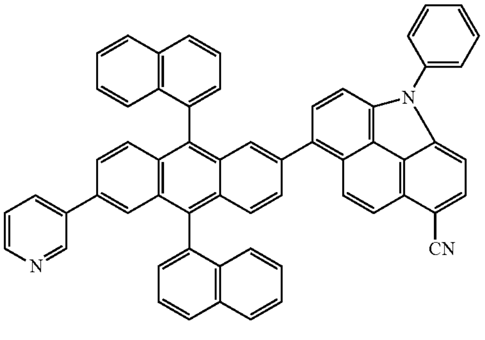
62
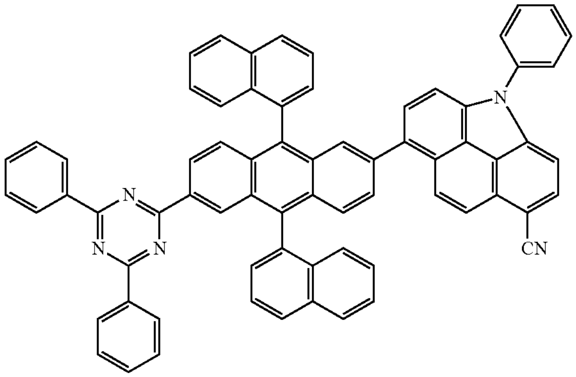

-continued
63
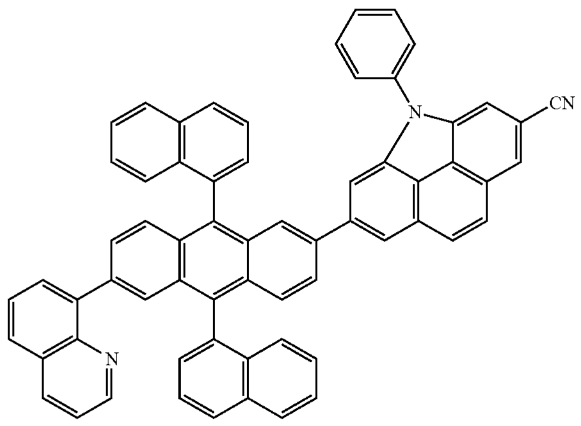
64
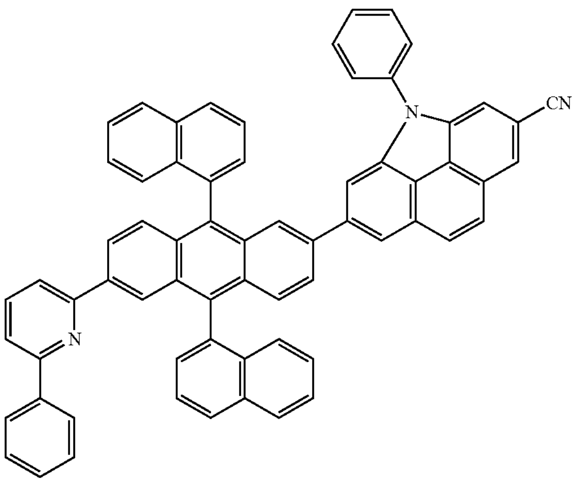
65
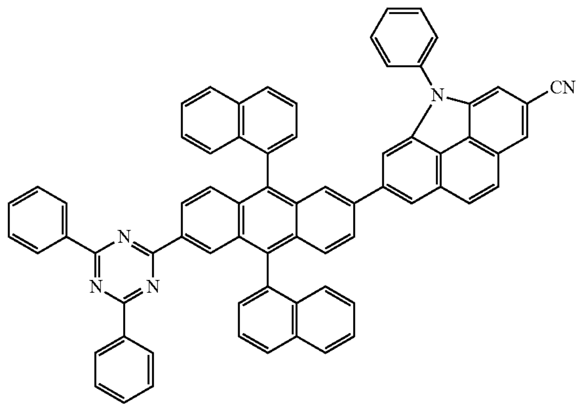
66
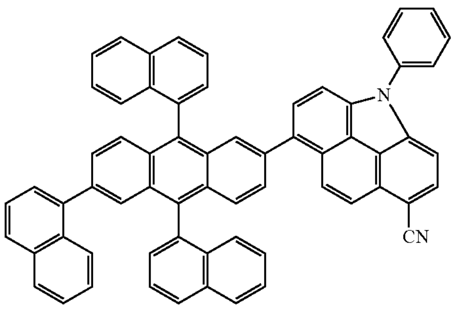
67
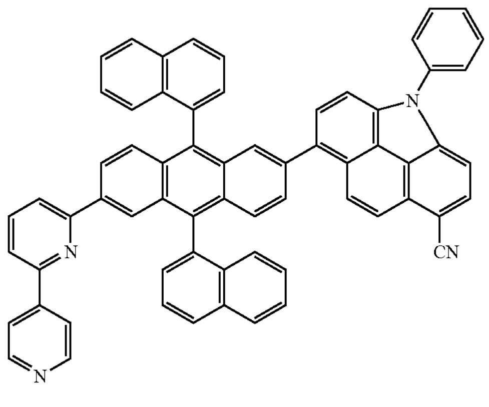
68
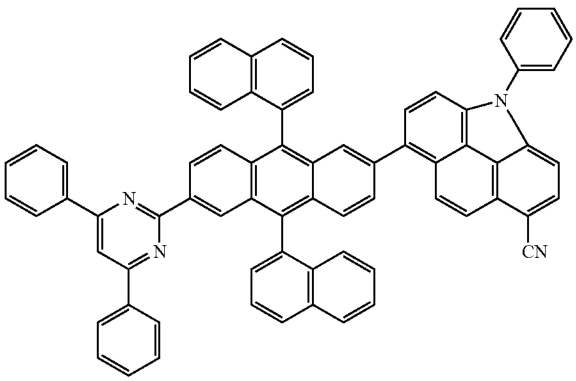

-continued
69
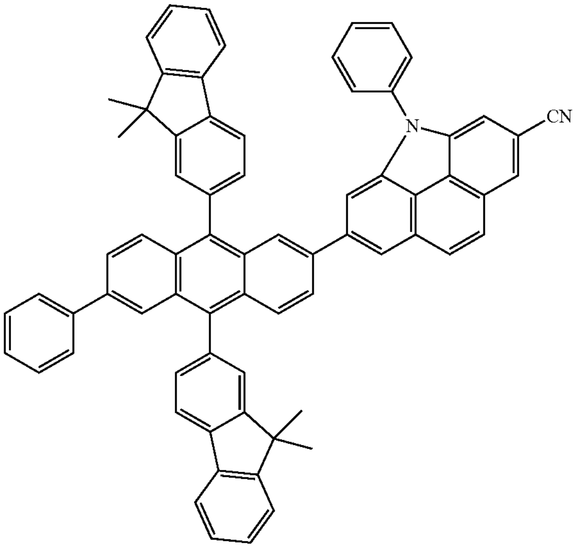
70
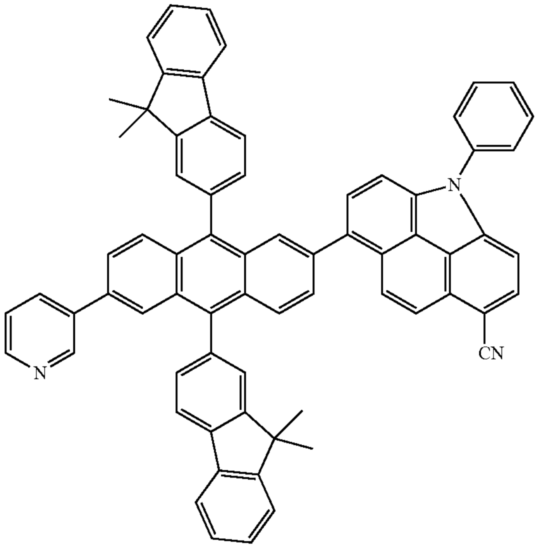
71
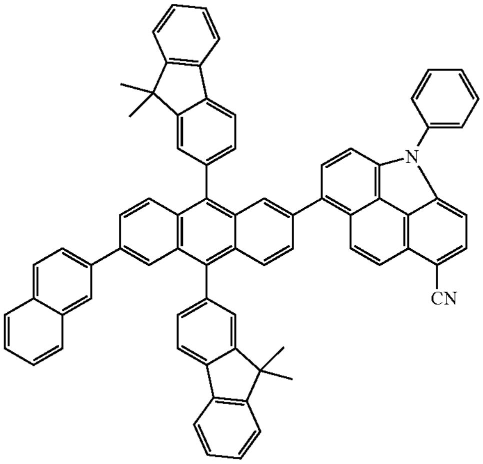
72
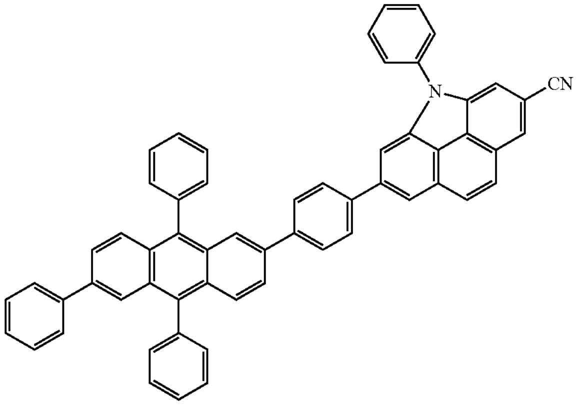
73
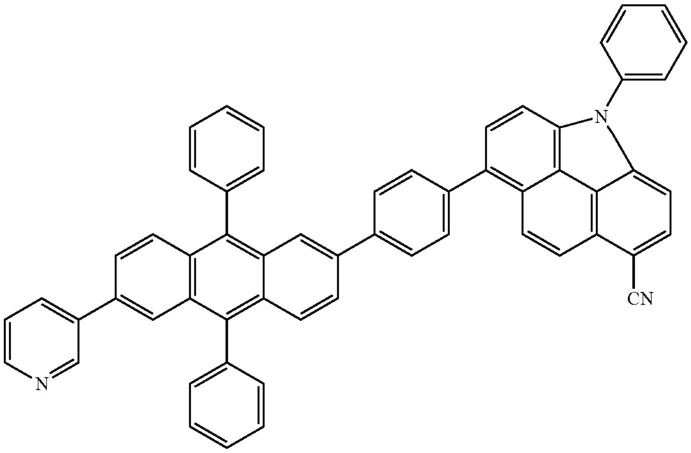

-continued
74
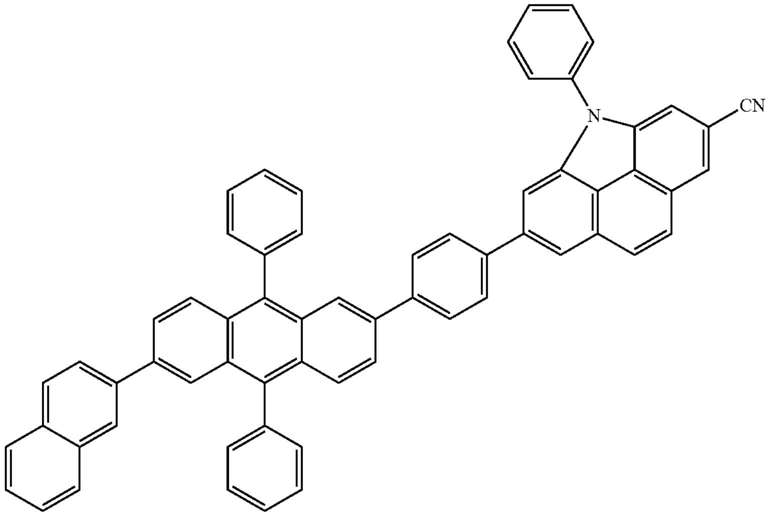
75
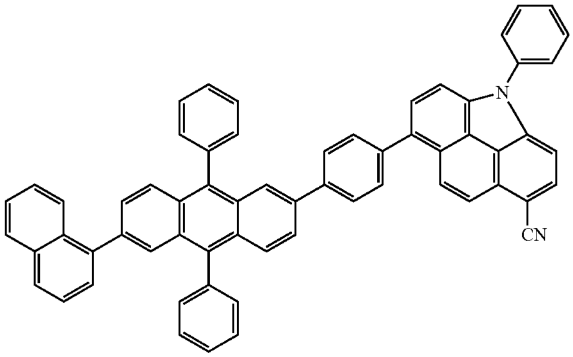
76
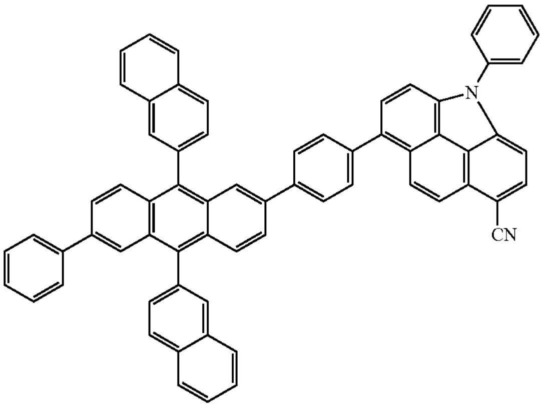
77
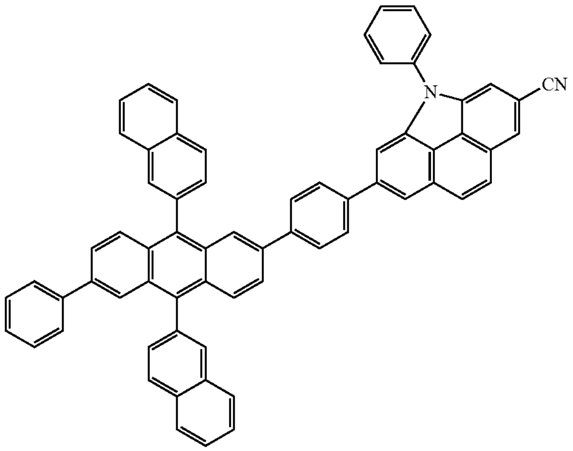
78
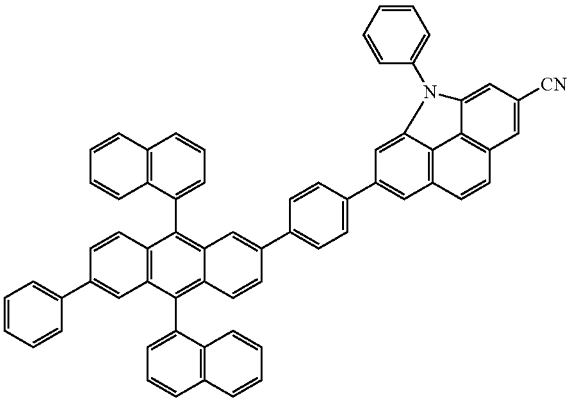

-continued
79
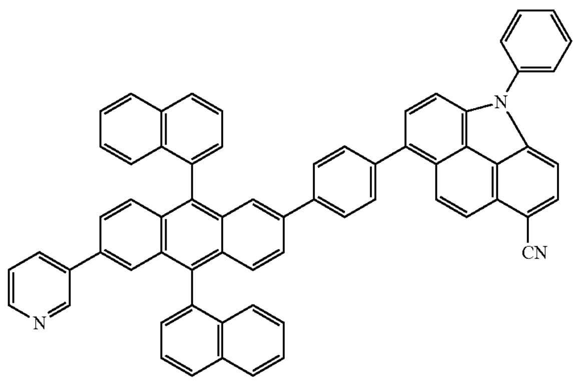
80
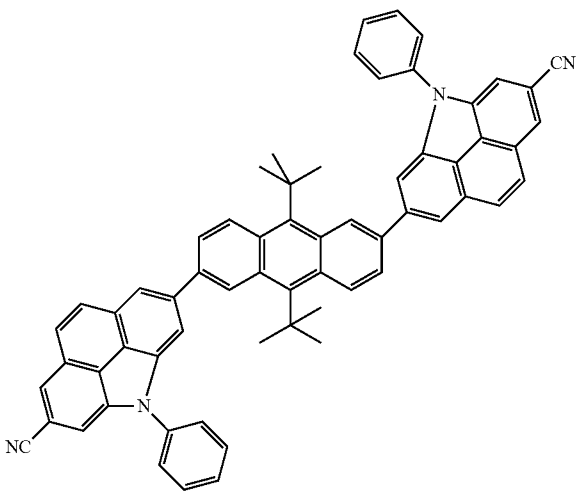
81
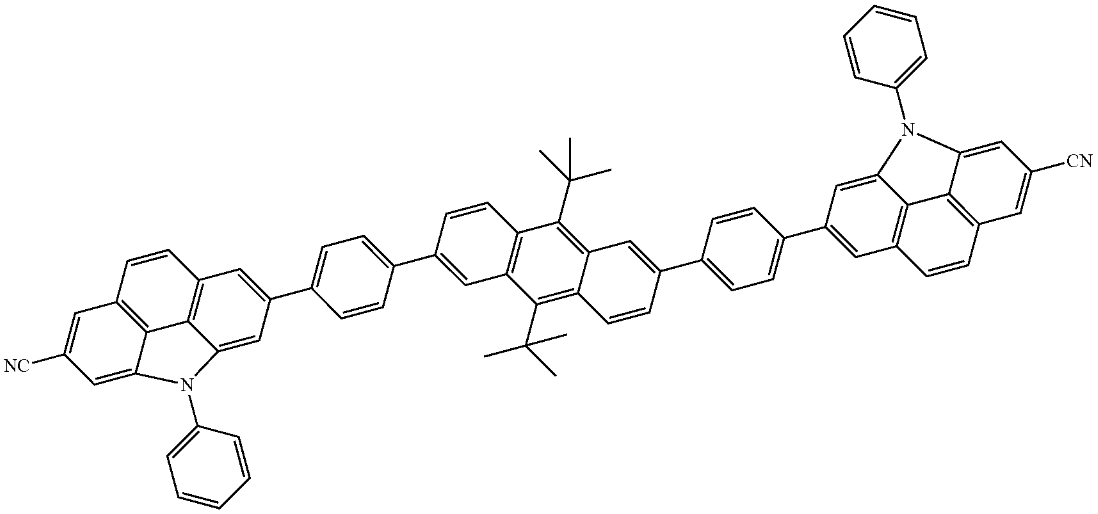
82
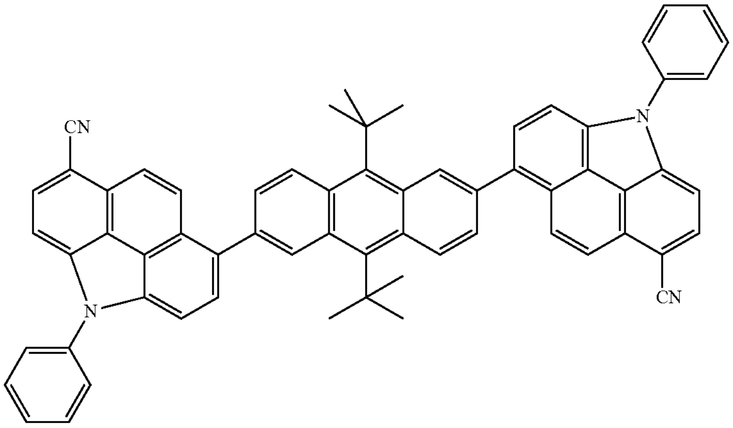

-continued
83
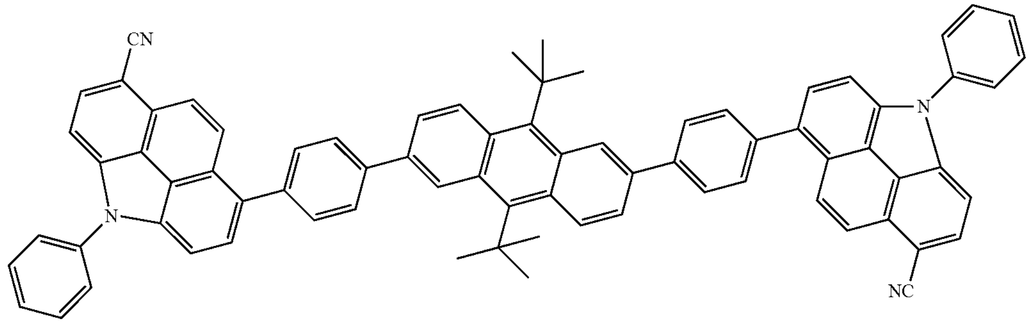
84
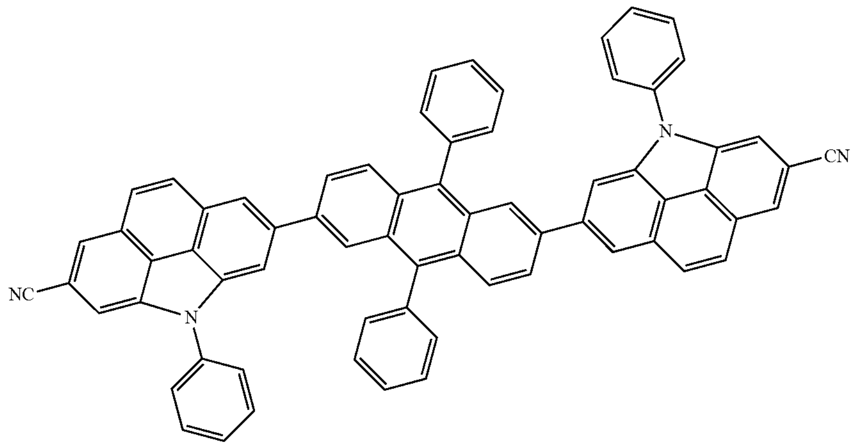
85
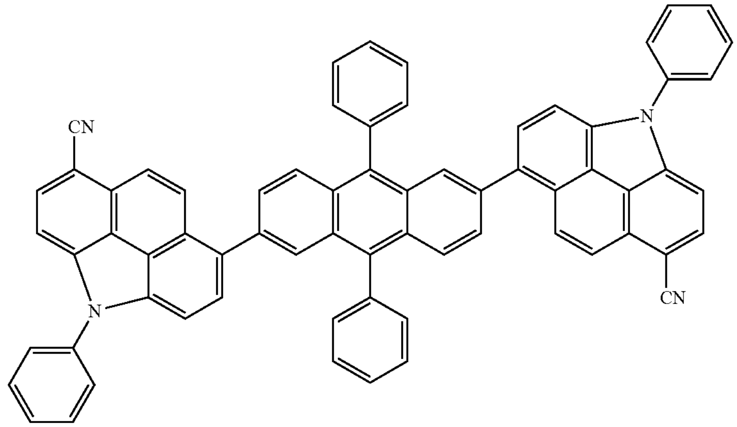

-continued
86
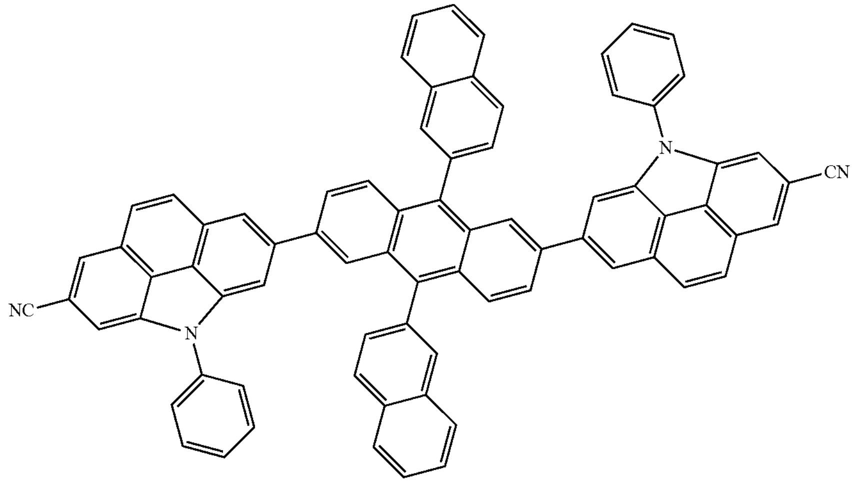
87
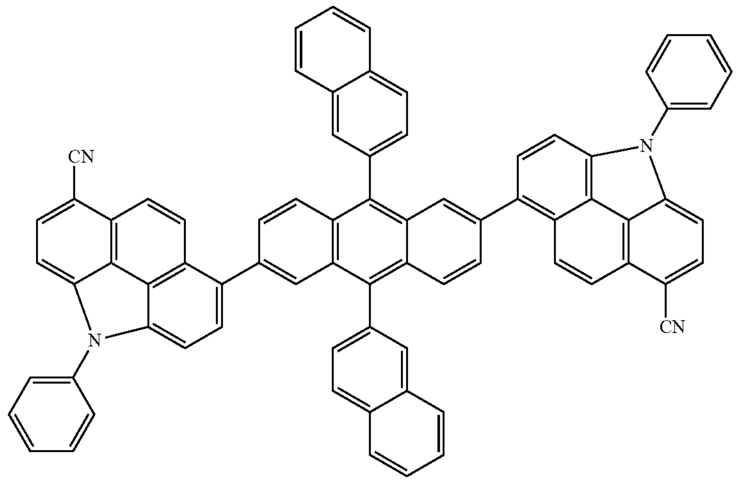
88
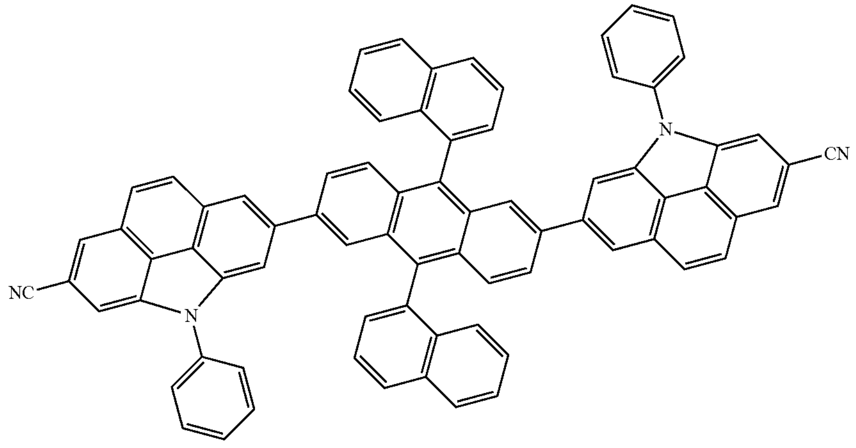

-continued
89
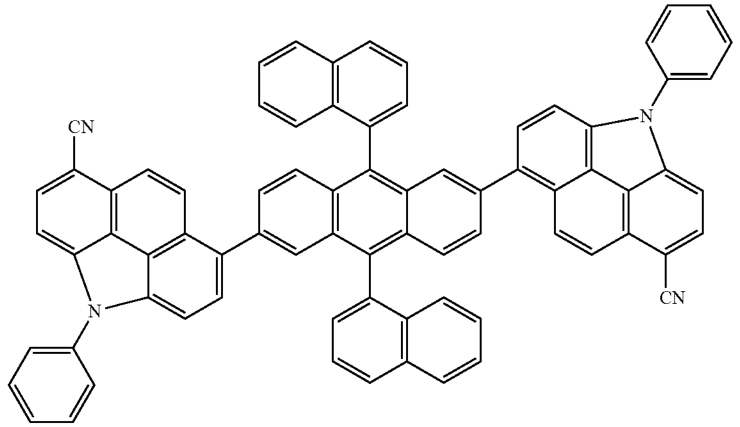
90
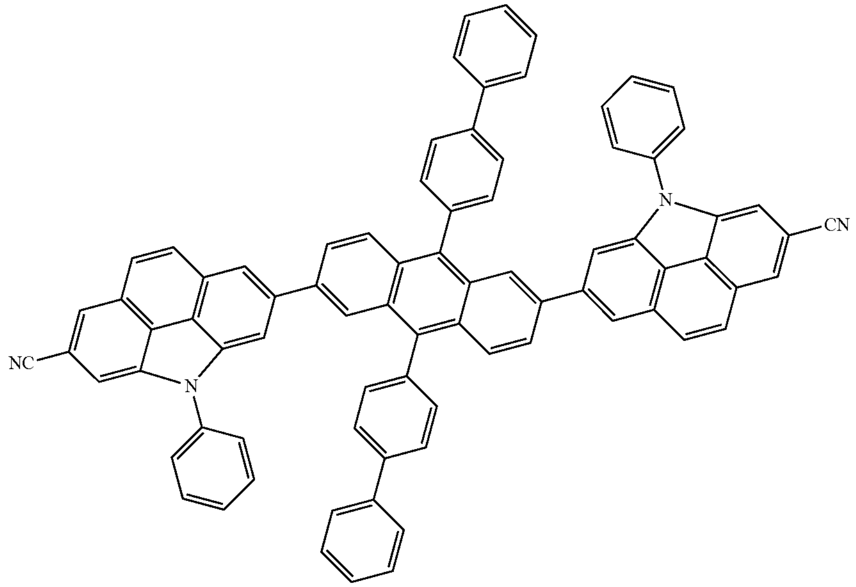
91
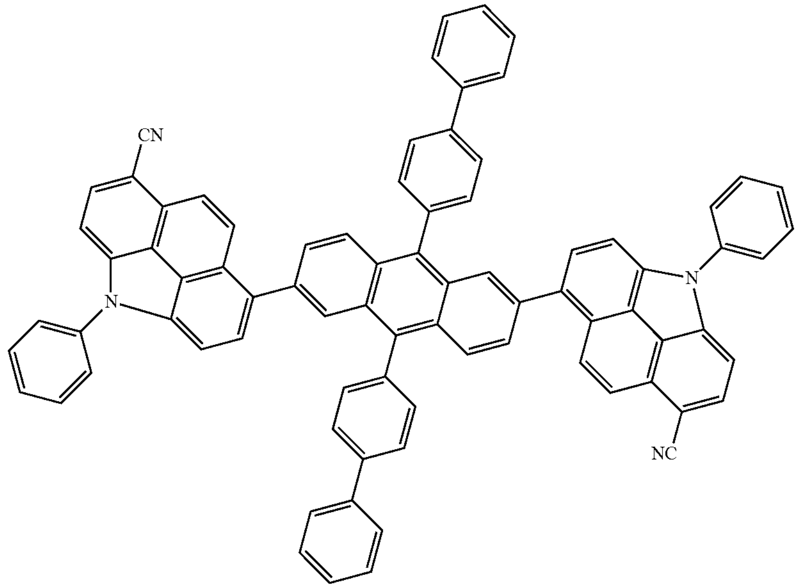

-continued
92
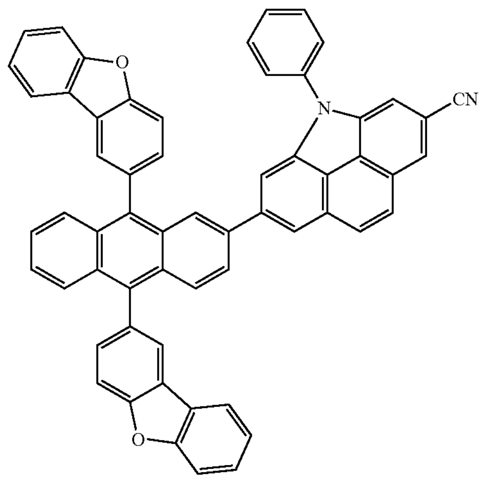
93
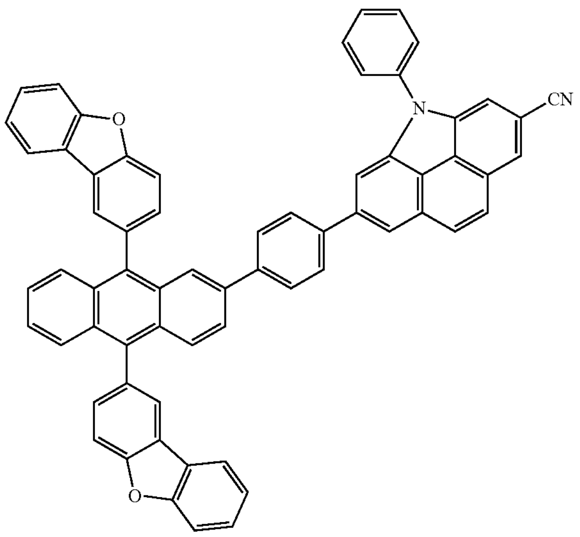
94
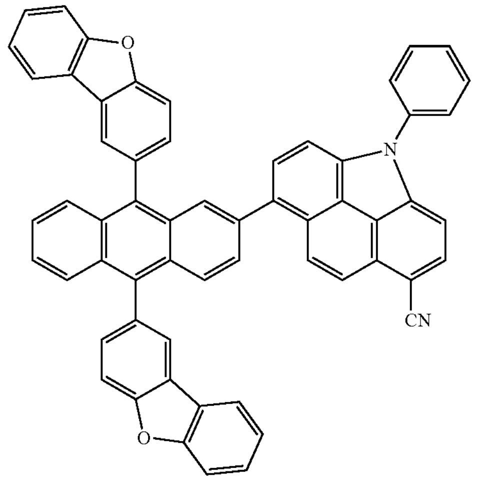
95
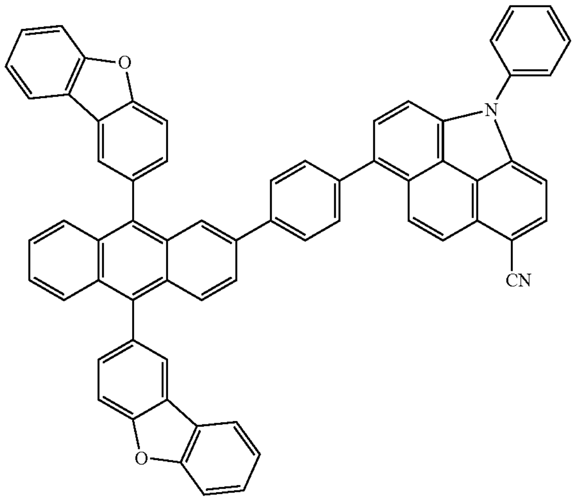
96
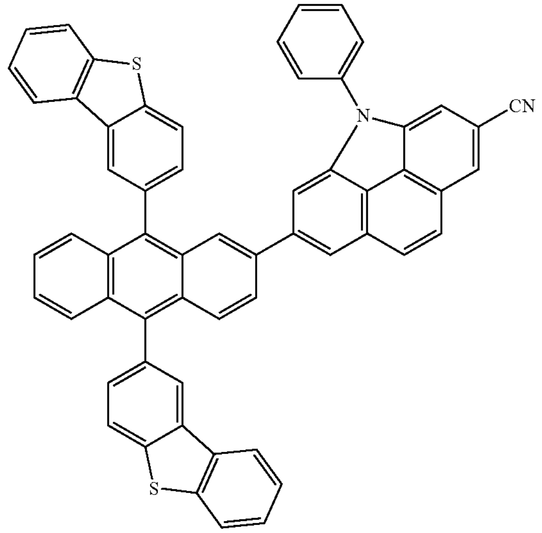
97
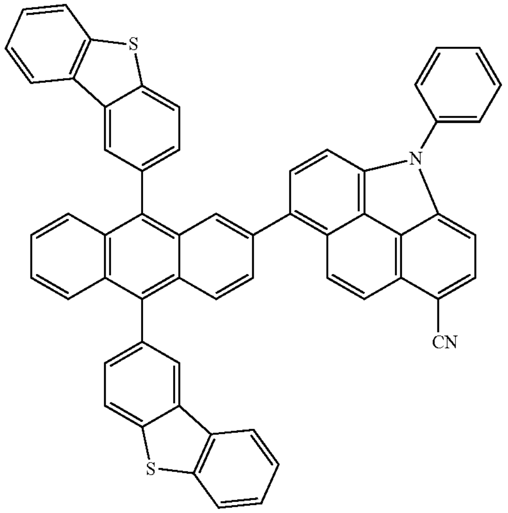

-continued

98

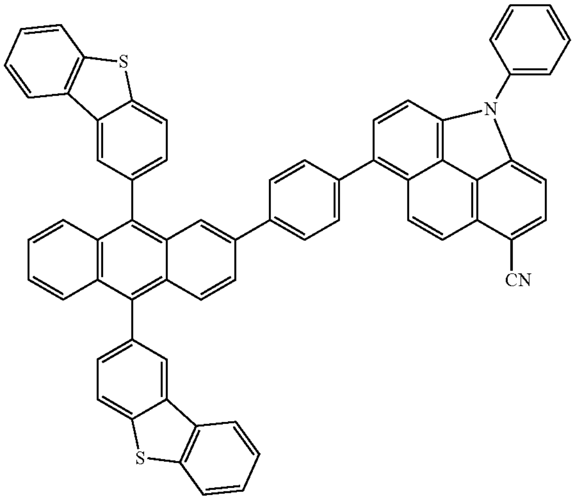

99

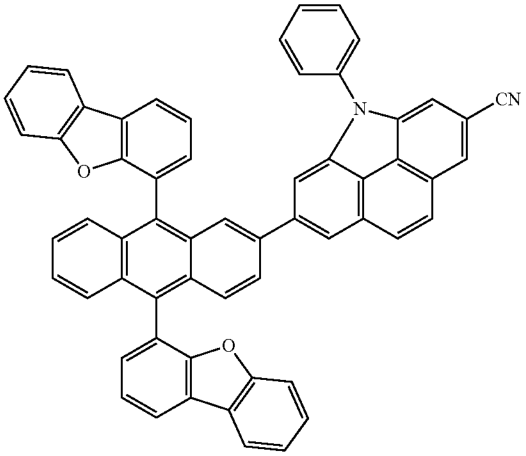

100

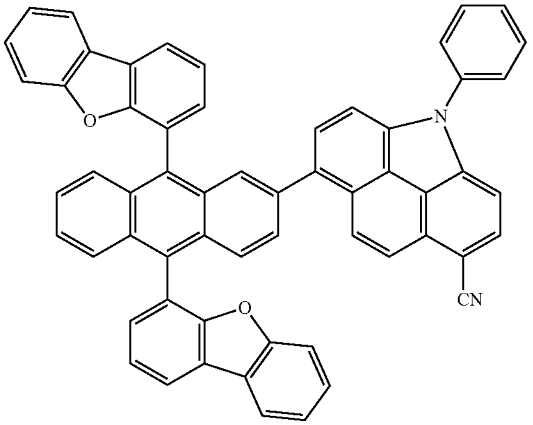

An organic light-emitting device according to an embodiment of the present invention includes a first electrode, a second electrode, and an organic layer disposed between the first electrode and the second electrode, wherein the organic layer includes the heterocyclic compound represented by any one of Formula or Formula 2 above.

The organic layer may include at least one layer selected from a hole injection layer, a hole transport layer, a functional layer having a hole injection function and a hole transport function (hereinafter referred to as an "H-functional layer"), a buffer layer, an electron blocking layer, an emission layer, a hole blocking layer, an electron transport layer, an electron injection layer, and a functional layer having an electron transport function and an electron injection function (hereinafter referred to as an "E-functional layer.")

In more detail, the organic layer may be an electron injection layer or an electron transport layer, and may be an electron transport layer.

According to an embodiment of the present invention, the organic layer may further include an electron injection layer, an electron transport layer, a functional layer having an electron injection capability and an electron transport capability, an emission layer, a hole injection layer, a hole transport layer, or a functional layer having a hole injection capability and a hole transport capability, and the emission layer may include an anthracene-based compound, an arylamine-based compound, or a styryl-based compound.

According to another embodiment of the present invention, the organic layer may include an electron injection layer, an electron transport layer, a functional layer having an electron injection capability and an electron transport capability, an emission layer, a hole injection layer, a hole transport layer, or a functional layer having a hole injection capability and a hole transport capability, and the emission layer may include a red layer, a green layer, a blue layer, and a white layer, and any one of these layers may include a phosphorescent compound, and the hole injection layer, the hole transport layer, or the functional layer having a hole injection capability and a hole transport capability may include a charge-generation material. Also, the charge-generation material may be a p-dopant, and the p-dopant may be a quinone derivative, a metal oxide, or a cyano group-containing compound.

According to another embodiment of the present invention, the organic layer may include an electron transport layer that includes an electron-transportable organic compound and a metal complex. For example, the electron transport layer may include the compound represented by Formula 1 or Formula 2 and a metal complex. The metal complex may be a Li complex.

The term "organic layer" used herein refers to a single layer and/or a plurality of layers disposed between the first electrode and the second electrode of an organic light-emitting device.

The drawing is a schematic cross-sectional view of an organic light-emitting device according to an embodiment of the present invention. Hereinafter, the structure of an organic light-emitting device according to an embodiment of the present invention and a method of manufacturing an organic light-emitting device according to an embodiment of the present invention will be described in connection with the drawing.

A substrate may be any one of various suitable substrates that are used in an organic light-emitting device, and may be a glass substrate or a transparent plastic substrate, with excellent mechanical strength, thermal stability, transparency, surface smoothness, ease of handling, and water repellency.

The first electrode may be formed by, for example, depositing or sputtering a material for a first electrode on the substrate. When the first electrode is an anode, the material for the first electrode may be selected from materials with a high work function to make holes be easily injected. The first electrode may be a reflective electrode or a transmission electrode. Suitable materials for the first electrode may be a transparent and highly conductive material, and examples of such suitable materials are indium tin oxide (ITO), indium zinc oxide (IZO), tin oxide ($SnO_2$), and zinc oxide (ZnO). According to an embodiment of the present invention, to form the first electrode as a reflective electrode, magnesium (Mg), aluminum (Al), aluminum-lithium (Al—Li), calcium (Ca), magnesium-indium (Mg—In), or magnesium-silver (Mg—Ag) may be used.

The first electrode may be a single- or multi-layered structure. For example, the first electrode may have a three-layered structure of ITO/Ag/ITO, but the structure of the first electrode is not limited thereto.

An organic layer is disposed on the first electrode.

The organic layer may include a hole injection layer, a hole transport layer, a buffer layer, an emission layer, an electron transport layer, or an electron injection layer.

A hole injection layer (HIL) may be formed on the first electrode by using (utilizing) various suitable methods, such as vacuum deposition, spin coating, casting, langmuir-blodgett (LB) deposition, or the like.

When the HIL is formed using (utilizing) vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2000 rpm to about 5000 rpm, and a temperature at which heat treatment is performed to remove the solvent after coating may be in the range of about 80° C. to about 200° C. However, the coating conditions are not limited thereto.

For use as a hole injection material, any suitable hole injection material may be used, and examples of such suitable hole injection materials are N,N'-diphenyl-N,N'-bis-[4-(phenyl-m-tolyl-amino)-phenyl]-biphenyl-4,4'-diamine (DNTPD), a phthalocyanine compound (such as copper phthalocyanine), 4,4',4"-tris(3-methylphenylphenylamino) triphenylamine (m-MTDATA), N,N'-di(1-naphthyl)-N,N'-diphenylbenzidine (NPB), TDATA, 2-TNATA, a polyaniline/dodecylbenzenesulfonic acid (pani/DBSA), poly(3,4-ethylenedioxythiophene)/poly(4-styrenesulfonate) (PEDOT/PSS), polyaniline/camphor sulfonicacid (pani/CSA), and (polyaniline)/poly(4-styrenesulfonate) (PANI/PSS), but are not limited thereto.

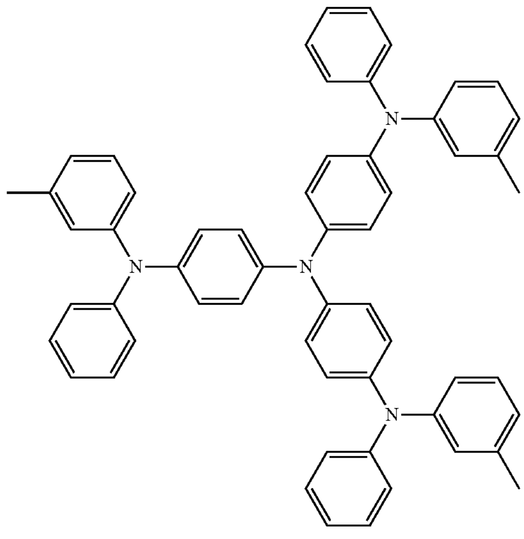

m-MTDATA

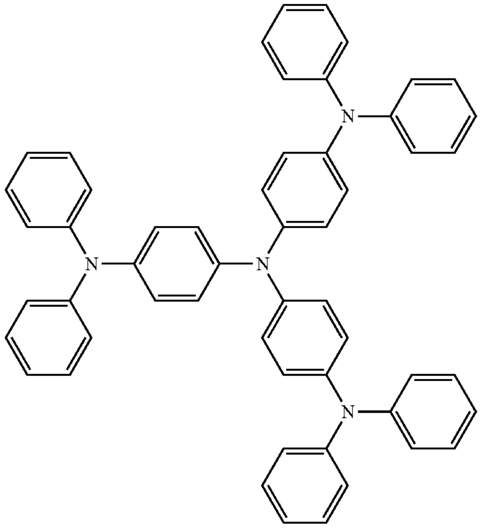

TDATA

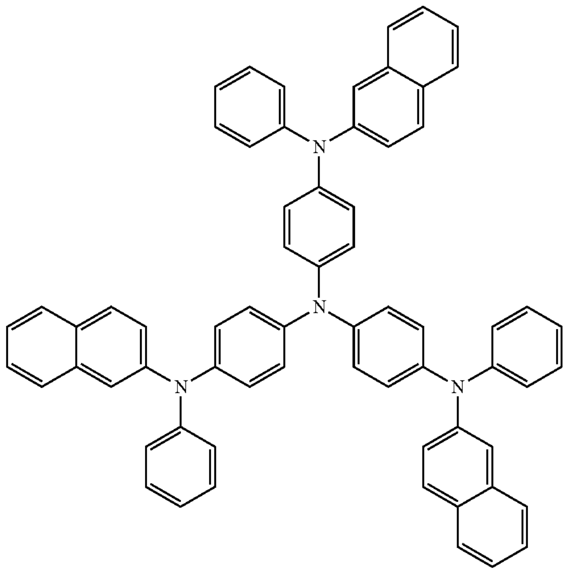

2-TNATA

A thickness of the HIL may be in a range of about 100 Å to about 10,000 Å, for example, about 100 Å to about 1,000 Å. In one embodiment, when the thickness of the HIL is within the ranges described above, excellent electron injection characteristics are obtained without a substantial increase in driving voltage.

Then, a hole transport layer (HTL) may be formed on the HIL by using vacuum deposition, spin coating, casting, or LB. When the HTL is formed by vacuum deposition or spin coating, the deposition or coating conditions may be similar to those applied to form the HIL although the deposition or coating conditions may vary according to the material that is used to form the HTL.

For use as a hole transport material, any suitable hole transport material may be used. Examples of suitable hole transport materials are a carbazole derivative (such as N-phenylcarbazole or polyvinylcarbazol), N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB), but are not limited thereto.

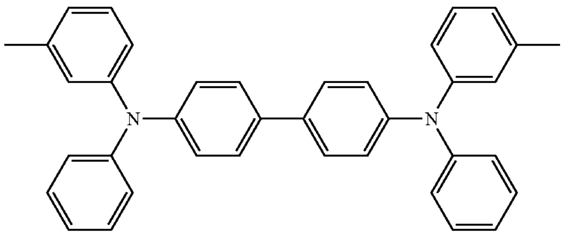

TPD

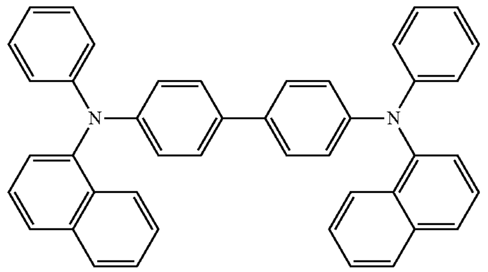

NPB

A thickness of the HTL may be in a range of about 50 Å to about 2,000 Å, for example, about 100 Å to about 1,500 Å. In one embodiment, when the thickness of the HTL is within these ranges, the HTL has satisfactory hole transporting ability without a substantial increase in driving voltage.

The H-functional layer (a functional layer having a hole injection function and a hole transport function) may include at least one material selected from the HIL materials and the HTL materials, and a thickness of the H-functional layer may be in a range of about 50 Å to about 10000 Å, for example, about 100 Å to about 1000 Å. In one embodiment, when the thickness of the H-functional layer is within the range described above, the HIL has satisfactory hole injection and transport characteristics without a substantial increase in a driving voltage.

In addition, at least one layer of the HIL, the HTL, and the H-functional layer may include at least one of a compound represented by Formula 300 below and a compound represented by Formula 350 below:

Formula 300

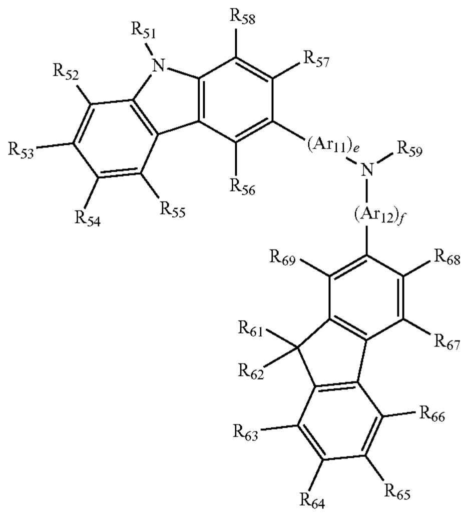

Formula 350

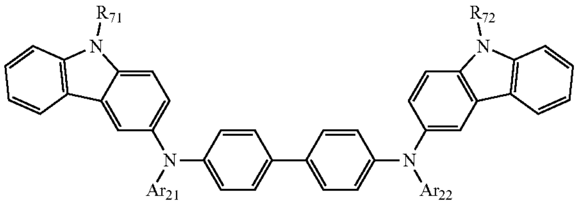

wherein in Formulae 300 and 350, $Ar_{11}$, $Ar_{12}$, $Ar_{21}$, and $Ar_{22}$ are each independently a substituted or unsubstituted $C_5$-$C_{60}$ arylene group.

e and f in Formula 300 may be each independently an integer of 0 to 5, or 0, 1 or 2. For example, e may be 1 and f may be 0, but are not limited thereto.

$R_{51}$ to $R_{58}$, $R_{61}$ to $R_{69}$ and $R_{71}$ and $R_{72}$ in Formulae 300 and 350 may be each independently a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C3-C60 cycloalkyl group, a substituted or unsubstituted C5-C60 aryl group, a substituted or unsubstituted C5-C60 aryloxy group, or substituted or unsubstituted C5-C60 arylthio group. For example, $R_{51}$ to $R_{58}$, $R_{61}$ to $R_{69}$, and $R_{71}$ and $R_{72}$ may be each independently selected from a hydrogen; a deuterium; a halogen atom; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a C1-C10 alkyl group (for example, a methyl group, an ethyl group, a propyl group, a butyl group, a pentyl group, or a hexyl group); a C1-C10 alkoxy group (for example, a methoxy group, an ethoxy group, a propoxy group, a butoxy group, or a pentoxy group);

a C1-C10 alkyl group and a C1-C10 alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof;

a phenyl group; a naphthyl group; anthryl group; a fluorenyl group; a pyrenyl group; and a phenyl group, a naphthyl group, anthryl group, a fluorenyl group and a pyrenyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C1-C10 alkyl group, and a C1-C10 alkoxy group.

$R_{59}$ in Formula 300 may be one selected from:

a phenyl group; a naphthyl group; anthryl group; a biphenyl group; a pyridyl group; and a phenyl group, a naphthyl group, an anthryl group, a biphenyl group and a pyridyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C1-C20 alkyl group, and a substituted or unsubstituted C1-C20 alkoxy group.

According to an embodiment of the present invention, the compound represented by Formula 300 may be represented by Formula 300A below, but is not limited thereto:

Formula 300A

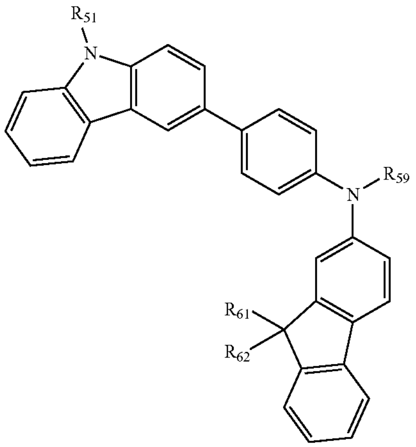

Detailed description about $R_{51}$, $R_{61}$, $R_{62}$, and $R_{59}$ in Formula 300A are already described above.

For example, at least one layer of the HIL, the HTL, and the H-functional layer may include at least one of Compounds 301 to 320 below, but may instead include other materials.

301

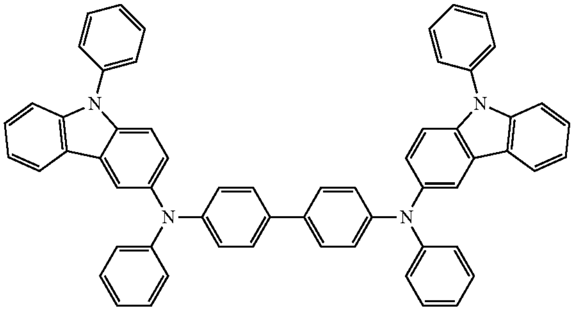

-continued

302

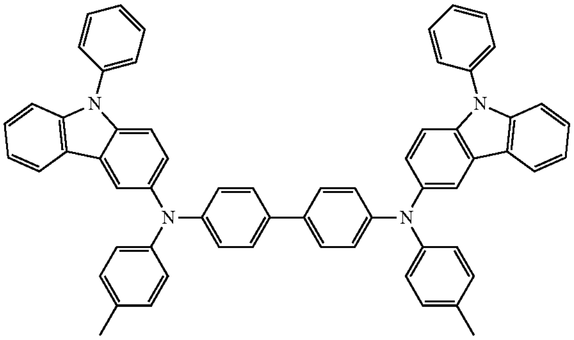

303

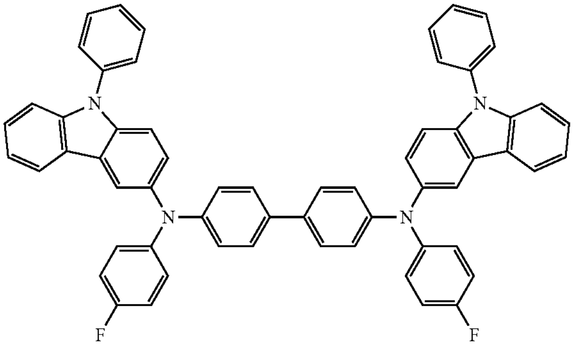

304

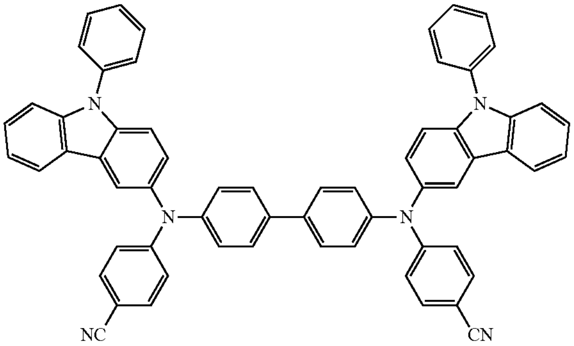

305

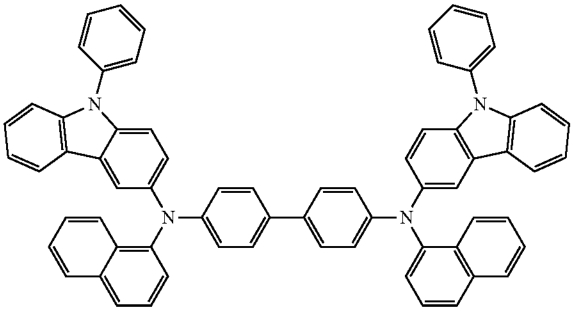

-continued
306
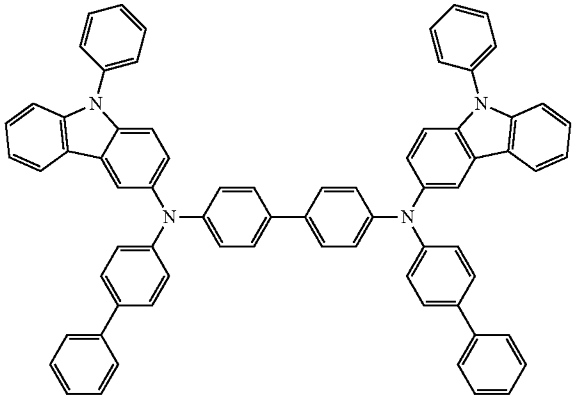
307
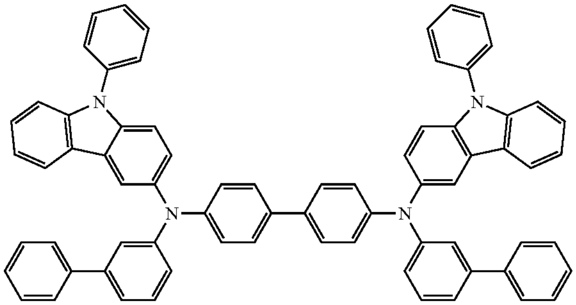
308
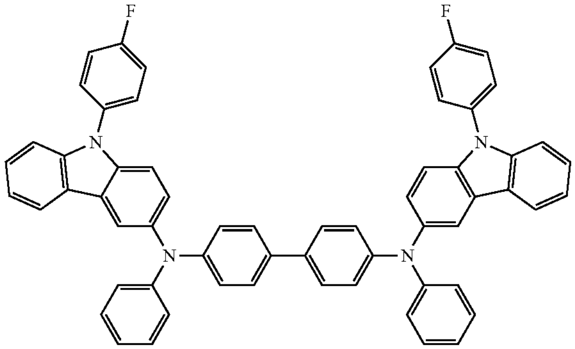
309
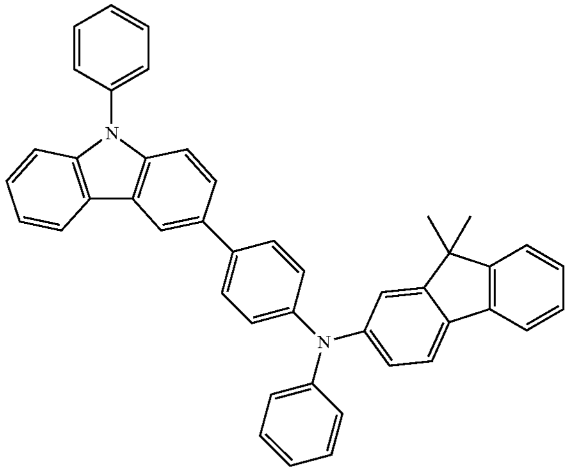
-continued
310
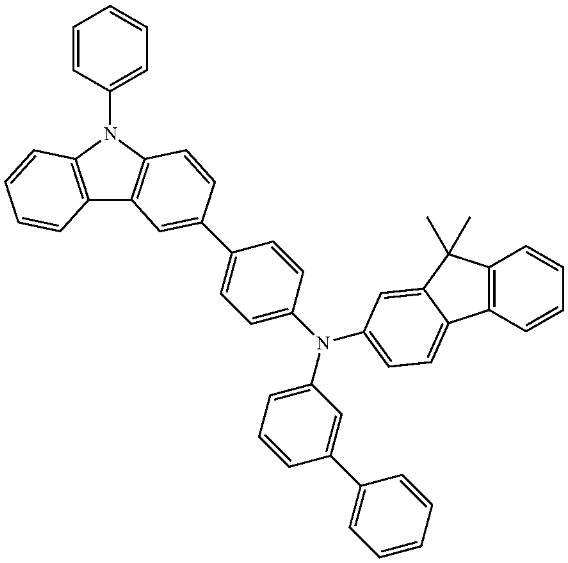
311
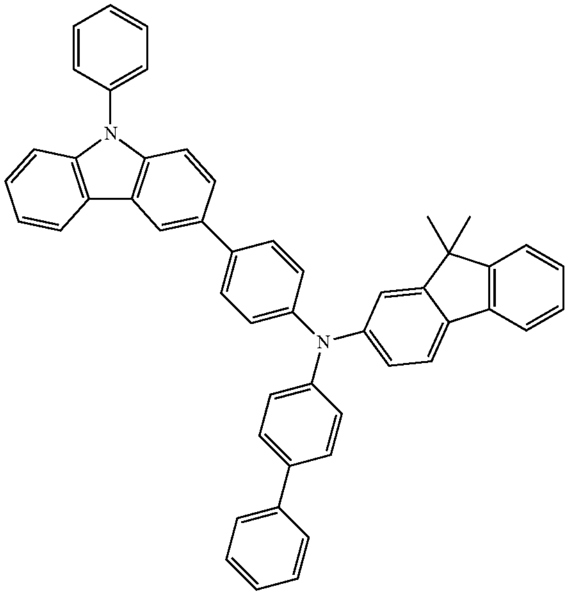

312
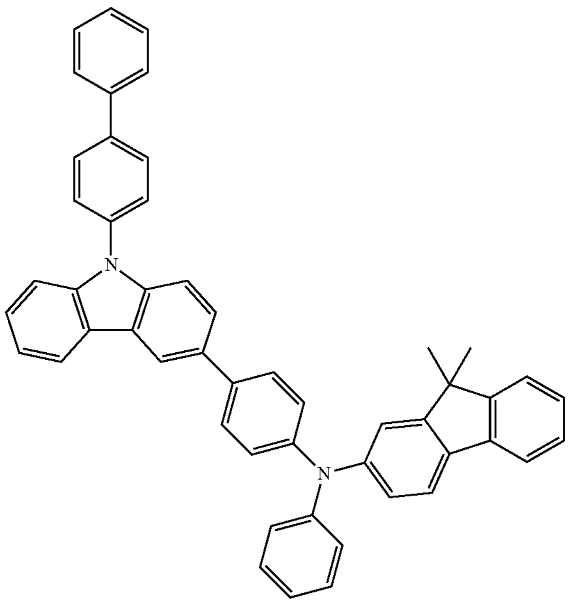
314
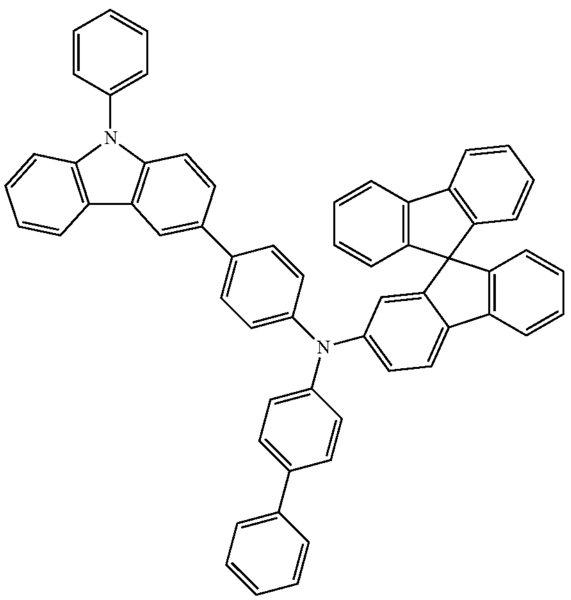
313
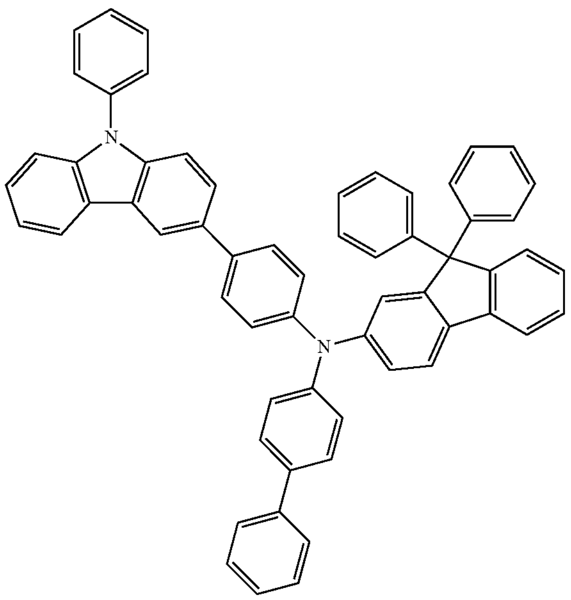
315
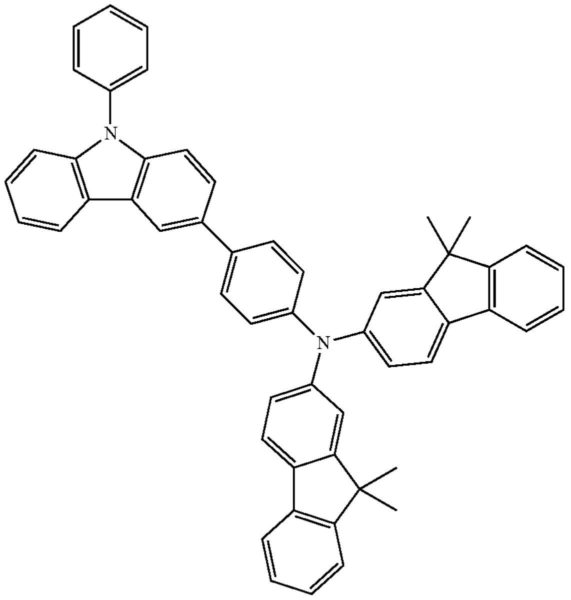

-continued

316

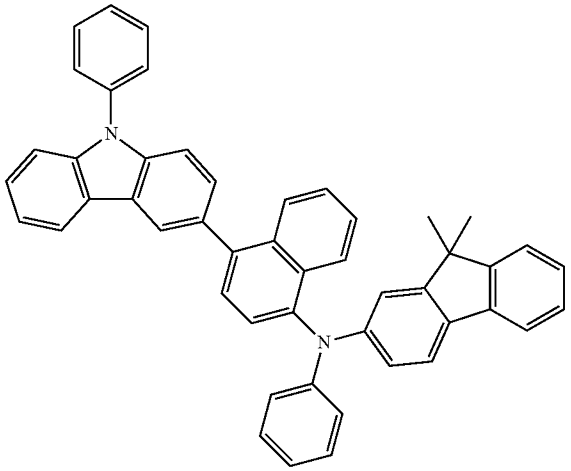

317

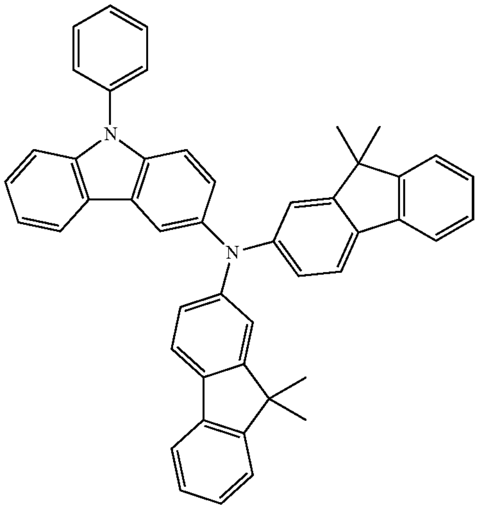

318

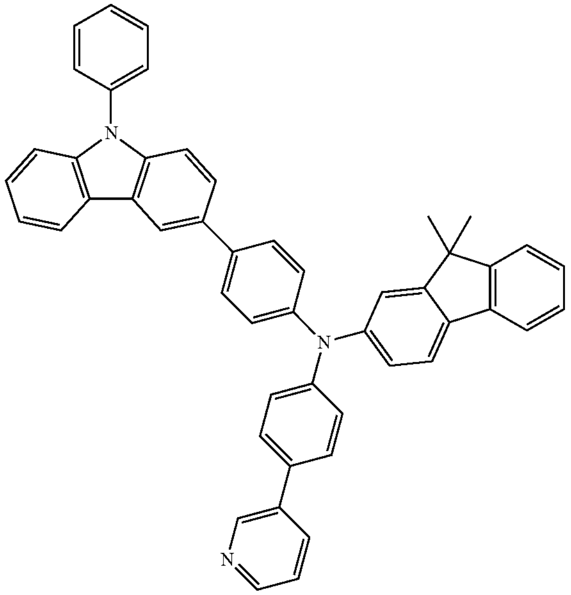

-continued

319

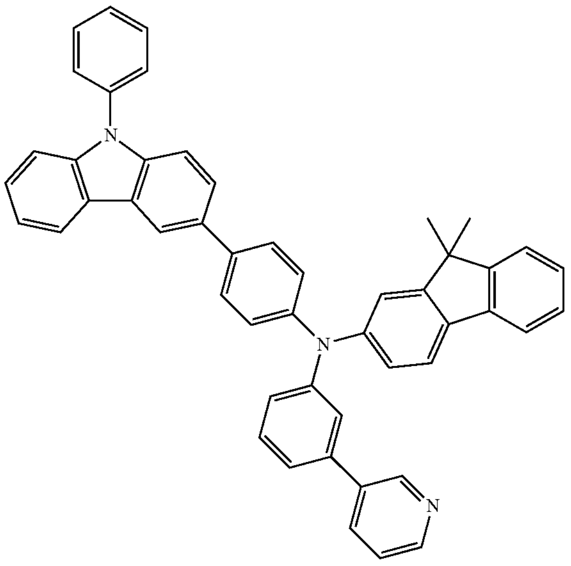

320

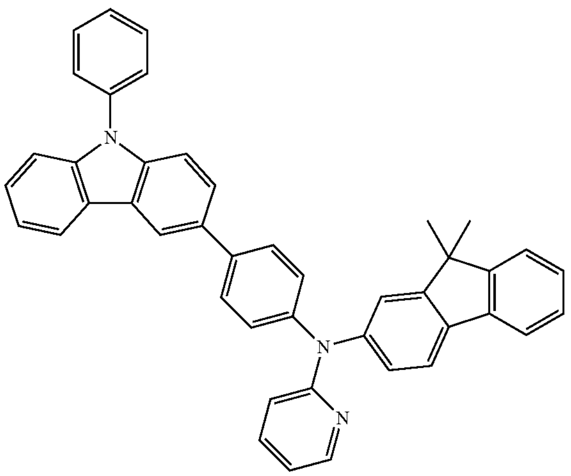

At least one of the HIL, the HTL, and the H-functional layer may further include a charge-generating material to increase conductivity of a layer, in addition to such suitable hole injecting materials, suitable hole transport materials, and/or materials having both hole injection and hole transport capabilities.

The charge-generation material may be, for example, a p-dopant. The p-dopant may be one of a quinone derivative, a metal oxide, and a cyano group-containing compound, but is not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as tungsten oxide or molybdenium oxide; and a cyano group-containing compound, such as Compound 200 below, but are not limited thereto.

Compound 200

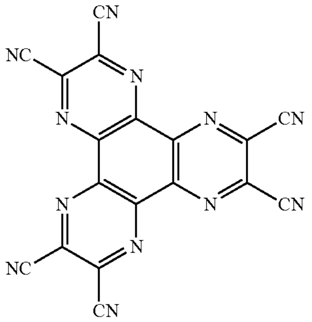

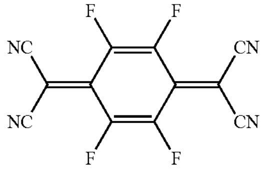

F4-TCNQ

When the HIL, the HTL or the H-functional layer further includes a charge-generating material, the charge-generating material may be homogeneously dispersed or non-homogeneously distributed in the HIL, the HTL, and the H-functional layer.

A buffer layer may be disposed between at least one of the HIL, the HTL, and the H-functional layer, and an emission layer. Also, the buffer layer may compensate for an optical resonance distance according to a wavelength of light emitted from the emission layer, therefore, efficiency of a formed organic light-emitting device may be improved. The buffer layer may include a suitable hole injection material and a suitable hole transport material. Also, the buffer layer may include a material that is identical to one of the materials included in the HIL, the HTL, and the H-functional layer formed under the buffer layer.

Subsequently, an emission layer (EML) may be formed on the HTL, the H-functional layer, or the buffer layer by spin coating, casting, or a LB method. When the EML is formed by vacuum deposition or spin coating, the deposition and coating conditions may be similar to those for the formation of the HIL, though the conditions for deposition and coating may vary according to the material that is used to form the EML.

The EML may be formed by using various suitable hosts and dopants. For example, any suitable fluorescent or phosphorescent dopant may be used herein.

Examples of suitable hosts are $Alq_3$, 4,4'-N,N'-dicarbazole-biphenyl (CBP), poly(n-vinylcarbazole) (PVK), 9,10-di (naphthalene-2-yl)anthracene (ADN), TCTA, 1,3,5-tris(N-phenylbenzimidazole-2-yl)benzene (TPBI), 3-tert-butyl-9, 10-di(naphth-2-yl) anthracene (TBADN), E3, distyrylarylene (DSA), dmCBP (see the following chemical structure), and Compounds 501 to 509 illustrated below, but are not limited thereto.

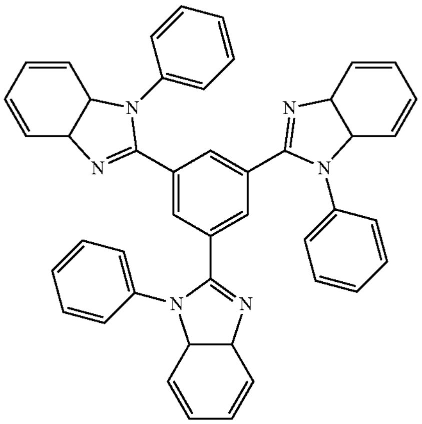

TPBI

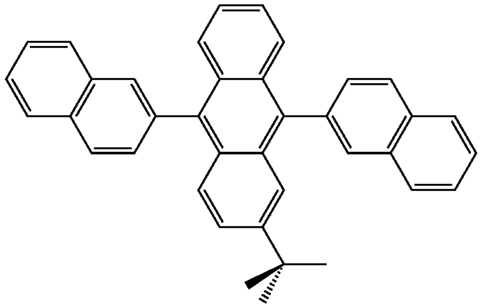

TBADN

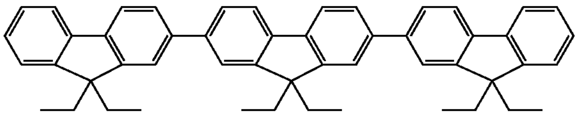

E3

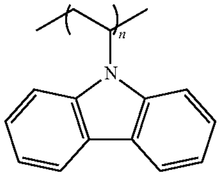

PVK

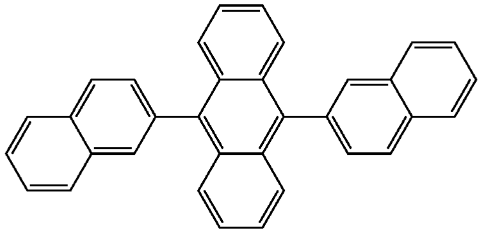

ADN

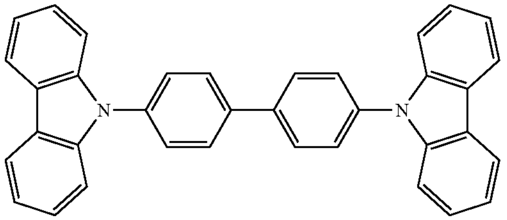

CBP

-continued
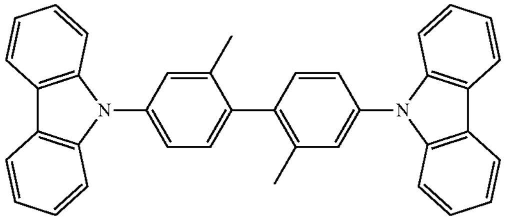
dmCBP
501
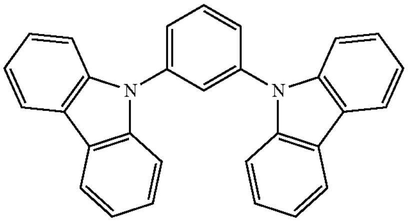
502
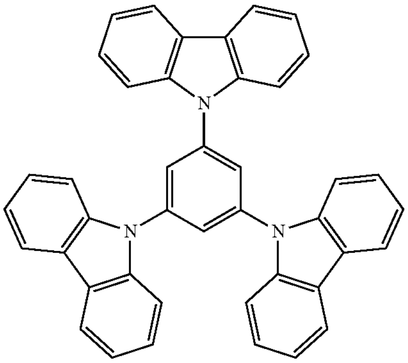
503
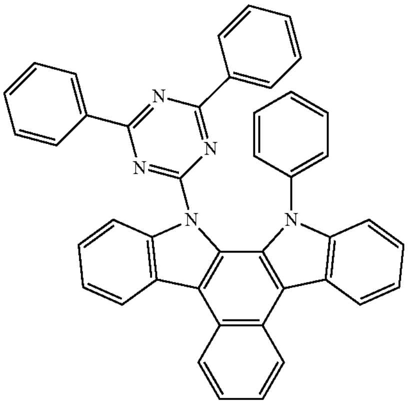
-continued
504
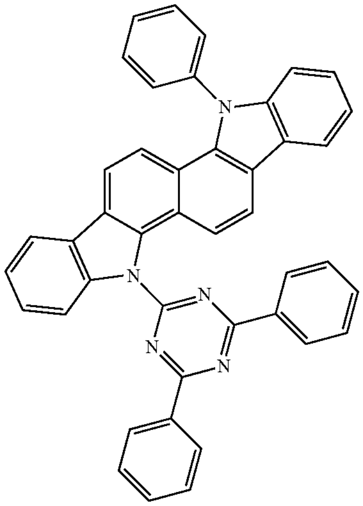
505
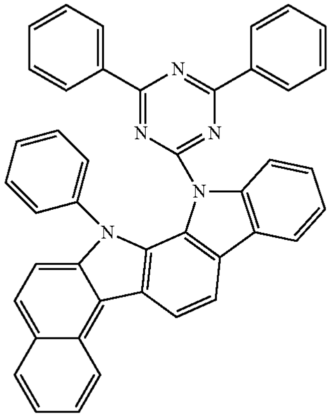
506
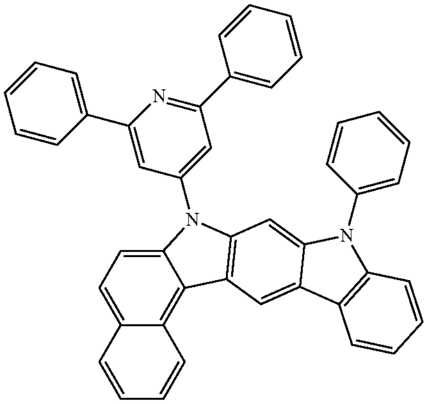

-continued

507

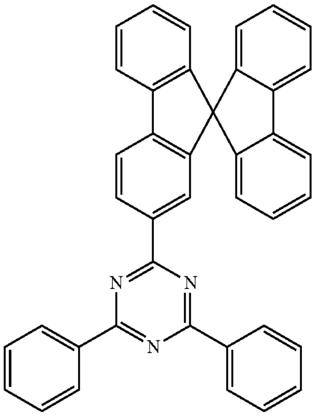

508

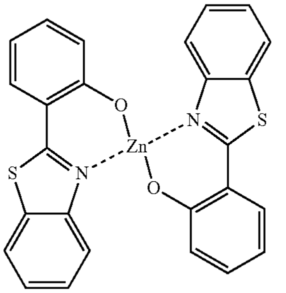

509

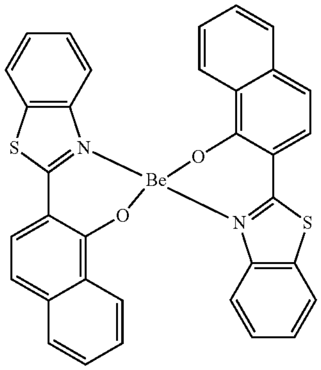

Also, the host may be an anthracene-based compound represented by Formula 400 below:

Formula 400

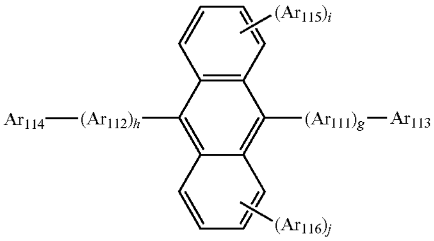

wherein, in Formula 400, $Ar_{111}$ and $Ar_{112}$ may be each independently a substituted or unsubstituted $C_5$-$C_{60}$ arylene group; $Ar_{113}$ to $Ar_{116}$ may be each independently a substituted or unsubstituted C1-$C_{10}$ alkyl group, or a substituted or unsubstituted $C_5$-$C_{60}$ aryl group; and g, h, i, and j are each independently an integer of 0 to 4.

For example, $Ar_{111}$ and $Ar_{112}$ in Formula 400 may be each independently a phenylene group, a naphthylene group, a phenanthrenyl group, or a pyrenylene group; or a phenylene group, a naphthylene group, a phenanthrenyl group, a fluorenyl group, or a pyrenylene group, each substituted with at least one of a phenyl group, a naphthyl group, and an anthryl group, but are not limited thereto.

g, h, i, and j in Formula 400 may each be independently 0, 1, or 2.

$Ar_{113}$ to $Ar_{116}$ in Formula 400 may be each independently a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, a fluorenyl group, and

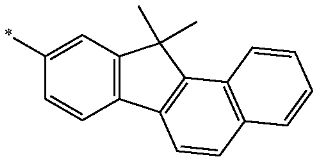

;

but are not limited thereto.

For example, the anthracene-based compound represented by Formula 400 may be one of the following compounds, but is not limited thereto:

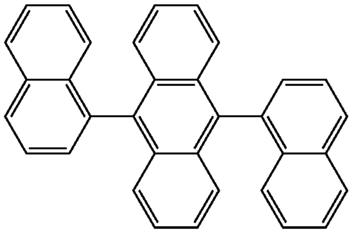

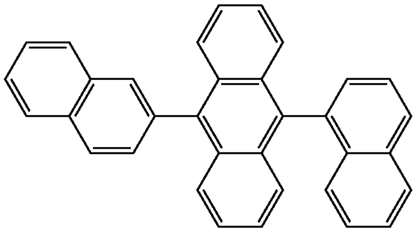

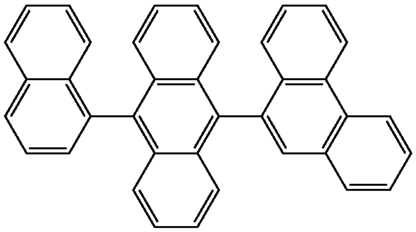

-continued
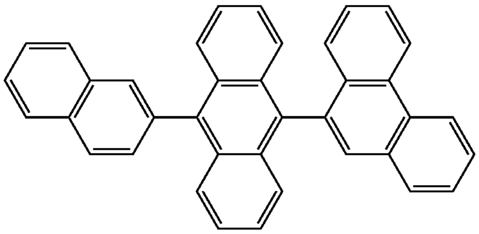
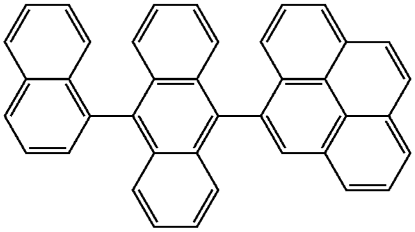
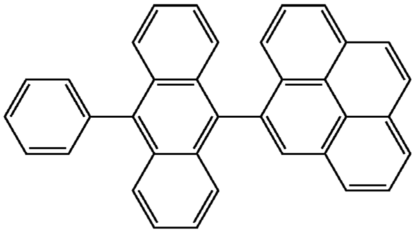
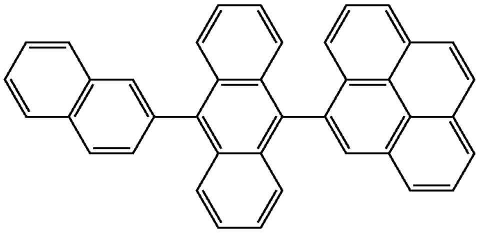
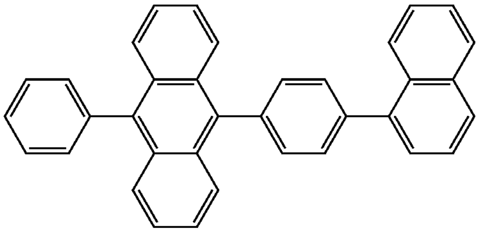
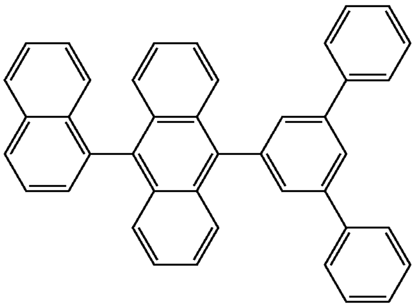
-continued
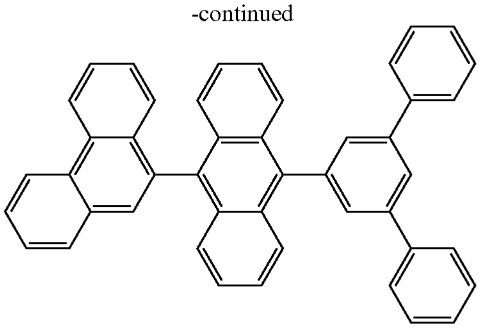
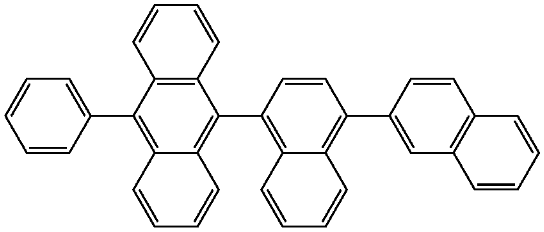
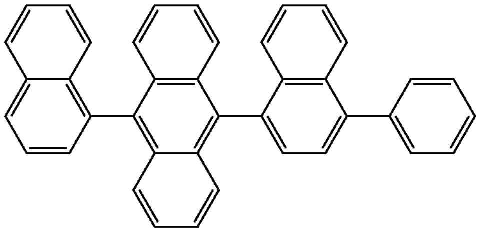
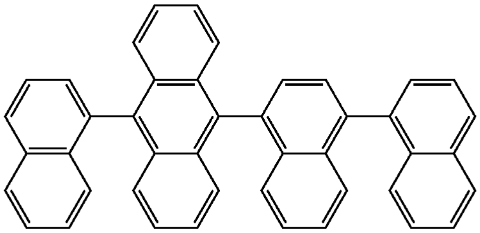
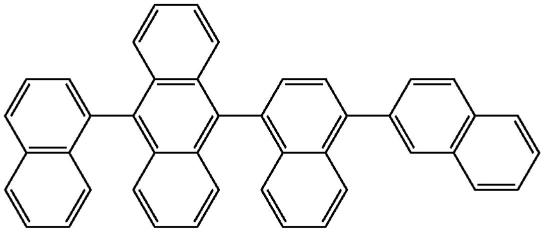
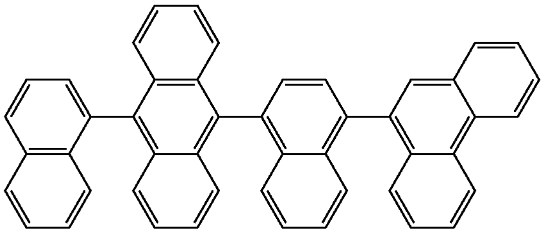
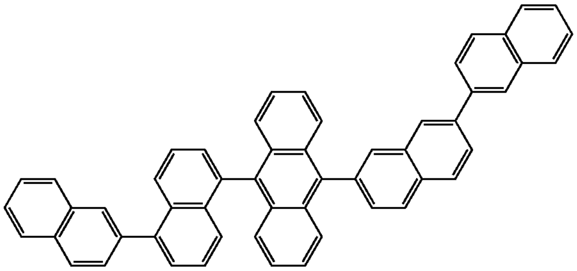

-continued
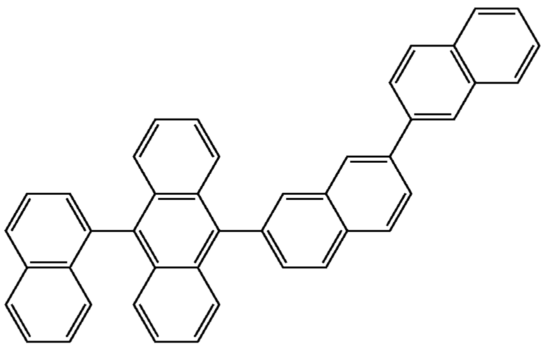
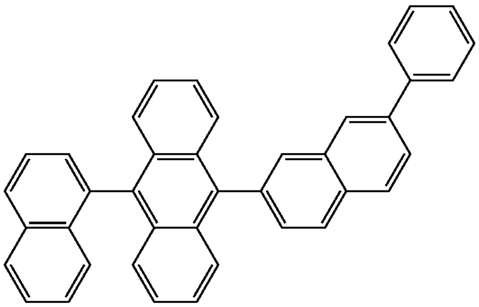
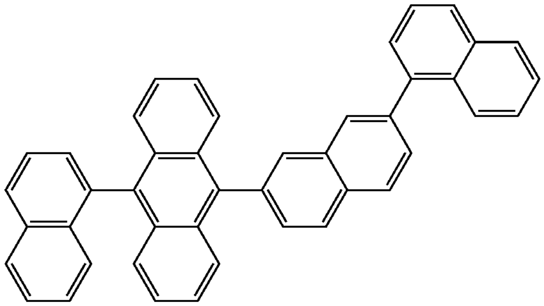
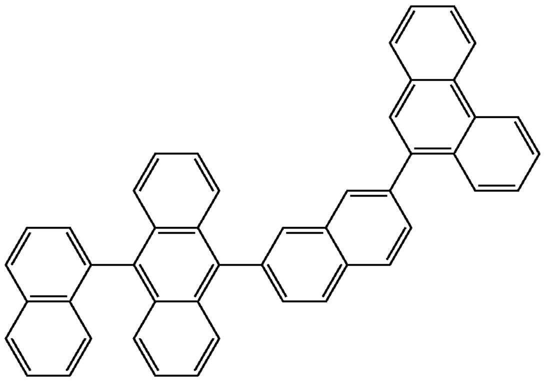
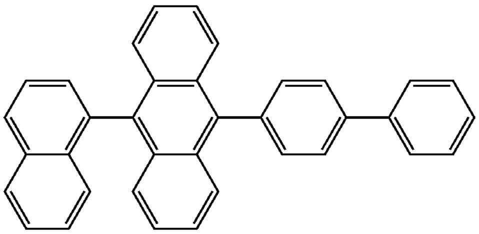
-continued
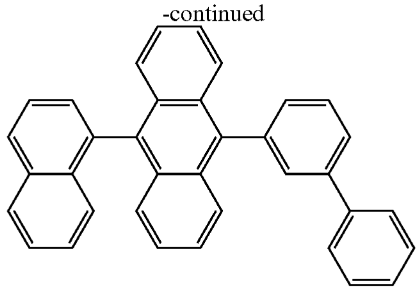
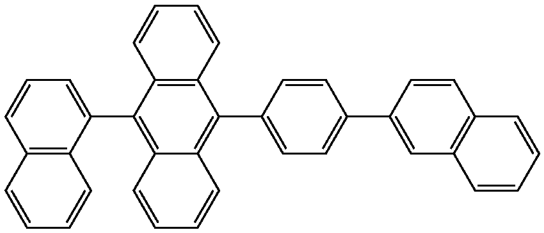
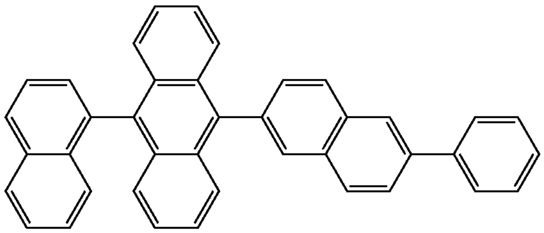
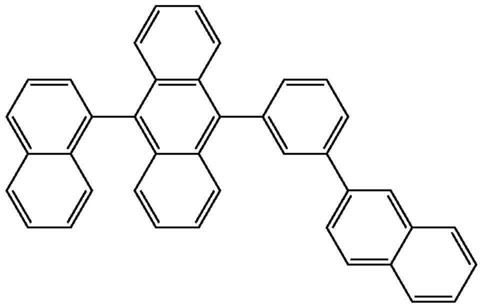
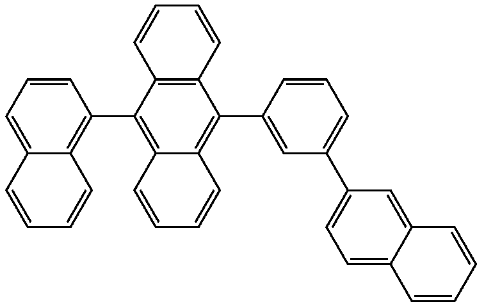
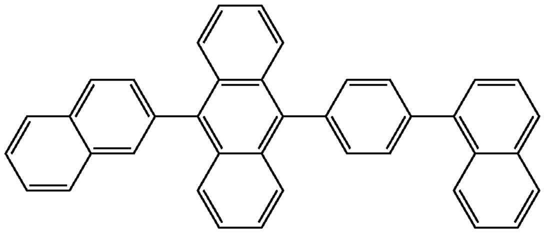

-continued
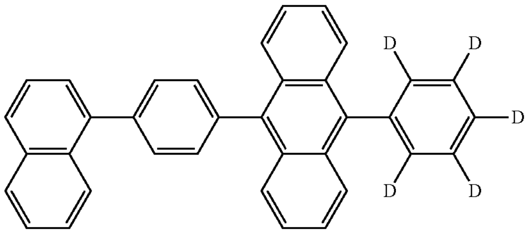
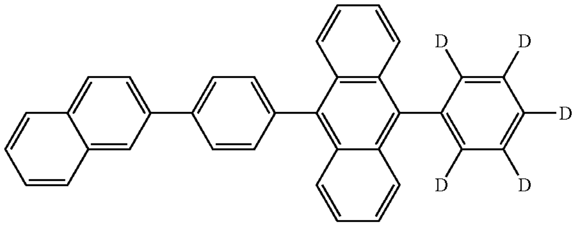
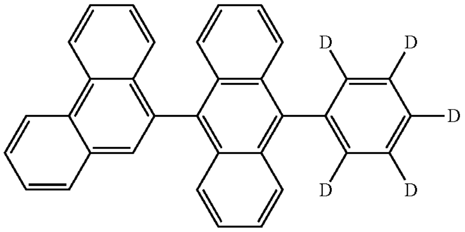
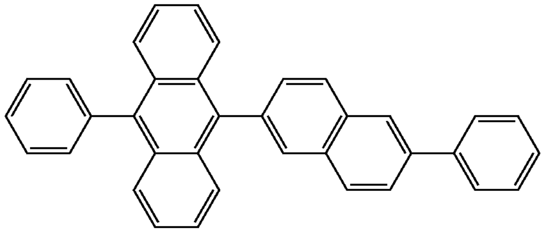
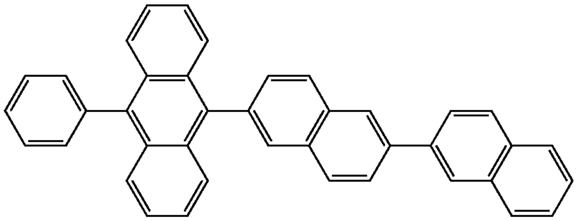
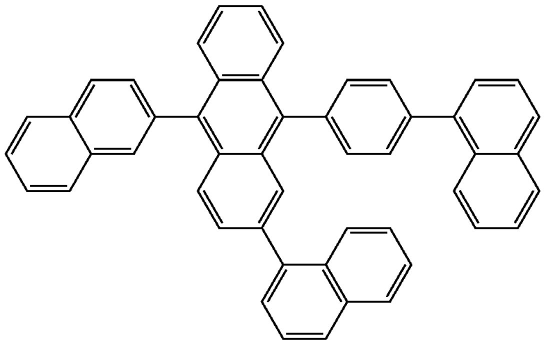
-continued
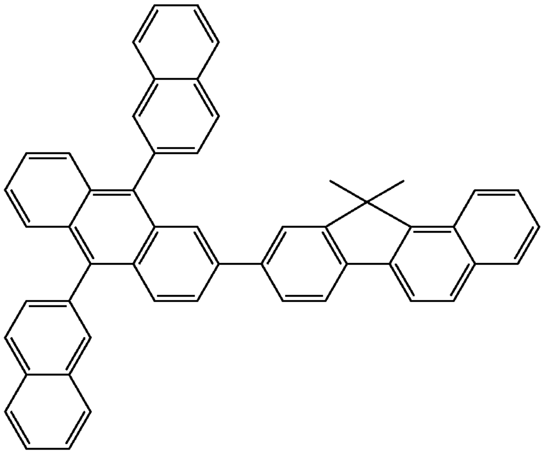
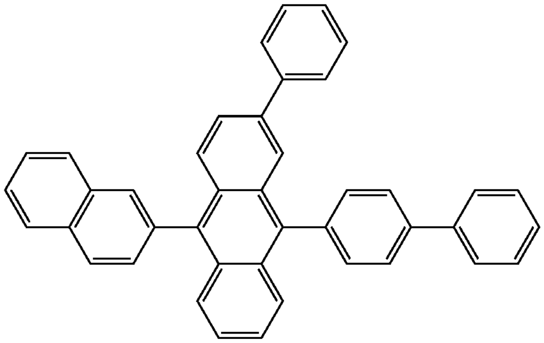
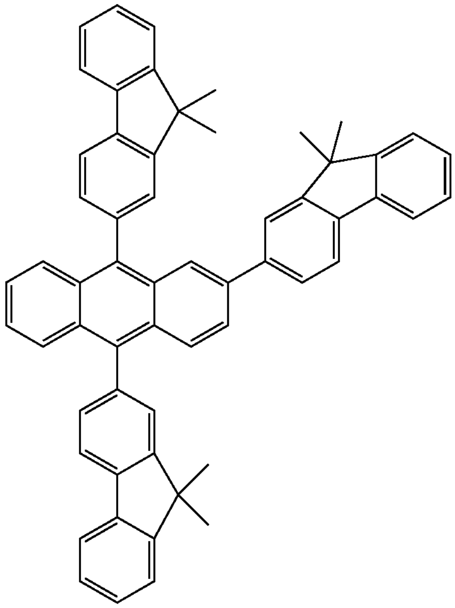

-continued

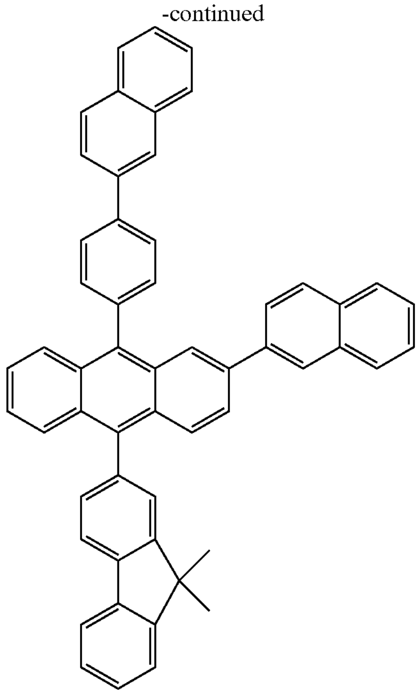

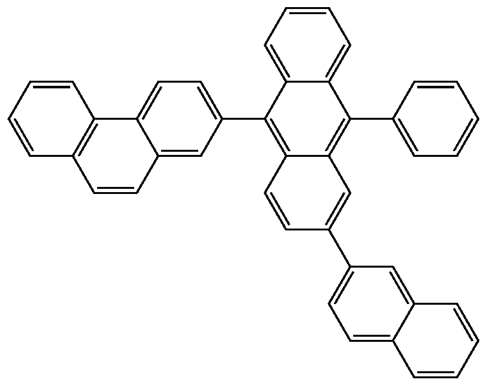 [SMILES: c1ccc(-c2c3ccccc3c(-c3ccc4c(ccc5ccccc54)c3)c3ccc(-c4ccc5ccccc5c4)cc23)cc1]

Also, the host may be an anthracene-based compound represented by Formula 401 below:

Formula 401

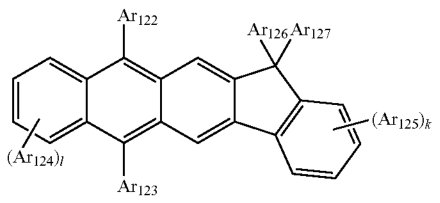

$Ar_{122}$ to $Ar_{125}$ in Formula 401 are the same as described in detail in connection with $Ar_{113}$ in Formula 400.

$Ar_{126}$ and $Ar_{127}$ in Formula 401 may be each independently a $C_1$-$C_{10}$ alkyl group (for example, a methyl group, an ethyl group, or a propyl group).

k and l in Formula 401 may be each independently an integer of 0 to 4. For example, k and l may be 0, 1, or 2.

For example, the anthracene-based compound represented by Formula 401 may be one of the following compounds, but is not limited thereto:

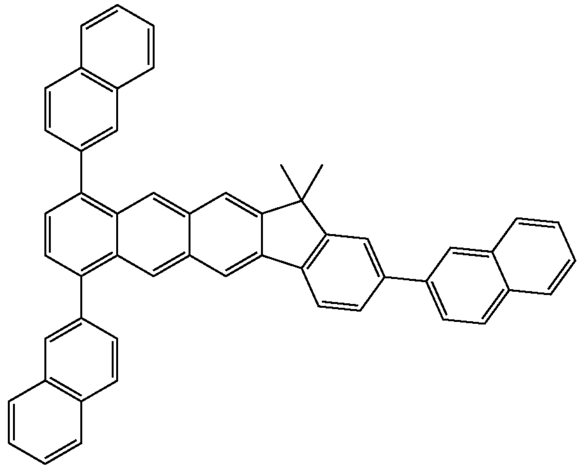

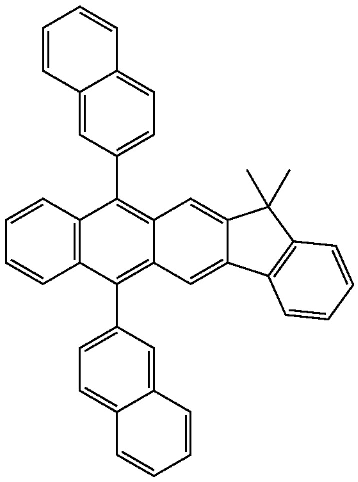

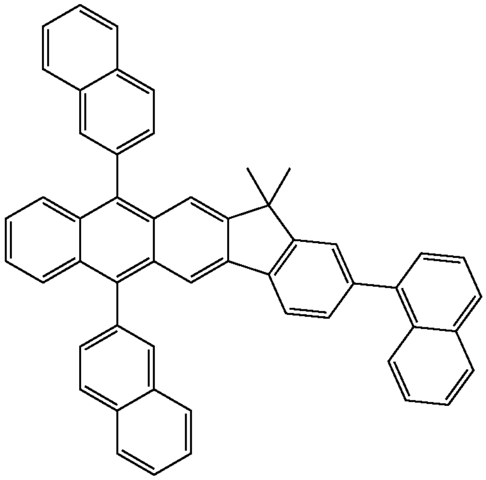

-continued

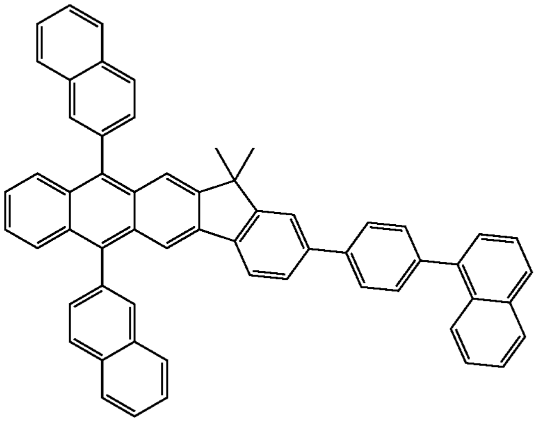 [SMILES: CC1(C)c2cc(-c3ccc(-c4cccc5ccccc45)cc3)ccc2-c2cc3c(-c4ccc5ccccc5c4)c4ccccc4c(-c4ccc5ccccc5c4)c3cc21]

When the organic light-emitting device is a full color organic light-emitting device, the emission layer may be patterned into a red emission layer (red EML), a green emission layer (green EML), and a blue emission layer (blue EML).

Also, at least one of the red EML, the green EML, and the blue EML may include the following dopants (ppy=phenylpyridine).

For example, compounds illustrated below may be used as a blue dopant, but the blue dopant is not limited thereto.

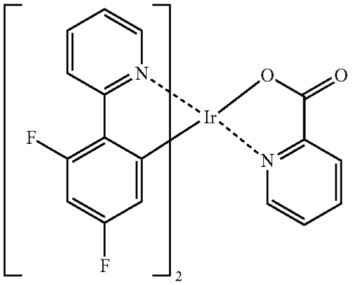

F$_2$Irpic

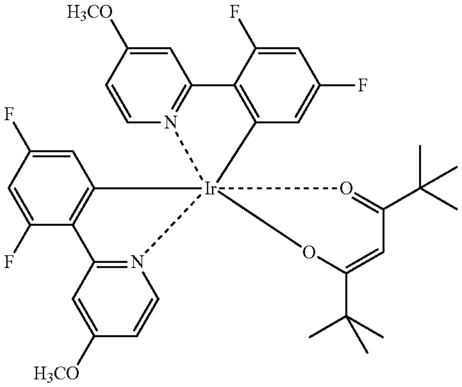

(F2ppy)2Ir(tmd)

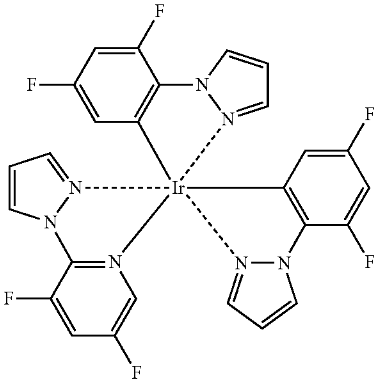

If(dfppz)$_3$

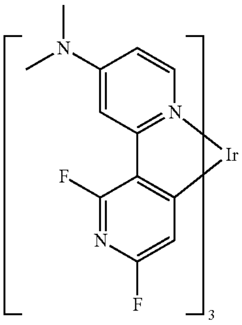

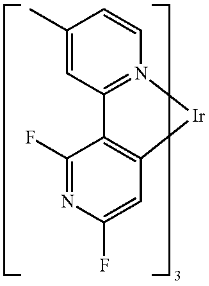

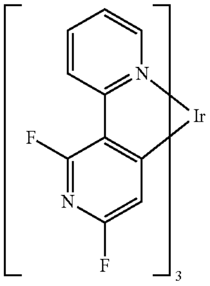

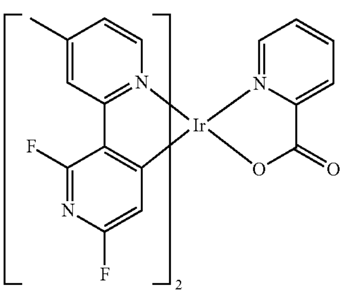

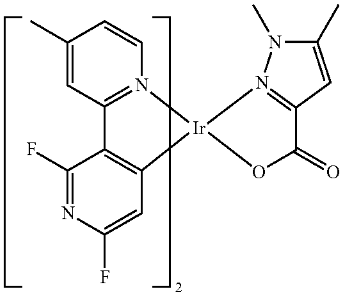

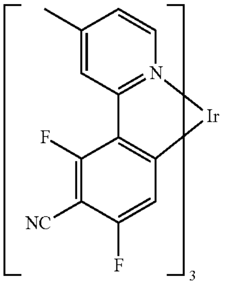

-continued
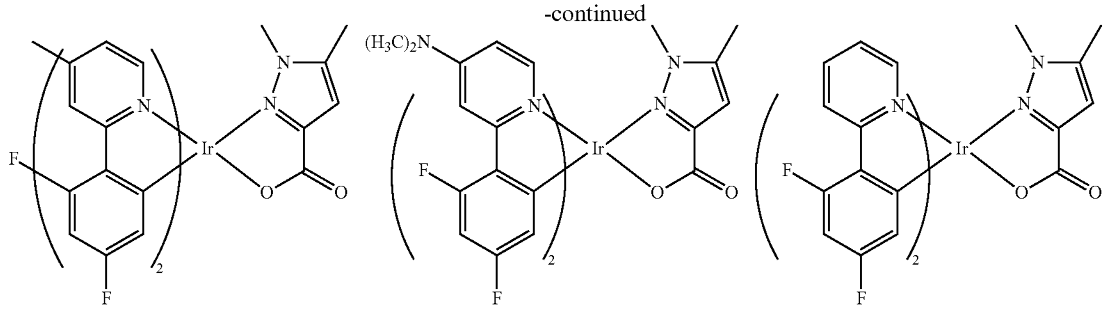
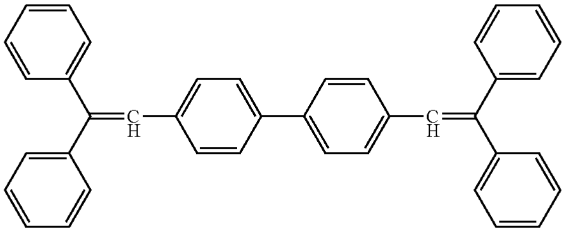
DPVBi
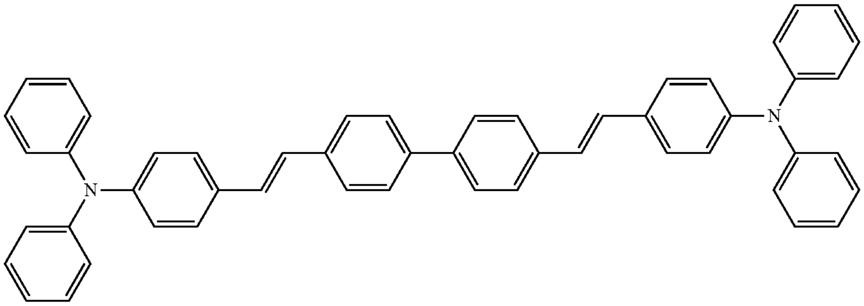
DPAVBi
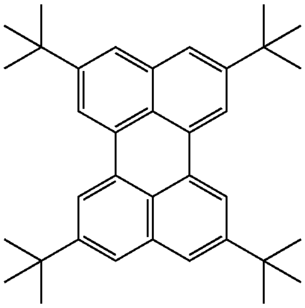
TBPe
For example, compounds illustrated below may be used as a red dopant, but the red dopant is not limited thereto.
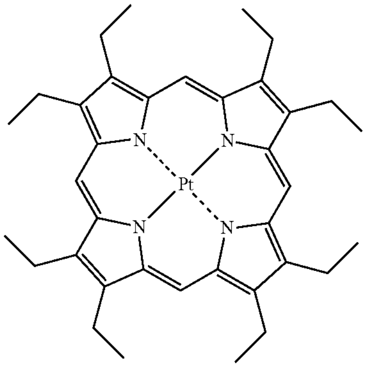
PtOEP
-continued
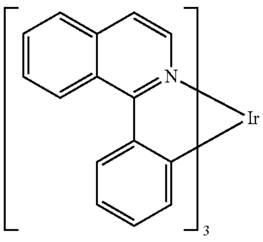
Ir(piq)3
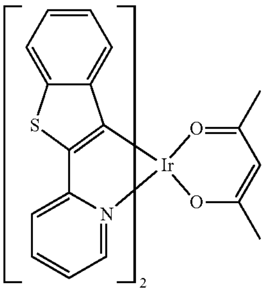
Btp2Ir(acac)
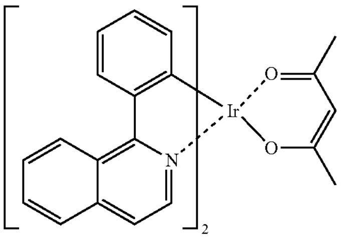

-continued
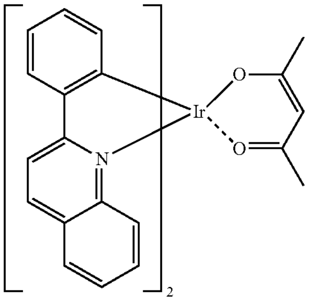
Ir(pq)$_2$(acac)
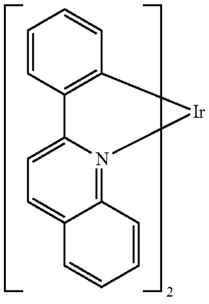
Ir(2-phq)$_3$
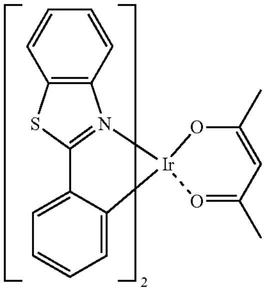
Ir(BT)$_2$(acac)
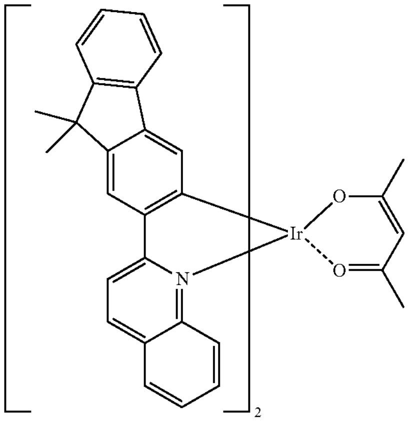
Ir(flq)$_2$(acac)
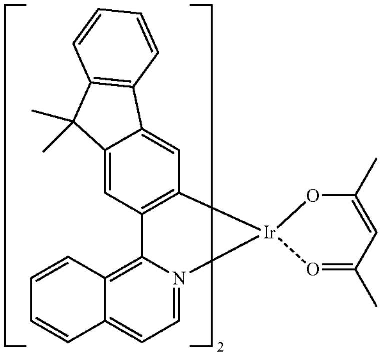
Ir(fliq)$_2$(acac)
-continued
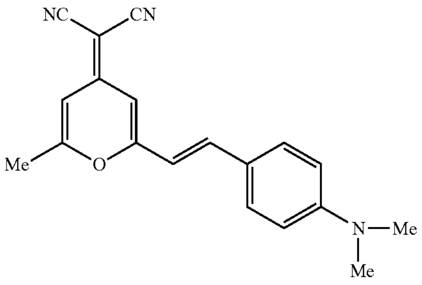
DCM
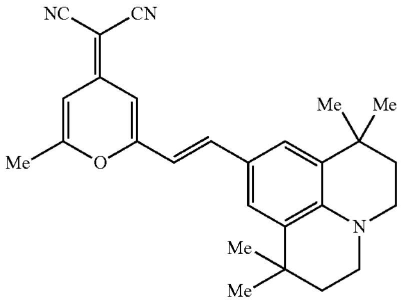
DCJTB
For example, compounds illustrated below may be used as a green dopant, but the green dopant is not limited thereto.
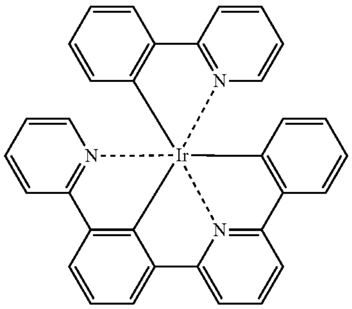
Ir(ppy)$_3$
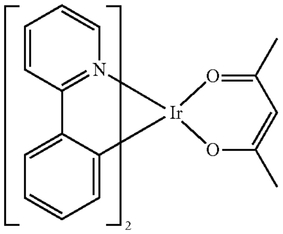
Ir(ppy)$_2$(acac)
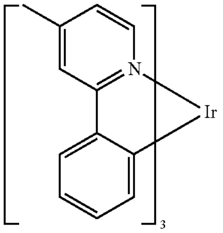
Ir(mpyp)$_3$ -continued
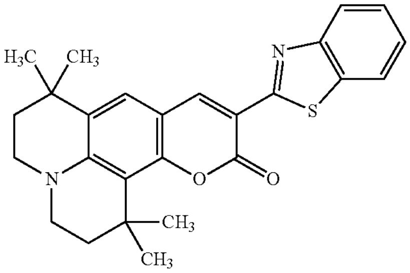
C545T
Also, the dopant available for use in the emission layer may be a Pd complex or a Pt complex described below, but is not limited thereto:
D1
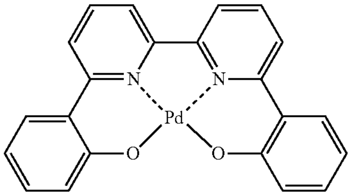
D2
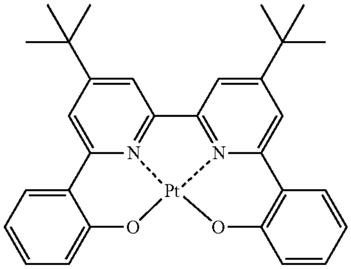
D3
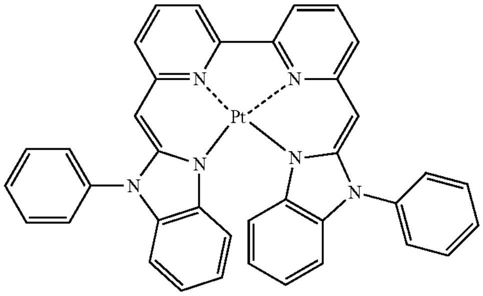
D4
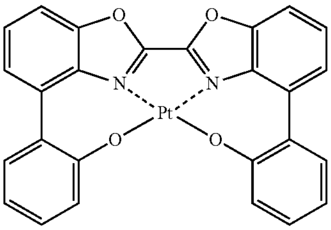
-continued
D5
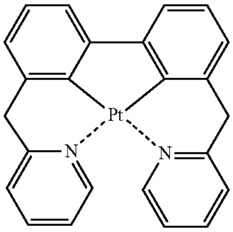
D6
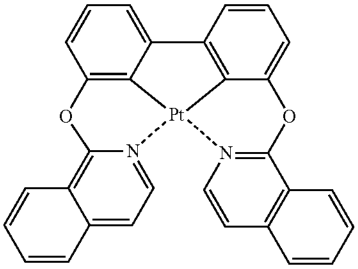
D7
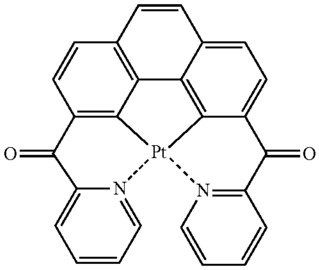
D8
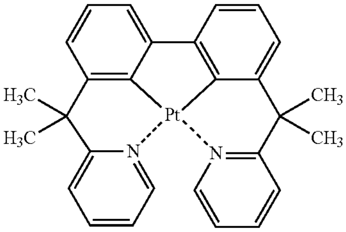
D9
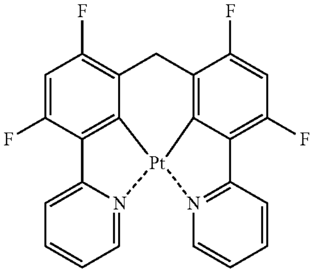
D10
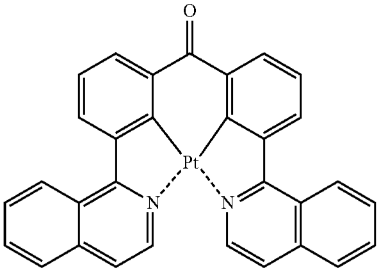

-continued
D11
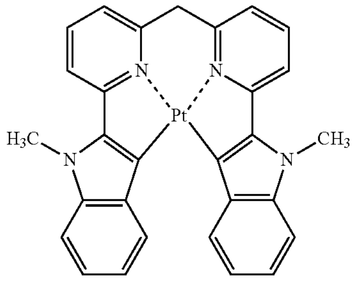
D12
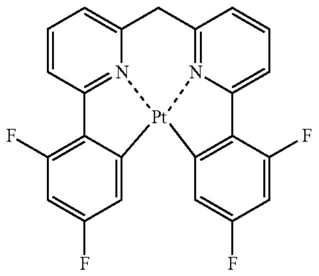
D13
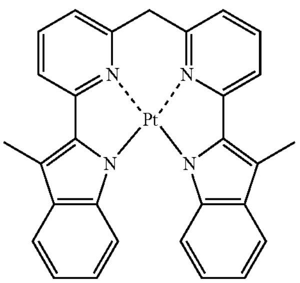
D14
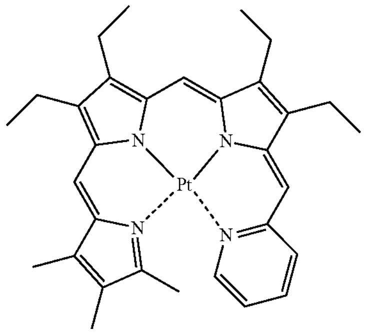
D15
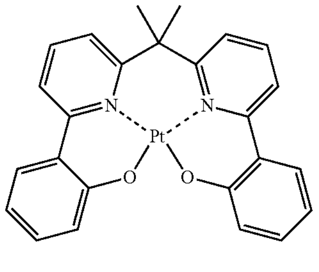
-continued
D16
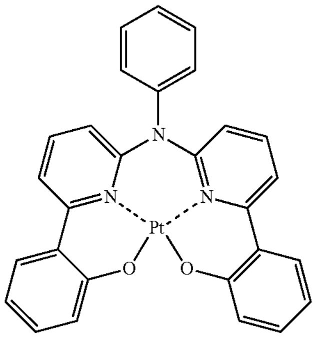
D17
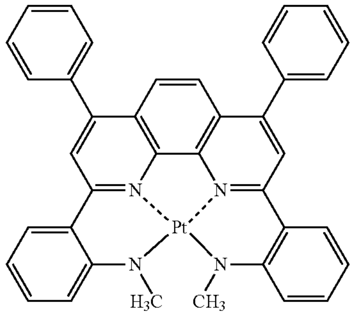
D18
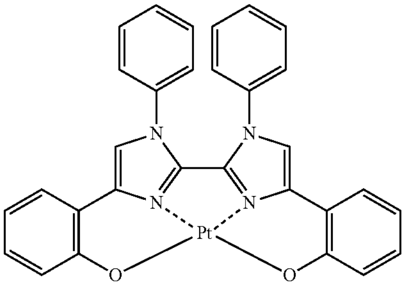
D19
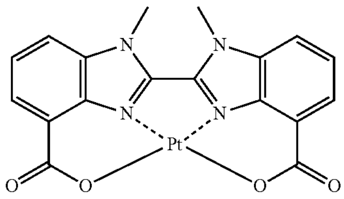
D20
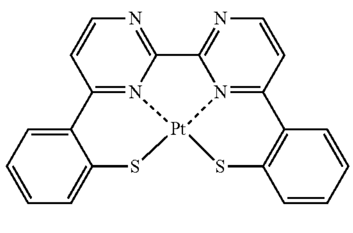

-continued
D21
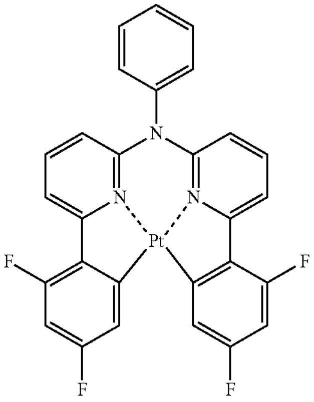
D22
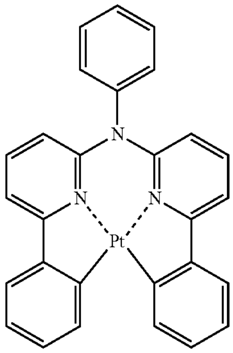
D23
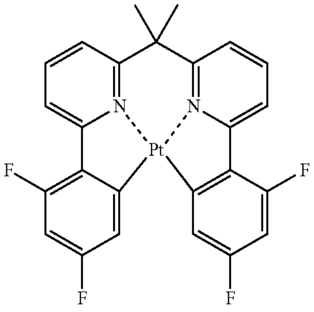
D24
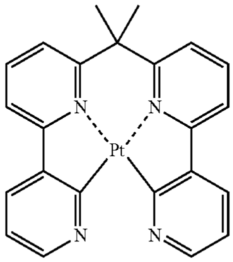
D25
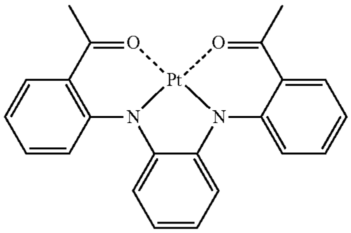
-continued
D26
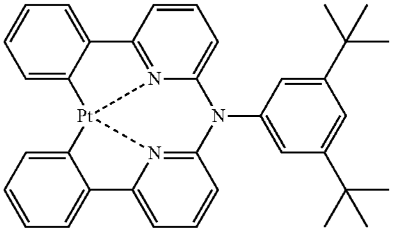
D27
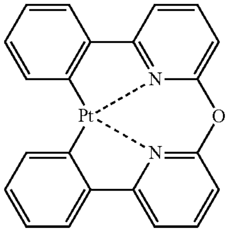
D28
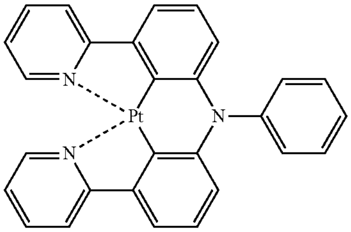
D29
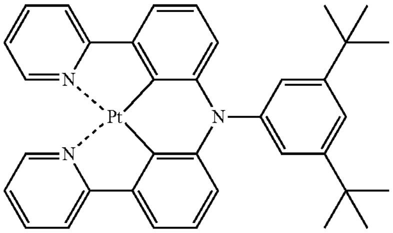
D30
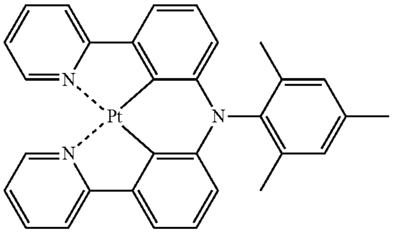
D31
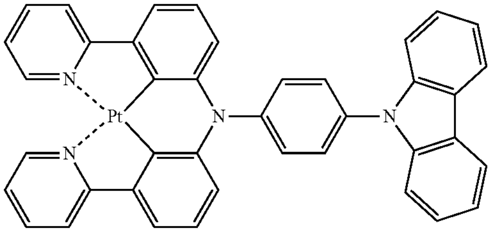

-continued
D32
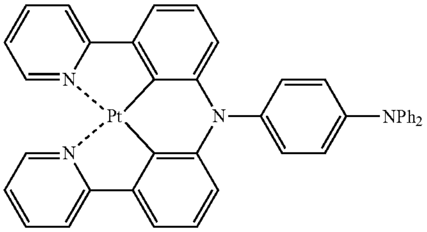
D33
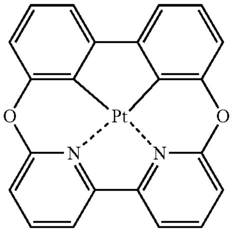
D34
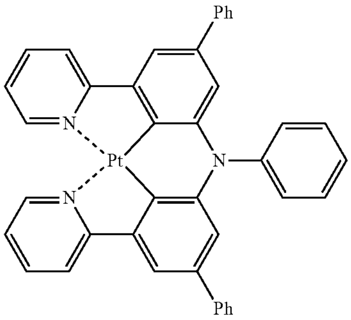
D35
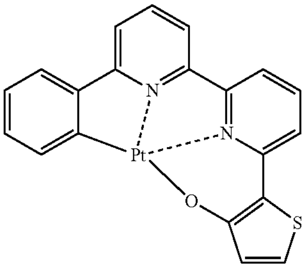
D36
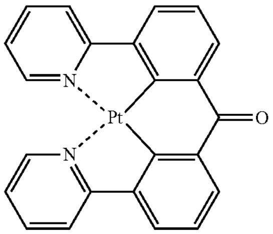
-continued
D37
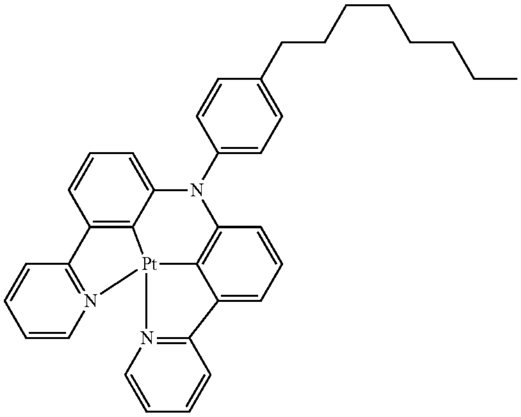
D38
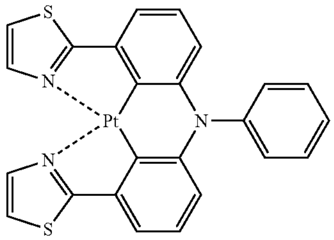
D39
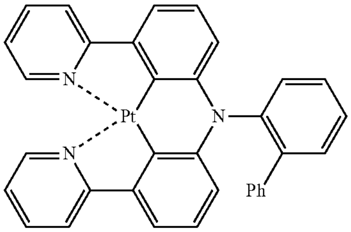
D40
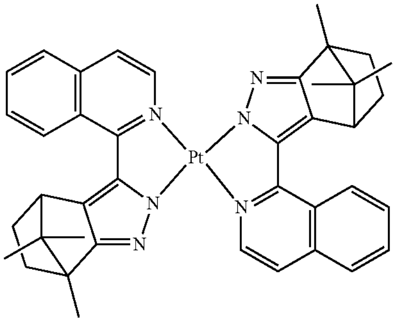
D41
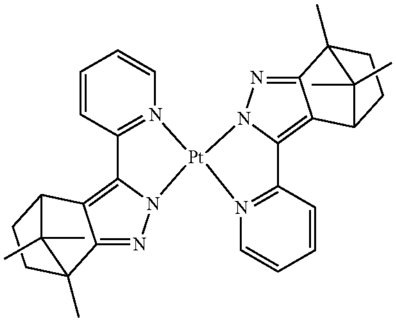

-continued
D42
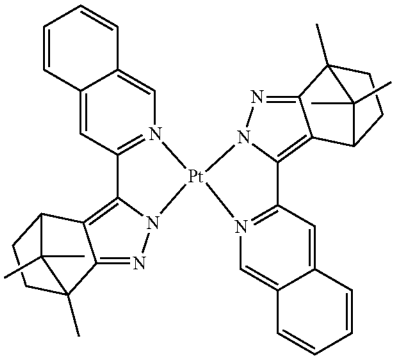
D43
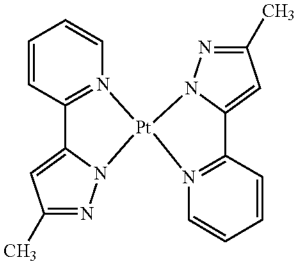
D44
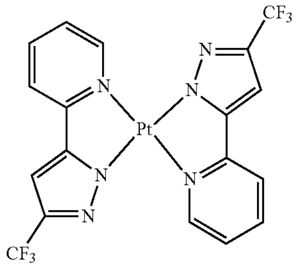
D45
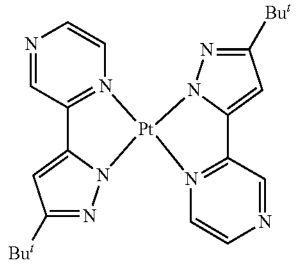
D46
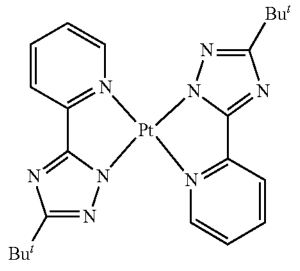
D47
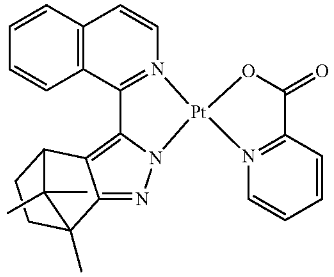
D48
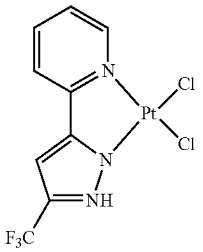
D49
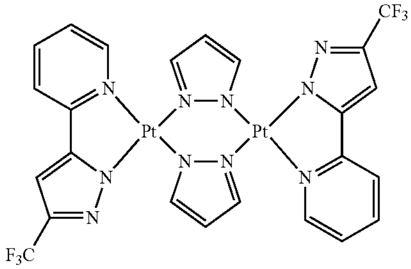
D50
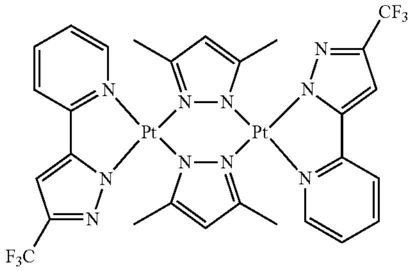
Also, the dopant available for use in the emission layer may be an Os-complex described below, but is not limited thereto:
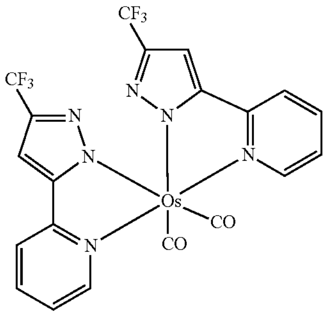
$Os(fppz)_2(CO)_2$ -continued

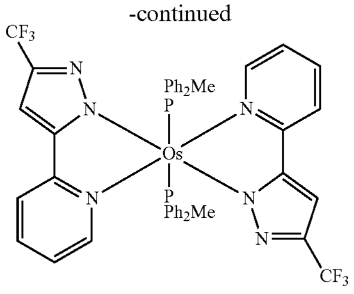

$Os(fppz)_2(PPh_2Me)_2$

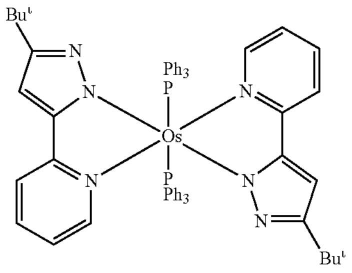

$Os(bppz)_2(PPh_3)_2$

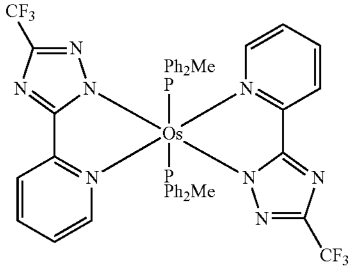

$Os(fptz)_2(PPh_2Me)_2$

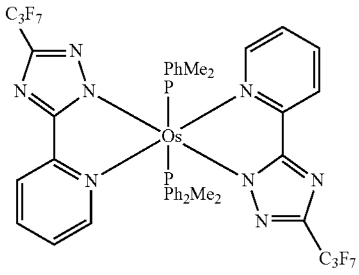

$Os(hptz)_2(PPhMe_2)_2$

When the emission layer includes a host and a dopant, an amount of the dopant may be, conventionally, in a range of about 0.01 to about 15 wt % based on 100 wt % of the host, but the amount of the dopant is not limited thereto.

A thickness of the EML may be in a range of about 100 Å to about 1,000 Å, for example, about 200 Å to about 600 Å. In one embodiment, when the thickness of the emission layer is within this range, excellent light-emission characteristics are obtained without a substantial increase in driving voltage.

Next, an electron transport layer (ETL) is formed on the emission layer by using various suitable methods, for example, by vacuum deposition, spin coating, casting, or the like. When the ETL is formed using vacuum deposition or spin coating, the deposition and coating conditions may be similar to those for the formation of the HIL, though the conditions for deposition and coating may vary according to the material that is used to form the ETL.

An electron transport material may be any one of various suitable materials that stably transport electrons provided by an electron injection electrode (cathode), and may be the compound represented by Formula 1 or Formula 2 according to an embodiment of the present invention, or any suitable electron transport material.

Examples of suitable electron transport materials are a quinoline derivative (such as tris(8-quinolinolate)aluminum (Alq3)), TAZ, Balq, beryllium bis(benzoquinolin-10-olate) ($Bebq_2$), ADN, Compound 201, and Compound 202, but are not limited thereto.

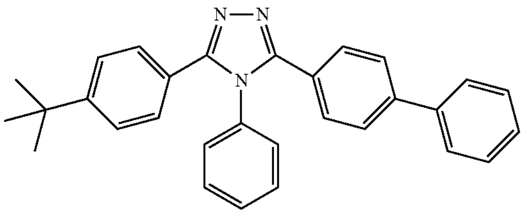

TAZ

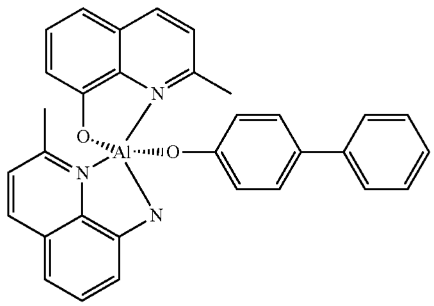

BAlq

Compound 201

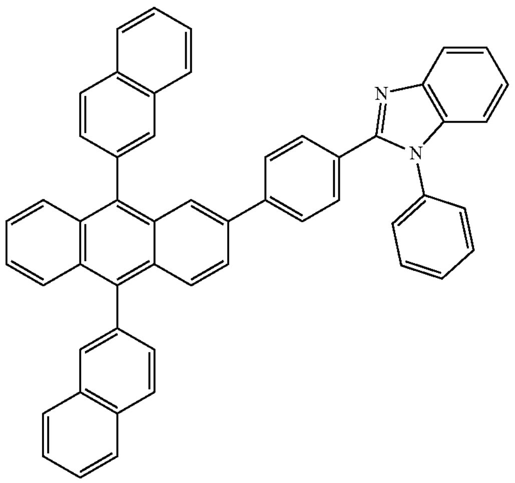

-continued

Compound 202

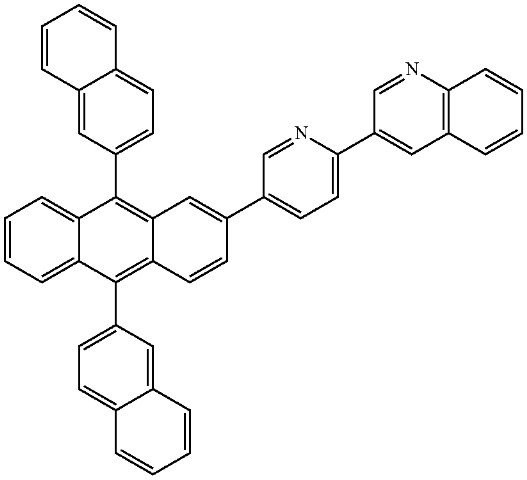

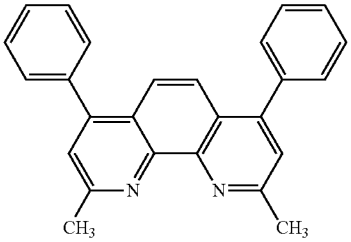

BCP

A thickness of the ETL may be in a range of about 100 Å to about 1,000 Å, for example, about 150 Å to about 500 Å. In one embodiment, when the thickness of the ETL is within the range described above, the ETL has satisfactory electron transport characteristics without a substantial increase in driving voltage.

Also, the ETL may include, in addition to an electron transport organic compound, a metal-containing material.

The metal-containing material may include a Li complex. Non-limiting examples of the Li complex are lithium quinolate (LiQ) and Compound 203 illustrated below:

Compound 203

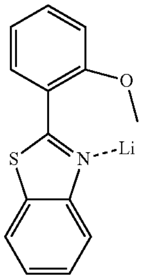

Then, an electron injection layer (EIL), which facilitates injection of electrons from the cathode, may be formed on the ETL. Any suitable electron-injecting material may be used to form the EIL.

Non-limiting examples of suitable materials for forming the EIL are LiF, NaCl, CsF, $Li_2O$, and BaO, which are known in the art. The deposition conditions of the EIL may be similar to those used to form the HIL, although the deposition conditions may vary according to the material that is used to form the EIL.

A thickness of the EIL may be in a range of about 1 Å to about 100 Å, for example, about 3 Å to about 90 Å. In one embodiment, when the thickness of the EIL is within the range described above, the EIL has satisfactory electron transport characteristics without a substantial increase in driving voltage.

A second electrode is disposed on the organic layer. The second electrode may be a cathode that is an electron injection electrode, and in this regard, a metal for forming the second electrode may be a material having a low work function, and such a material may be a metal, an alloy, an electrically conductive compound, or a mixture thereof. For example, lithium (Li), magnesium (Mg), aluminum (Al), aluminum-lithium (Al—Li), calcium (Ca), magnesium-indium (Mg—In), or magnesium-silver (Mg—Ag) may be formed as a thin film to obtain a transmissive electrode. Also, to manufacture a top emission light-emitting device, a transmissive electrode formed using ITO or IZO may be formed.

Here, the organic light-emitting device has been described with reference to the drawing, but is not limited thereto. For example, the organic layer may include a capping layer on the second electrode, and the capping layer includes the heterocyclic compound.

In addition, when a phosphorescent dopant is used in the emission layer, a triplet exciton or a hole may diffuse to the ETL. To reduce or prevent the diffusion, a hole blocking layer (HBL) may be formed between the HTL and the emission layer or between the E-functional layer and the emission layer by vacuum deposition, spin coating, casting, LB deposition, or the like. When the HBL is formed by vacuum deposition or spin coating, the deposition or coating conditions may be similar to those applied to form the HIL, although the deposition or coating conditions may vary according to the material that is used to form the HBL. A hole blocking material may be any one of suitable hole blocking materials, and examples thereof are an oxadiazole derivative, a triazole derivative, a phenanthroline derivative, etc. For example, BCP illustrated below may be used as the hole-blocking material.

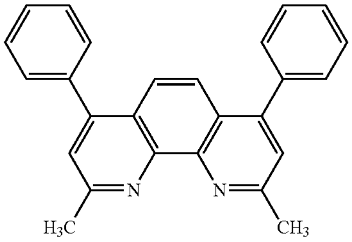

BCP

A thickness of the HBL may be in a range of about 20 Å to about 1,000 Å, for example, about 30 Å to about 300 Å. In one embodiment, when the thickness of the hole blocking layer is within these ranges, the hole blocking layer has excellent hole blocking characteristics without a substantial increase in driving voltage.

An organic light-emitting device according to an embodiment of the present invention may be used in various flat panel display apparatuses, such as a passive matrix organic light-emitting display apparatus or an active matrix organic light-emitting display apparatus. In particular, when the organic light-emitting device is included in an active matrix organic light-emitting display apparatus, a first electrode disposed on a substrate acts as a pixel and may be electrically connected to a source electrode or a drain electrode of a thin film transistor. In addition, the organic light-emitting device may be included in a flat panel display apparatus that emits light in opposite directions.

Also, an organic layer according to an embodiment of the present invention may be formed by depositing the compound according to an embodiment of the present invention, or may be formed by using a wet method in which the compound according to an embodiment of the present invention is prepared in the form of solution and then the solution of the compound is used for coating.

Hereinafter, an organic light-emitting device according to an embodiment of the present invention is described in more detail with reference to Synthesis Examples and Examples. However, the organic light-emitting device is not limited thereto.

EXAMPLE

Synthesis Example 1

Synthesis of Compound 7

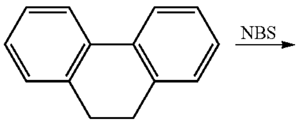

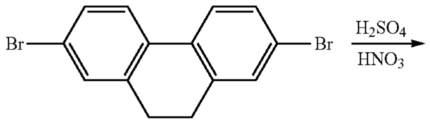

I-1

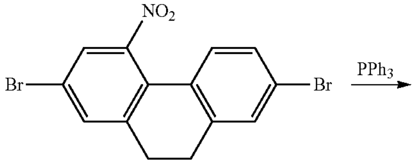

I-2

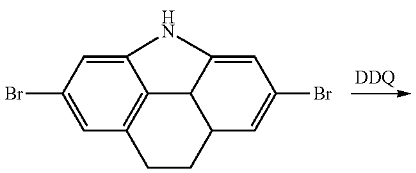

I-3

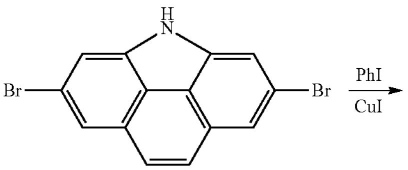

I-4

-continued

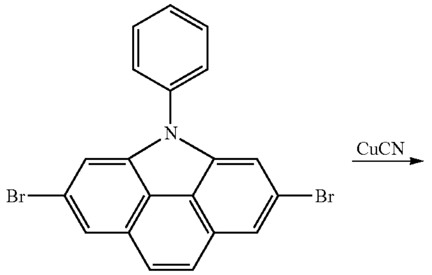

I-5

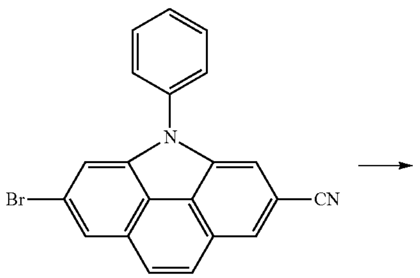

I-6

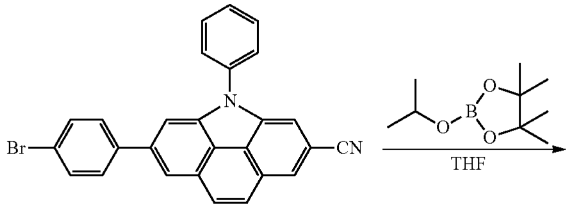

I-7

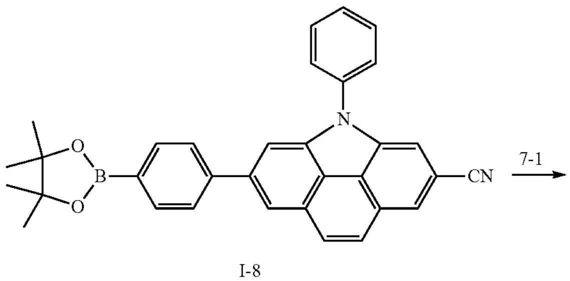

I-8

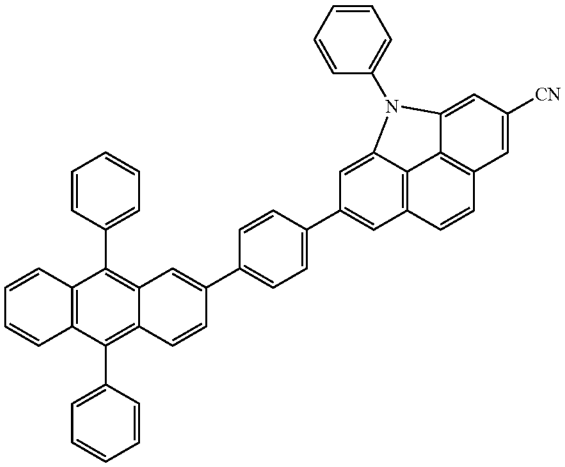

7

-continued

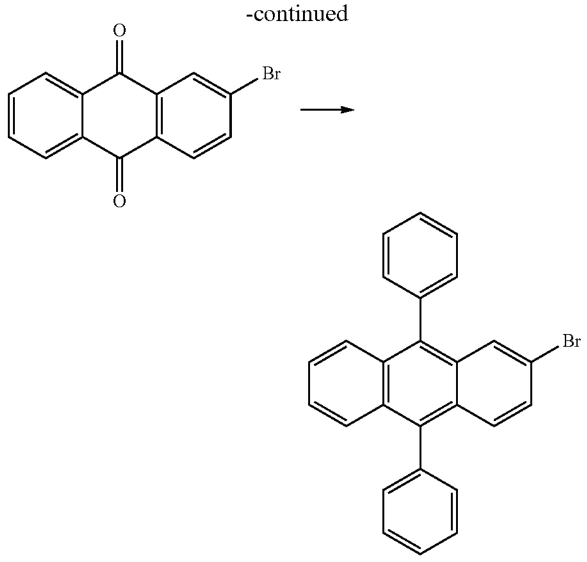

7-1

1) Synthesis of Intermediate I-1

10.0 g (55.4 mmol) of 9,10-dihydrophenanthrene, 21.8 g (121.0 mmol) of N-bromosuccinimide, and 0.5 g (2.7 mmol) of p-TsOH were dissolved in 30 mL of acetonitrile, and then, the mixture was stirred at a temperature of 50° C. for 12 hours. The reaction solution was cooled to room temperature, and then, stirred for 30 minutes to precipitate the crystals. The crystals collected by compression-filter were washed with methanol to obtain 8.4 g (yield 45%) of Intermediate I-1, which was gray crystal. The obtained compound was confirmed by LC-MS. $C_{14}H_{10}Br_2$: $M^+$ 335.9.

2) Synthesis of Intermediate I-2

8.4 g (24.9 mmol) of Intermediate I-1 was completely dissolved in 60 mL of dichloromethane, 3.1 g (49.8 mmol) of nitric acid was added thereto at room temperature, 2.4 g (24.9 mmol) of sulfuric acid was slowly dropped thereto, and at a temperature of 30° C., the resultant mixture was stirred for 6 hours. When the reaction stopped, the reaction solution was cooled to room temperature, 60 mL of methanol was added thereto, and the resultant solution was stirred for 2 hours to precipitate the crystals. The crystals collected by compression-filter were washed with methanol to obtain 8.6 g (yield 90%) of Intermediate I-2, which was yellow crystal. The obtained compound was confirmed by LC-MS. $C_{14}H_9Br_2NO_2$: $M^+$ 380.9.

3) Synthesis of Intermediate I-3

8.6 g (22.5 mmol) of Intermediate I-2 was dissolved in 40 mL of o-dichlorobenzene, the mixture was heated to be completely dissolved, 8.83 g (33.7 mmol) of triphenylphosphine was added thereto, and the resultant product was stirred at a temperature of 180° C. for 3 hours. The reaction solution was cooled to room temperature, the residual obtained by evaporating the solvent therefrom was separation-purified by silica column chromatography, and the obtained product was washed with methanol to obtain 5.8 g (yield 73%) of Intermediate I-3, which was white crystal. The obtained compound was confirmed by LC-MS. $C_{14}H_{11}Br_2N$: $M^+$ 350.9.

4) Synthesis of Intermediate I-4

In an oxygen atmosphere, 5.8 g (16.4 mmol) of Intermediate I-3 was dissolved in 100 mL of toluene, and then, at room temperature, 0.98 g (0.49 mmol) of 2,3-dichloro-5,6-dicyano-1,4-benzoquinone and 0.32 g (0.49 mmol) of $NaNO_2$ were added thereto. The mixture was stirred at a temperature of 110° C. for 6 hours. When the reaction stopped, the reaction solution was cooled to room temperature, and the residual obtained by evaporating the solvent therefrom was separation-purified by silica gel column chromatography to obtain 5.1 g (yield 90%) of Intermediate I-4. The obtained compound was confirmed by LC-MS. $C_{14}H_7Br_2N$: $M^+$ 346.9

5) Synthesis of Intermediate I-5

5.1 g (14.7 mmol) of Intermediate I-4, 3.6 g (17.6 mmol) of iodobenzene, 0.26 g (1.47 mmol) of 1,10-phenanthroline, 0.56 g (2.94 mmol) of CuI, and 6.09 g (44.1 mmol) of $K_2CO_3$ were dissolved in 60 mL of dimethylformamide (DMF), and then, the mixture was stirred at a temperature of 80° C. for 24 hours. The reaction solution was cooled to room temperature, and then, extracted by using 60 mL of water. A collected organic layer was dried by using magnesium sulfate, and then, the residual obtained by evaporating the solvent therefrom was separation-purified by silica gel column chromatography to obtain 5.0 g (yield 80%) of Intermediate I-5. The obtained compound was confirmed by LC-MS. $C_{20}H_{11}Br_2N$: $M^+$ 422.9.

6) Synthesis of Intermediate I-6

5.0 g (11.7 mmol) of Intermediate I-5 and 1.57 g (17.5 mmol) of CuCN were dissolved in 60 mL of DMF, and then, the mixture was stirred at a temperature of 150° C. for 24 hours. When the reaction solution was cooled to room temperature, 40 mL of ammonia water and 40 mL of water were added thereto, and the resultant solution was extracted three times by using 40 mL of methylenechloride. A collected organic layer was dried by using magnesium sulfate, and then, the residual obtained by evaporating the solvent therefrom was separation-purified by silica gel column chromatography to obtain 2.0 g (yield 47%) of Intermediate I-6. The obtained compound was confirmed by LC-MS. $C_{21}H_{11}BrN_2$: $M^+$ 370.0.

7) Synthesis of Intermediate I-7

2.0 g (5.39 mmol) of Intermediate I-6, 1.19 g (5.92 mmol) of 4-bromophenylboronic acid, 0.31 g (0.27 mmol) of $Pd(PPh_3)_4$, and 2.23 g (16.2 mmol) of $K_2CO_3$ were dissolved in 50 mL of $THF/H_2O$ (at a volumetric ratio of 2/1) mixed solution, and then, the mixture was stirred at a temperature of 80° C. for 12 hours. The reaction solution was cooled to room temperature, and then, the resultant solution was extracted three times by using 40 mL of water and 40 mL of acetate. A collected organic layer was dried by using magnesium sulfate, and then, the residual obtained by evaporating the solvent therefrom was separation-purified by silica gel column chromatography to obtain 1.9 g (yield 78%) of Intermediate I-7. The obtained compound was confirmed by LC-MS. $C_{27}H_{15}BrN_2$: $M^+$ 446.0.

8) Synthesis of Intermediate I-8

1.9 g (4.25 mmol) of Intermediate I-7 was dissolved in 50 mL of THF, and then, at a temperature of −78° C., 1.9 mL (4.67 mmol, 2.5 M in Hexane) of n-BuLi was slowly dropped thereto. At the same temperature, the mixture was stirred for 1 hour, 1.0 mL (5.52 mmol) of 2-isoproxy-4,4,5,5-tetramethyl-1,3,2-dioxaborolane was dropped thereto, and then, at room temperature, the resultant mixture was stirred for 24 hours. When the reaction stopped, 40 mL of water was add thereto, and the resultant solution was extracted three times by using 40 mL of diethylether. A collected organic layer was dried by using magnesium sulfate, and then, the residual obtained by evaporating the solvent therefrom was separation-purified by silica gel column chromatography to obtain 1.64 g (yield 78%) of Intermediate I-8. The obtained compound was confirmed by LC-MS. $C_{33}H_{27}BN_2O_2$: $M^+$ 494.2.

9) Synthesis of Intermediate 7-1

2.71 g (17.2 mmol) of bromobenzene was dissolved in 50 mL of THF, 6.9 mL (17.2 mmol, 2.5M in hexane) of nBuLi was slowly added thereto at a temperature of −78° C., and then, the resultant mixture was stirred for 1 hour. 2.16 g (7.5 mmol) of 2-bromo-4a,9a-dihydro-anthraquinone was slowly dropped to the reaction solution and then, the resultant reaction solution was stirred at room temperature for 12 hours. 50 mL of water was added to the reaction solution, the resultant solution was extracted there times by using 50 mL of ethylacetate, and then, the obtained organic layer was dried by using magnesium sulfate. 11.2 g (67.5 mmol) of KI and 10.6 g (82.5 mmol) of $Na_2H_2PO_2.H_2O$, which had been prepared by dissolving in 40 mL of an acetic acid, were added to the residual obtained by evaporating the solvent therefrom, and then, the resultant solution was stirred at a temperature of 120° C. for 1 hour. The reaction solution was cooled at room temperature, and then, 50 mL of water was added thereto, and filtered. The obtained residual was separation-purified by using silica gel column chromatography to obtain 5.77 g (yield: 82%) of Intermediate 7-1. The obtained compound was confirmed by LC-MS. $C_{26}H_{17}Br$: $M^+$ 408.0.

Synthesis of Compound 7

3.71 g (7.5 mmol) of Intermediate I-8, 3.07 g (7.5 mmol) of Intermediate 7-1, 0.43 g (0.37 mmol) of $Pd(PPh_3)_4$, and 3.11 g (22.5 mmol) of $K_2CO_3$ were dissolved in a 60 mL of THF/$H_2O$ (at a volumetric ratio of 2/1) mixed solution, and then, the mixture was stirred at a temperature of 80° C. for 12 hours. The reaction solution was cooled to room temperature, and then, the resultant solution was extracted three times by using 50 mL of water and 50 mL of acetate. A collected organic layer was dried by using magnesium sulfate, and then, the residual obtained by evaporating the solvent therefrom was separation-purified by silica gel column chromatography to obtain 3.71 g (yield 71%) of Compound 7. The generated compound was confirmed by MS/FAB and $^1H$ NMR. $C_{53}H_{32}N_2$ cal. 696.26. found 696.28.

Synthesis Example 2

Synthesis of Compound 15

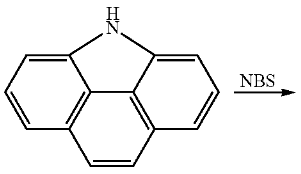

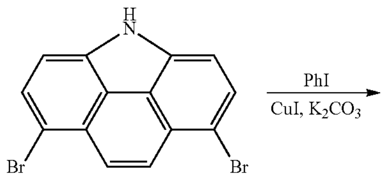

I-9

-continued

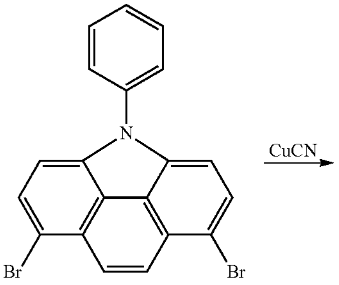

I-10

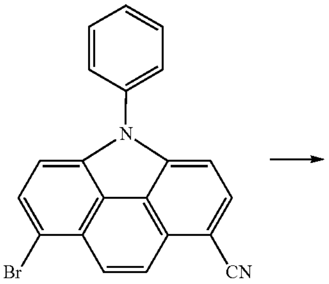

I-11

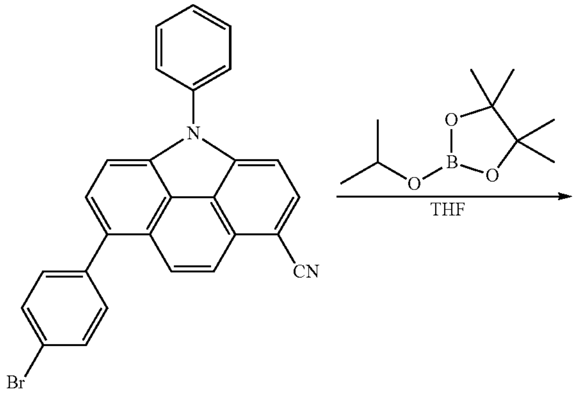

I-12

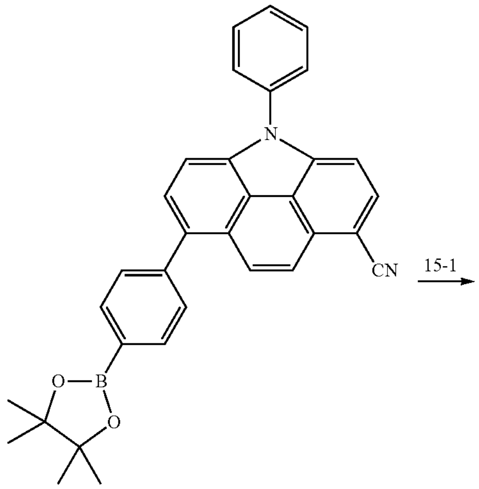

I-13

-continued

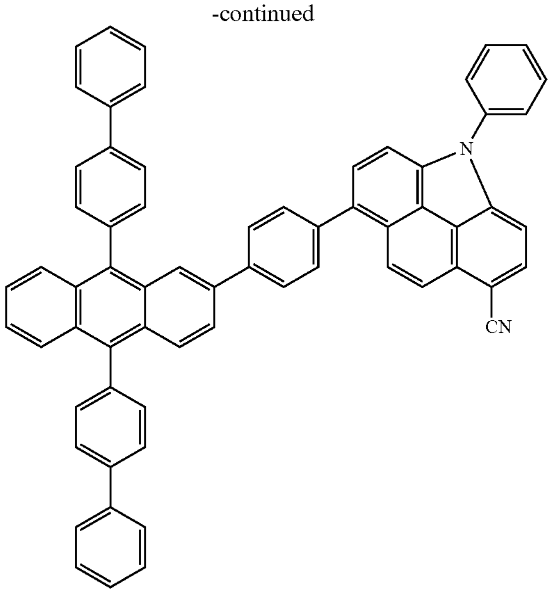

15

15-1

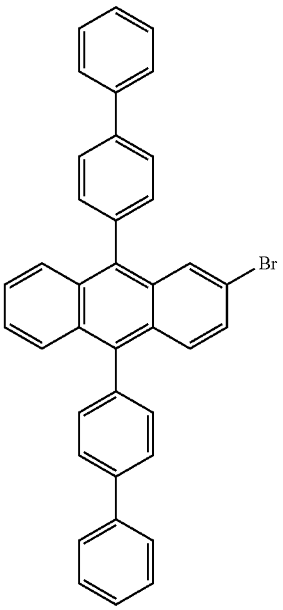

1) Synthesis of Intermediate I-9

9.55 g (50.0 mmol) of 6H-benzo[def]carbazole was completely dissolved in 250 mL of carbon tetrachloride ($CCl_4$), 17.8 g (100.0 mmol) of N-bromosuccinimide was added thereto, and the mixture was stirred at a temperature of 80° C. for 30 minutes. The reaction solution was cooled to room temperature, and then, stirred for 30 minutes to precipitate the crystals. The crystals collected by compression-filter were washed with methanol to obtain 8.55 g (yield 49%) of Intermediate I-9, which was gray crystal. The obtained compound was confirmed by LC-MS. $C_{14}H_7Br_2N$: $M^+$ 346.9.

2) Synthesis of Intermediate I-10

8.23 g (yield 79%) of Intermediate I-10 was obtained in the same manner as used in synthesizing Intermediate I-5, except that Intermediate I-9 was used instead of Intermediate I-4. The obtained compound was confirmed by LC-MS. $C_{20}H_{11}Br_2N$: $M^+$ 422.9.

3) Synthesis of Intermediate I-11

3.3 g (yield 46%) of Intermediate I-11 was obtained in the same manner as used in synthesizing Intermediate I-6, except that Intermediate I-10 was used instead of Intermediate I-5. The obtained compound was confirmed by LC-MS. $C_{21}H_{11}BrN_2$: $M^+$ 370.0.

4) Synthesis of Intermediate I-12

3.15 g (yield 79%) of Intermediate I-12 was obtained in the same manner as used in synthesizing Intermediate I-7, except that Intermediate I-11 was used instead of intermediate 1-6. The obtained compound was confirmed by LC-MS. $C_{27}H_{15}BrN_2$: $M^+$ 446.0.

5) Synthesis of Intermediate I-13

2.68 g (yield 77%) of Intermediate I-13 was obtained in the same manner as used in synthesizing Intermediate I-8, except that Intermediate I-12 was used instead of Intermediate I-7. The obtained compound was confirmed by LC-MS. $C_{33}H_{27}BN_2O_2$: $M^+$ 494.2.

6) Synthesis of Intermediate 15-1

6.95 g (yield: 72%) of Intermediate 15-1 was obtained in the same manner as used to synthesize Intermediate 7-1 in Synthesis Example 1, except that 4-bromobiphenyl was used instead of bromobenzene. The obtained compound was confirmed by LC-MS. $C_{38}H_{25}Br$: $M^+$ 560.1.

Synthesis of Compound 15

5.03 g (yield 79%) of Compound 15 was obtained in the same manner as used to synthesize Compound 7, except that Intermediate I-13 was used instead of Intermediate I-8, and Intermediate 15-1 was used instead of Intermediate 7-1. The generated compound was confirmed by MS/FAB and $^1H$ NMR. $C_{65}H_{40}N_2$ cal. 848.32. found 848.31.

Synthesis Example 3

Synthesis of Compound 18

I-14

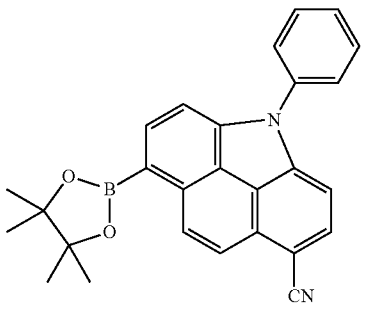

18-1

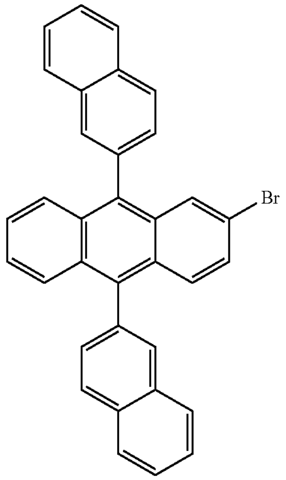

1) Synthesis of Intermediate I-14

2.53 g (yield: 68%) of Intermediate I-14 was obtained in the same manner as used to synthesize Intermediate I-13 in Synthesis Example 2, except that Intermediate I-11 was used instead of Intermediate I-12. The obtained compound was confirmed by LC-MS. $C_{27}H_{23}BN_2O_2$: $M^+$ 418.2.

2) Synthesis of Intermediate 18-1

6.57 g (yield: 75%) of Intermediate 18-1 was obtained in the same manner as used to synthesize Intermediate 7-1 in Synthesis Example 1, except that 2-bromonaphthalene was used instead of bromobenzene. The obtained compound was confirmed by LC-MS. $C_{34}H_{21}Br$: $M^+$ 508.1.

Synthesis of Compound 18

3.68 g (yield 68%) of Compound 18 was obtained in the same manner as used to synthesize Compound 7, except that Intermediate I-14 was used instead of Intermediate I-8, and Intermediate 18-1 was used instead of Intermediate 7-1. The generated compound was confirmed by MS/FAB and $^1H$ NMR. $C_{55}H_{32}N_2$ cal. 720.26. found 720.27.

Synthesis Example 4

Synthesis of Compound 21

4.42 g (yield 74%) of Compound 21 was obtained in the same manner as used to synthesize Compound 7, except that Intermediate I-13 was used instead of Intermediate I-8, and Intermediate 18-1 was used instead of Intermediate 7-1. The generated compound was confirmed by MS/FAB and $^1H$ NMR. $C_{61}H_{36}N_2$ cal. 796.29. found 796.30.

Synthesis Example 5

Synthesis of Compound 27

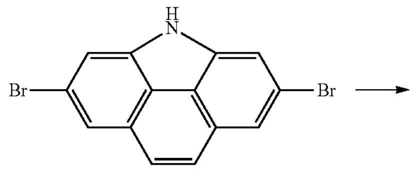

I-4

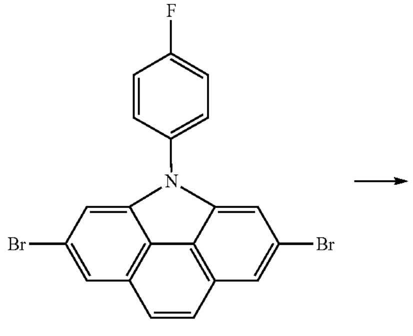

I-15

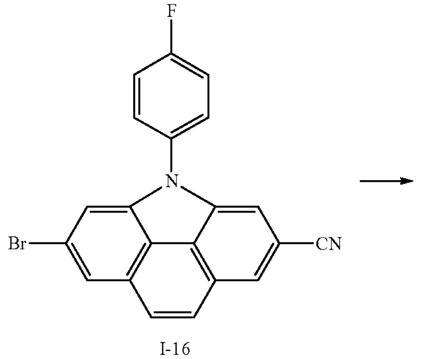

I-16

-continued

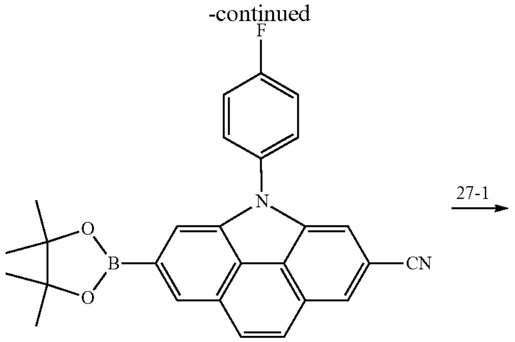

I-17

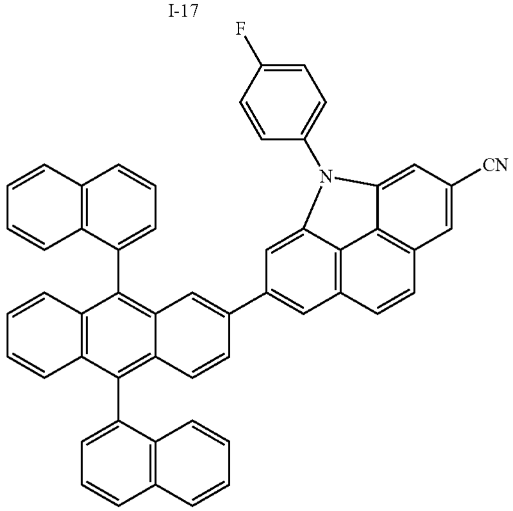

27

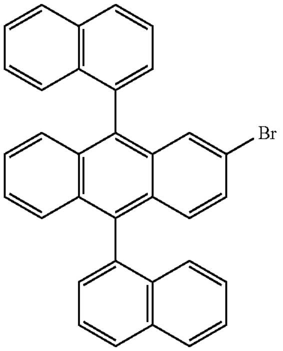

27-1

Synthesis of Intermediate I-15

4.69 g (yield: 72%) of Intermediate I-15 was obtained in the same manner as used to synthesize Intermediate I-5 in Synthesis Example 1, except that 4-fluoroiodobenzene was used instead of iodobenzene. The obtained compound was confirmed by LC-MS. $C_{20}H_{10}Br_2FN$: $M^+$ 440.9.

Synthesis of Intermediate I-16

1.73 g (yield: 42%) of Intermediate I-16 was obtained in the same manner as used to synthesize Intermediate I-6 in Synthesis Example 1, except that Intermediate I-15 was used instead of Intermediate I-5. The obtained compound was confirmed by LC-MS. $C_{21}H_{10}BrFN_2$: $M^+$ 388.0.

Synthesis of Intermediate I-17

1.55 g (yield: 80%) of Intermediate I-17 was obtained in the same manner as used to synthesize Intermediate I-8 in Synthesis Example 1, except that Intermediate I-16 was used instead of Intermediate I-7. The obtained compound was confirmed by LC-MS. $C_{27}H_{22}BFN_2O_2$: $M^+$ 436.2.

4) Synthesis of Intermediate 27-1

6.75 g (yield: 77%) of Intermediate 27-1 was obtained in the same manner as used to synthesize Intermediate 7-1 in Synthesis Example 1, except that 1-bromonaphthalene was used instead of bromobenzene. The obtained compound was confirmed by LC-MS. $C_{34}H_{21}Br$: $M^+$ 508.1.

Synthesis of Compound 27

3.55 g (yield 64%) of Compound 27 was obtained in the same manner as used to synthesize Compound 7, except that Intermediate I-17 was used instead of Intermediate I-8, and Intermediate 27-1 was used instead of Intermediate 7-1. The generated compound was confirmed by MS/FAB and $^1H$ NMR. $C_{55}H_{31}FN_2$ cal. 738.25. found 738.26.

Synthesis Example 6

Synthesis of Compound 35

35-1

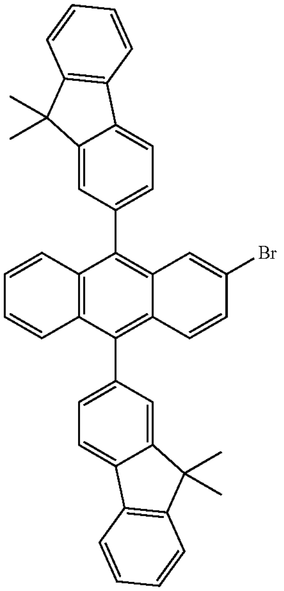

Synthesis of Intermediate 35-1

8.05 g (yield: 73%) of Intermediate 35-1 was obtained in the same manner as used to synthesize Intermediate 7-1 in Synthesis Example 2, except that 2-bromo-9,9-dimethylfluorene was used instead of bromobenzene. The obtained compound was confirmed by LC-MS. $C_{44}H_{33}Br$: $M^+$ 640.2.

Synthesis of Compound 35

3.97 g (yield 62%) of Compound 35 was obtained in the same manner as used to synthesize Compound 7, except that Intermediate I-14 was used instead of Intermediate I-8, and Intermediate 35-1 was used instead of Intermediate 7-1. The generated compound was confirmed by MS/FAB and $^1H$ NMR. $C_{65}H_{44}N_2$ cal. 852.35. found 852.33.

Synthesis Example 7

Synthesis of Compound 45

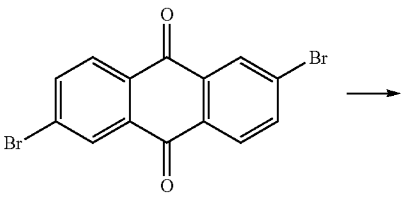

-continued

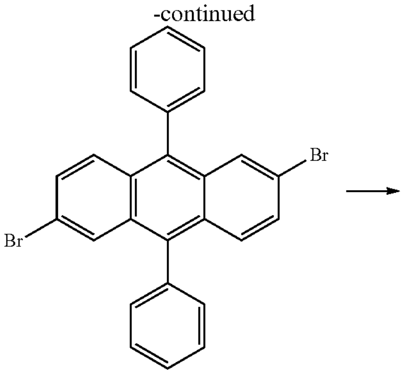

45-1

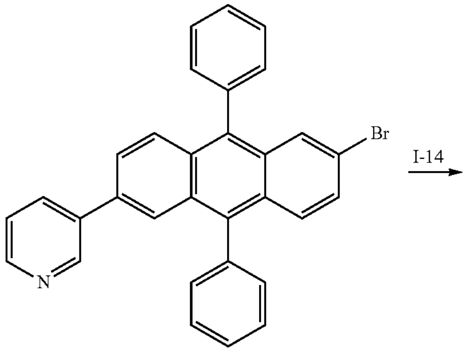

45-2

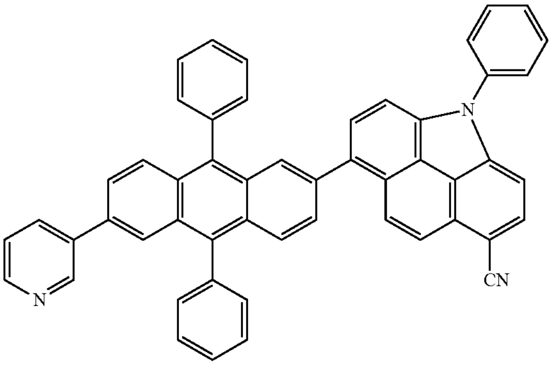

45

1) Synthesis of Intermediate 45-1

5.12 g (yield: 61%) of Intermediate 45-1 was obtained in the same manner as used to synthesize Intermediate 7-1 in Synthesis Example 1, except that 2,6-dibromo-4a,9a-dihydro-anthraquinone was used instead of 2-bromo-4a,9a-dihydro-anthraquinone. The obtained compound was confirmed by LC-MS. $C_{26}H_{16}Br_2$: $M^+$ 485.9.

2) Synthesis of Intermediate 45-2

3.47 g of Intermediate 45-2 (yield: 68%) was synthesized in the same manner as in synthesizing Intermediate I-7 of Synthesis Example 1, except that Intermediate 45-1 was used instead of Intermediate I-6, and 3-pyridinylboronic acid was used instead of 4-bromophenylboronic acid. The obtained compound was confirmed by LC-MS. $C_{31}H_{20}BrN$: $M^+$ 485.1.

Synthesis of Compound 45

3.30 g (yield 63%) of Compound 45 was obtained in the same manner as used to synthesize Compound 7, except that Intermediate I-14 was used instead of Intermediate I-8, and Intermediate 45-2 was used instead of Intermediate 7-1. The generated compound was confirmed by MS/FAB and $^1H$ NMR. $C_{52}H_{31}N_3$ cal. 697.25. found 697.24.

Synthesis Example 8

Synthesis of Compound 50

I-18

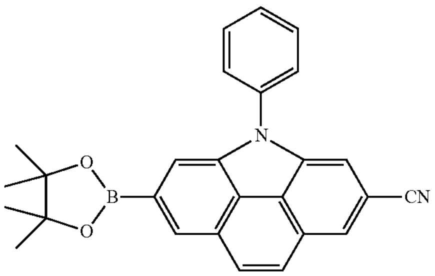

50-1

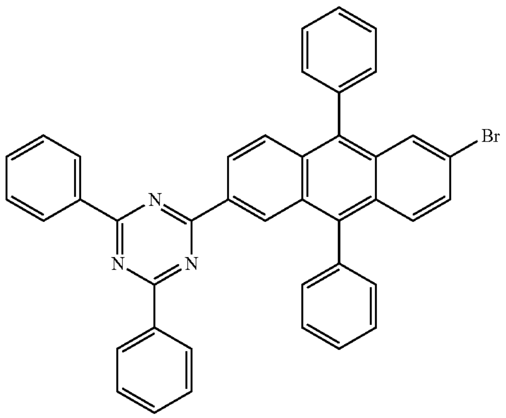

Synthesis of Intermediate I-18

1.65 g (yield: 73%) of Intermediate I-18 was obtained in the same manner as used to synthesize Intermediate I-8 in Synthesis Example 1, except that Intermediate I-6 was used instead of intermediate 1-7. The obtained compound was confirmed by LC-MS. $C_{27}H_{23}BN_2O_2$: $M^+$ 418.2.

Synthesis of Compound 50

3.83 g (yield 60%) of Compound 50 was obtained in the same manner as used to synthesize Compound 7, except that Intermediate I-18 was used instead of Intermediate I-8, and Intermediate 50-1 was used instead of Intermediate 7-1. The generated compound was confirmed by MS/FAB and $^1H$ NMR. $C_{62}H_{37}N_5$ cal. 851.30. found 851.29.

Synthesis Example 9

Synthesis of Compound 64-1

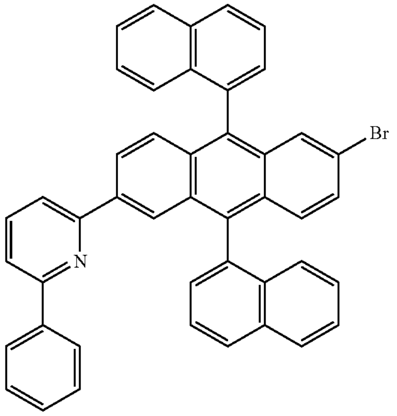

4.26 g (yield 65%) of Compound 64 was obtained in the same manner as used to synthesize Compound 7, except that Intermediate I-18 was used instead of Intermediate I-8, and Intermediate 64-1 was used instead of Intermediate 7-1. The generated compound was confirmed by MS/FAB and $^1H$ NMR. $C_{66}H_{39}N_3$ cal. 873.31. found 873.30.

Synthesis Example 10

Synthesis of Compound 76

76-1

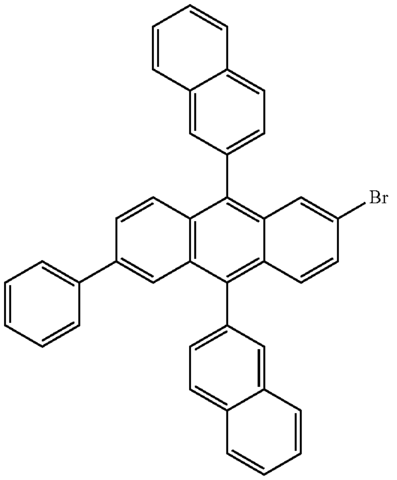

4.58 g (yield 70%) of Compound 76 was obtained in the same manner as used to synthesize Compound 7, except that Intermediate I-13 was used instead of Intermediate I-8, and Intermediate 76-1 was used instead of Intermediate 7-1. The generated compound was confirmed by MS/FAB and $^1H$ NMR. $C_{67}H_{40}N_2$ cal. 872.32. found 872.31.

Synthesis Example 11

Synthesis of Compound 85

6.27 g (15 mmol) of Intermediate I-14, 3.07 g (7.5 mmol) of Intermediate 45-1, 0.43 g (0.37 mmol) of $Pd(PPh_3)_4$, and 3.11 g (22.5 mmol) of $K_2CO_3$ were dissolved in 80 mL of a $THF/H_2O$ (a volumetric ratio of 2/1) mixed solution, and then, the mixture was stirred at a temperature of 80° C. for 12 hours. The reaction solution was cooled to room temperature, and then, the resultant solution was extracted three times by using 60 mL of water and 60 mL of acetate. A collected organic layer was dried by using magnesium sulfate, and then, the residual obtained by evaporating the solvent therefrom was separation-purified by silica gel column chromatography to obtain 4.65 g (yield 68%) of Compound 85. The generated compound was confirmed by MS/FAB and $^1H$ NMR. $C_{68}H_{38}N_4$ cal. 910.31. found 910.33.

Additional compounds were synthesized by using an equivalent synthesis method as described above and appropriate intermediate materials, and $^1H$ NMR and MS/FAB results of the synthetic compounds are shown in Table 1 below.

Methods of synthesizing compounds other than the compounds shown in Table 1 are obvious to one of ordinary skill in the art by referring to the synthesis path and source materials described above.

TABLE 1

| Compound | $^1$H NMR ($CDCl_3$, 400 MHz) | MS/FAB found | MS/FAB calc. |
|---|---|---|---|
| 1 | δ = 8.38-8.37 (m, 1H), 8.13-8.09 (m, 2H), 8.08-8.06 (m, 2H), 8.03 (d, 1H), 7.82-7.80 (dd, 1H), 7.64-7.60 (m, 2H), 7.59-7.56 (m, 2H), 7.51-7.48 (m, 2H), 7.48-7.42 (m, 2H), 7.41-7.35 (m, 2H), 7.30 (d, 1H), 1.64 (s, 9H), 1.61 (s, 9H) | 580.30 | 580.29 |
| 4 | δ = 8.17-8.15 (m, 1H), 8.08-8.06 (m, 2H), 8.00-7.98 (m, 1H), 7.96-7.94 (m, 1H), 7.82-7.81 (m, 1H), 7.80-7.79 (m, 2H), 7.78-7.77 (m, 1H), 7.76-7.75 (m, 1H), 7.71-7.69 (m, 1H), 7.57-7.48 (m, 9H), 7.47-7.46 (m, 1H), 7.44-7.43 (m, 1H), 7.41-7.40 (m, 1H), 7.38-7.28 (m, 5H) | 620.22 | 620.23 |
| 7 | δ = 8.09-8.08 (m, 1H), 8.07-8.06 (m, 1H), 8.05-8.04 (m, 1H), 8.03-8.01 (m, 2H), 7.95-7.94 (m, 1H), 7.89-7.88 (m, 1H), 7.86-7.85 (m, 1H), 7.82-7.81 (m, 1H), 7.80-7.77 (m, 4H), 7.71-7.67 (m, 2H), 7.65-7.62 (m, 2H), 7.60-7.54 (m, 3H), 7.51-7.46 (m, 6H), 7.41-7.39 (m, 2H), 7.37-7.29 (m, 4H) | 696.28 | 696.26 |
| 10 | δ = 8.55-8.54 (dd, 1H), 8.53-8.52 (dd, 1H), 8.30-8.29 (dd, 1H), 8.15-8.13 (m, 1H), 8.09-8.08 (m, 1H), 8.06-8.01 (m, 3H), 7.96-7.94 (m, 1H), 7.82-7.78 (m, 4H), 7.71-7.69 (dd, 1H), 7.62-7.48 (m, 11H), 7.41-7.29 (m, 6H) | 697.26 | 697.25 |
| 15 | δ = 8.08-8.06 (m, 1H), 7.98-7.97 (m, 1H), 7.95-7.92 (m, 2H), 7.87-7.85 (m, 1H), 7.84-7.76 (m, 8H), 7.74-7.71 (m, 5H), 7.67-7.65 (m, 2H), 7.62-7.61 (m, 1H), 7.60-7.58 (m, 3H), 7.54-7.47 (m, 10H), 7.42-7.30 (m, 6H) | 848.31 | 848.32 |
| 18 | δ = 8.31-8.30 (m, 1H), 8.17-8.15 (m, 1H), 8.08-8.06 (m, 2H), 8.03-8.01 (m, 1H), 8.00-7.98 (m, 1H), 7.96-7.95 (m, 1H), 7.94-7.92 (m, 5H), 7.90-7.88 (m, 3H), 7.77-7.74 (m, 2H), 7.71-7.68 (m, 1H), 7.60-7.53 (m, 6H), 7.52-7.49 (m, 3H), 7.46-7.43 (m, 2H), 7.41-7.33 (m, 3H) | 720.27 | 720.26 |
| 21 | δ = 8.08-8.07 (m, 1H), 8.06-8.05 (m, 2H), 8.00-7.98 (m, 1H), 7.96-7.94 (m, 1H), 7.93-7.92 (m, 5H), 7.91-7.89 (m, 4H), 7.87-7.85 (m, 1H), 7.83-7.79 (m, 3H), 7.76-7.74 (m, 1H), 7.71-7.67 (m, 2H), 7.65-7.64 (m, 1H), 7.61-7.58 (m, 3H), 7.56-7.47 (m, 7H), 7.43-7.41 (m, 1H), 7.40-7.33 (m, 3H) | 796.30 | 796.29 |
| 27 | δ = 8.51-8.50 (m, 1H), 8.38-8.36 (dd, 1H), 8.18-8.17 (m, 2H), 8.08-8.07 (m, 1H), 7.99-7.98 (m, 1H), 7.90-7.87 (m, 1H), 7.84-7.80 (m, 4H), 7.72-7.69 (m, 4H), 7.64-7.62 (m, 1H), 7.59-7.58 (m, 1H), 7.52-7.50 (dd, 1H), 7.46-7.44 (m, 1H), 7.38-7.30 (m, 8H), 7.21-7.15 (m, 2H), 7.04-7.00 (m, 2H) | 738.26 | 738.25 |
| 32 | δ = 8.39-8.37 (dd, 1H), 8.19-8.17 (m, 1H), 8.13-8.12 (m, 1H), 8.08-8.01 (m, 2H), 7.86-7.81 (m, 5H), 7.76-7.69 (m, 6H), 7.61-7.48 (m, 10H), 7.46-7.43 (m, 2H), 7.41-7.31 (m, 6H), 7.05-7.01 (m, 2H) | 796.31 | 796.29 |
| 35 | δ = 8.13-8.12 (m, 1H), 8.10-8.06 (m, 2H), 8.03-8.01 (m, 1H), 7.94-7.90 (m, 5H), 7.85-7.79 (m, 4H), 7.77-7.69 (m, 3H), 7.56-7.49 (m, 5H), 7.46-7.41 (m, 2H), 7.40-7.31 (m, 5H), 7.17-7.11 (m, 4H), 1.61 (s, 12H) | 852.33 | 852.35 |
| 39 | δ = 8.08-8.06 (m, 1H), 7.96-7.90 (m, 7H), 7.87-7.85 (m, 2H), 7.83-7.79 (m, 6H), 7.76-7.75 (m, 1H), 7.74-7.73 (m, 1H), 7.71-7.65 (m, 2H), 7.49-7.45 (m, 5H), 7.43-7.41 (m, 1H), 7.38-7.31 (m, 5H), 7.16-7.09 (m, 4H), 1.61 (s, 12H) | 953.39 | 953.38 |
| 45 | δ = 8.62-8.61 (m, 1H), 8.39-8.37 (m, 1H), 8.19-8.12 (m, 3H), 8.09-8.06 (m, 2H), 8.03-7.94 (m, 3H), 7.90-7.88 (m, 1H), 7.82-7.80 (m, 4H), 7.77-7.75 (m, 1H), 7.55-7.46 (m, 10H), 7.41-7.36 (m, 5H) | 697.24 | 697.25 |
| 48 | δ = 8.45-8.44 (m, 1H), 8.37-8.35 (m, 2H), 8.29-8.27 (dd, 1H), 8.19-8.17 (m, 2H), 8.09-8.08 (m, 1H), 8.04-8.02 (m, 3H), 8.01-8.00 (m, 1H), 7.89-7.85 (m, 2H), 7.82-7.80 (m, 4H), 7.73-7.70 (m, 2H), 7.67-7.65 (m, 1H), 7.62-7.58 (m, 3H), 7.53-7.47 (m, 6H), 7.41-7.35 (m, 5H) | 774.30 | 774.28 |
| 50 | δ = 8.51-8.50 (m, 1H), 8.45-8.44 (m, 2H), 8.43-8.42 (m, 2H), 8.40 (d, 1H), 8.31-8.29 (dd, 1H), 8.19-8.18 (m, 1H), 8.09-8.08 (m, 1H), 8.03-8.01 (m, 2H), 7.88-7.86 (m, 1H), 7.83-7.80 (m, 4H), 7.67-7.58 (m, 8H), 7.53-7.47 (m, 6H), 7.42-7.35 (m, 7H) | 851.29 | 851.30 |
| 53 | δ = 8.25-8.23 (m, 1H), 8.19-8.17 (m, 1H), 8.09-8.08 (m, 2H), 8.07-8.06 (m, 2H), 8.04-8.03 (dd, 1H), 8.01-7.99 (m, 1H), 7.97-7.96 (m, 2H), 7.95-7.94 (m, 1H), 7.92-7.89 (m, 9H), 7.87-7.83 (m, 2H), 7.73-7.71 (m, 1H), 7.64-7.62 (m, 2H), 7.60-7.57 (m, 6H), 7.54-7.53 (m, 1H), 7.52-7.47 (m, 3H), 7.40-7.35 (m, 3H) | 846.31 | 846.30 |

TABLE 1-continued

| Compound | $^1H$ NMR ($CDCl_3$, 400 MHz) | MS/FAB found | MS/FAB calc. |
|---|---|---|---|
| 58 | δ = 8.53-8.52 (m, 1H), 8.41-8.39 (m, 1H), 8.33 (d, 1H), 8.31 (d, 1H), 8.26-8.24 (m, 1H), 8.21-8.19 (m, 2H), 8.09-8.07 (m, 2H), 8.04-8.03 (m, 1H), 7.95-7.89 (m, 4H), 7.84-7.82 (m, 2H), 7.71-7.68 (m, 4H), 7.63-7.57 (m, 5H), 7.50-7.47 (m, 3H), 7.40-7.34 (m, 5H), 7.05-7.01 (m, 2H) | 797.30 | 797.28 |
| 64 | δ = 8.57-8.56 (m, 1H), 8.42-8.41 (m, 1H), 8.39-8.38 (m, 1H), 8.36 (d, 1H), 8.30-8.28 (m, 1H), 8.21-8.19 (m, 2H), 8.14-8.11 (m, 2H), 8.09-8.08 (m, 1H), 8.04-8.03 (m, 1H), 7.92-7.89 (m, 2H), 7.84-7.80 (m, 2H), 7.78-7.77 (m, 1H), 7.73-7.66 (m, 6H), 7.62-7.57 (m, 5H), 7.51-7.47 (m, 4H), 7.42-7.34 (m, 6H), 7.04-7.00 (m, 2H) | 873.30 | 873.31 |
| 66 | δ = 8.41 (d, 1H), 8.39 (d, 1H), 8.30 (d, 1H), 8.28 (d, 1H), 8.18-8.17 (m, 1H), 8.08-8.04 (m, 2H), 7.97-7.96 (m, 1H), 7.95-7.94 (m, 1H), 7.87-7.84 (m, 2H), 7.82-7.79 (m, 2H), 7.77-7.75 (m, 1H), 7.72-7.66 (m, 6H), 7.59-7.48 (m, 9H), 7.46-7.41 (m, 2H), 7.40-7.32 (m, 3H), 7.26-7.21 (m, 1H), 7.04-6.98 (m, 3H) | 846.29 | 846.30 |
| 69 | δ = 8.19-8.18 (m, 1H), 8.09-8.08 (m, 1H), 8.03 (d, 1H), 7.95-7.94 (m, 2H), 7.92-7.91 (m, 1H), 7.89-7.88 (m, 3H), 7.85 (d, 1H), 7.83-7.81 (m, 4H), 7.80-7.79 (m, 1H), 7.77-7.74 (m, 2H), 7.64-7.58 (m, 3H), 7.51-7.47 (m, 5H), 7.43-7.31 (m, 7H), 7.16-7.09 (m, 4H), 1.62 (s, 12H) | 928.39 | 928.38 |
| 76 | δ = 8.13-8.12 (m, 1H), 8.08-8.06 (m, 3H), 8.01-8.00 (m, 1H), 7.97-7.96 (m, 1H), 7.95-7.94 (m, 2H), 7.93-7.92 (m, 4H), 7.90-7.89 (m, 3H), 7.84-7.80 (m, 5H), 7.77-7.74 (m, 2H), 7.67-7.65 (m, 1H), 7.63-7.61 (m, 2H), 7.60-7.58 (m, 3H), 7.56-7.53 (m, 2H), 7.52-7.47 (m, 7H), 7.43-7.35 (m, 3H) | 872.31 | 872.32 |
| 80 | δ = 8.38-8.37 (m, 2H), 8.10-8.08 (m, 4H), 8.04-8.03 (m, 2H), 7.82 (d, 1H), 7.80 (d, 1H), 7.65-7.64 (m, 1H), 7.63-7.62 (m, 2H), 7.61-7.60 (m, 3H), 7.59-7.58 (m, 2H), 7.51-7.47 (m, 4H), 7.40-7.35 (m, 4H), 7.30 (d, 2H), 1.59 (s, 18H) | 870.38 | 870.37 |
| 85 | δ = 8.19 (d, 1H), 8.17 (d, 1H), 8.12-8.11 (m, 2H), 8.08-8.06 (m, 2H), 8.03 (d, 1H), 8.01 (d, 1H), 7.94-7.94 (m, 2H), 7.84-7.82 (m, 2H), 7.81-7.80 (m, 2H), 7.77-7.75 (m, 2H), 7.56-7.55 (m, 3H), 7.54-7.48 (m, 12H), 7.46 (s, 1H), 7.44-7.43 (m, 2H), 7.41 (t, 2H), 7.40-7.39 (m, 1H), 7.38-7.35 (m, 1H) | 910.30 | 910.31 |
| 88 | δ = 8.41 (d, 1H), 8.39 (d, 1H), 8.22-8.21 (m, 1H), 8.20-8.18 (m, 3H), 8.09-8.07 (m, 2H), 8.03 (d, 2H), 7.92 (d, 1H), 7.90-7.88 (m, 3H), 7.84-7.82 (m, 2H), 7.72-7.68 (m, 4H), 7.64-7.57 (m, 8H), 7.51-7.47 (m, 4H), 7.40-7.32 (m, 8H), 7.05-7.00 (m, 2H) | 1010.35 | 1010.34 |
| 92 | δ = 8.44-8.42 (m, 1H), 8.33-8.32 (m, 1H), 8.19-8.18 (m, 1H), 8.09-8.08 (m, 2H), 8.03 (d, 1H), 7.99-7.98 (m, 1H), 7.97-7.95 (m, 1H), 7.89-7.86 (m, 1H), 7.85-7.79 (m, 4H), 7.73-7.68 (m, 5H), 7.64-7.58 (m, 3H), 7.55-7.47 (m, 4H), 7.40-7.31 (m, 7H) | 800.24 | 800.25 |
| 98 | δ = 8.61-8.59 (m, 1H), 8.54-8.53 (m, 1H), 8.12-8.09 (m, 3H), 8.08-8.05 (m, 3H), 8.01 (d, 1H), 7.99 (d, 1H), 7.97-7.93 (m, 2H), 7.85-7.78 (m, 8H), 7.69-7.65 (m, 2H), 7.57-7.48 (m, 8H), 7.46-7.33 (m, 6H) | 908.25 | 908.23 |
| 100 | δ = 8.38-8.36 (dd, 1H), 8.32-8.31 (m, 1H), 8.08-8.05 (m, 3H), 8.03-8.01 (dd, 1H), 7.99-7.97 (m, 1H), 7.96-7.89 (m, 6H), 7.77-7.75 (m, 1H), 7.68-7.67 (m, 1H), 7.66-7.65 (m, 1H), 7.56-7.47 (m, 8H), 7.46-7.44 (m, 2H), 7.41 (s, 1H), 7.39-7.35 (m, 3H), 7.33-7.29 (m, 2H) | 800.26 | 800.25 |

Example 1

An anode was prepared by cutting a Corning 15 $\Omega cm^2$ (1200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and exposing to ozone to clean. Then, the anode was loaded into a vacuum deposition apparatus.

2-TNATA, which is a suitable hole injection material, was vacuum deposited on the substrate to form an HIL having a thickness of 600 Å, and then, 4,4'-bis[N-(1-naphthyl)-N-phenylamino]biphenyl (NPB), which is a suitable hole transport compound, was vacuum deposited thereon to form an HTL having a thickness of 300 Å.

9,10-di-naphthalene-2-yl-anthracene (ADN), which is a suitable blue fluorescent host, and 4,4'-bis[2-(4-(N,N-diphenylamino)phenyl)vinyl]biphenyl (DPAVBi), which is a suitable blue fluorescent dopant, were co-deposited on the HTL at a weight ratio of 98:2 to form an emission layer having a thickness of 300 Å to form an EML.

Then, Compound 7 was deposited on the EML to form an ETL having a thickness of 300 Å, and then, LiF, which is a halogenated alkali metal, was deposited on the ETL to form an EIL having a thickness of 10 Å, and Al was vacuum deposited thereon to a thickness of 3000 Å (cathode), thereby forming an LiF/Al electrode, thereby completing the manufacturing of an organic light-emitting device.

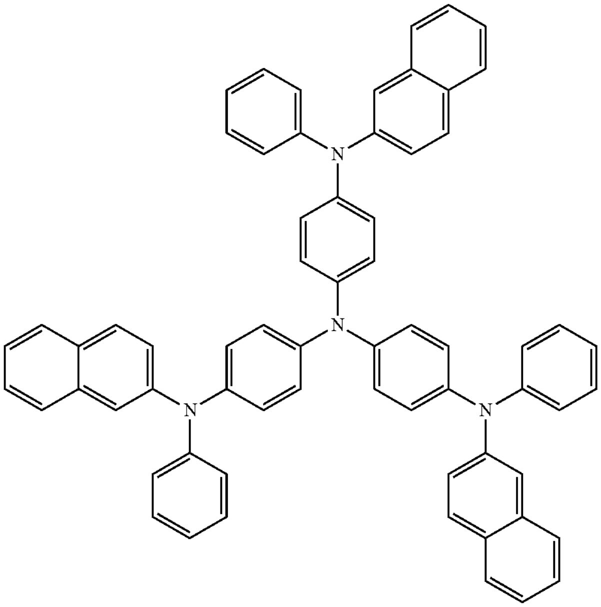

2-TNATA

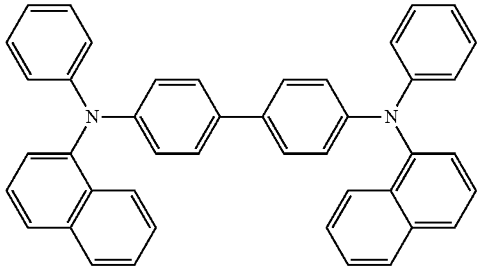

NPB

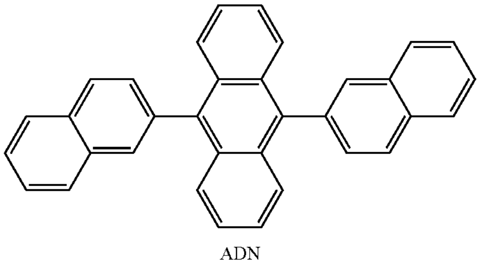

ADN

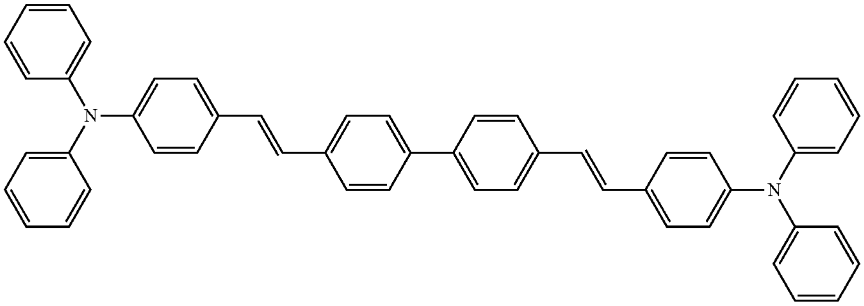

DPAVBi

Example 2

An organic light-emitting device was manufactured in the same manner as in Example 1, except that in forming the ETL, Compound 15 was used instead of Compound 7.

Example 3

An organic light-emitting device was manufactured in the same manner as in Example 1, except that in forming the ETL, Compound 18 was used instead of Compound 7.

Example 4

An organic light-emitting device was manufactured in the same manner as in Example 1, except that in forming the ETL, Compound 21 was used instead of Compound 7.

Example 5

An organic light-emitting device was manufactured in the same manner as in Example 1, except that in forming the ETL, Compound 27 was used instead of Compound 7.

Example 6

An organic light-emitting device was manufactured in the same manner as in Example 1, except that in forming the ETL, Compound 35 was used instead of Compound 7.

Example 7

An organic light-emitting device was manufactured in the same manner as in Example 1, except that in forming the ETL, Compound 45 was used instead of Compound 7.

Example 8

An organic light-emitting device was manufactured in the same manner as in Example 1, except that in forming the ETL, Compound 50 was used instead of Compound 7.

Example 9

An organic light-emitting device was manufactured in the same manner as in Example 1, except that in forming the ETL, Compound 64 was used instead of Compound 7.

Example 10

An organic light-emitting device was manufactured in the same manner as in Example 1, except that in forming the ETL, Compound 76 was used instead of Compound 7.

Example 11

An organic light-emitting device was manufactured in the same manner as in Example 1, except that in forming the ETL, Compound 85 was used instead of Compound 7.

Comparative Example 1

An organic light-emitting device was manufactured in the same manner as in Example 1, except that in forming the ETL, $Alq_3$, which is a suitable electron transport material, was used instead of Compound 7.

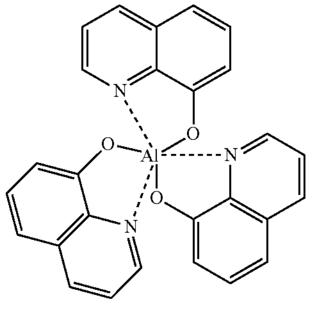

$Alq_3$

Comparative Example 2

An organic light-emitting device was manufactured in the same manner as in Example 1, except that in forming the ETL, Compound A was used instead of Compound 7.

Compound A

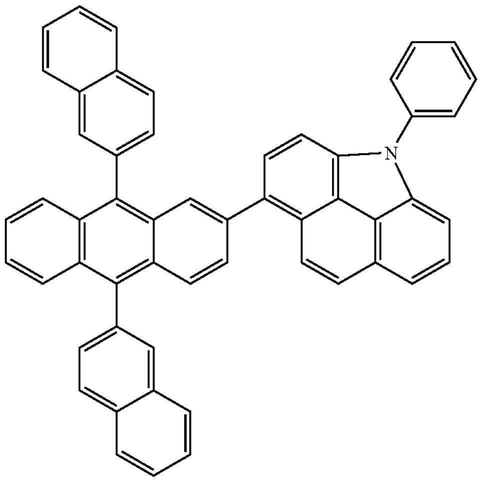

Heterocyclic compounds having the structures of Formulae 1 and 2 were used as an electron transport material in manufacturing organic light-emitting devices. When such heterocyclic compounds were used, compared to the comparable material Alq3, the driving voltage was lowered by 1 V or more, efficiency was substantially improved, and excellent I-V-L characteristics were obtained. In particular, long lifespan was obtained. Such results show that heterocyclic compounds including a heteroaryl group having a cyano group has excellent electron transport characteristics. Table 2 shows the results of driving voltage, current density, brightness, efficiency and lifespan of the Examples and Comparative Examples.

TABLE 2

| | Electron transport material | Driving voltage (V) | Current density ($mA/cm^2$) | Brightness ($cd/m^2$) | Efficiency (cd/A) | Emission color | Half lifespan (hr @100 $mA/cm^2$) |
|---|---|---|---|---|---|---|---|
| Example 1 | Compound 7 | 5.80 | 50 | 3,035 | 6.07 | Blue | 325 hr |
| Example 2 | Compound 15 | 5.42 | 50 | 3,055 | 6.11 | Blue | 407 hr |
| Example 3 | Compound 18 | 5.45 | 50 | 3,005 | 6.01 | Blue | 411 hr |
| Example 4 | Compound 21 | 5.38 | 50 | 3,160 | 6.32 | Blue | 425 hr |
| Example 5 | Compound 27 | 5.16 | 50 | 3,150 | 6.30 | Blue | 397 hr |
| Example 6 | Compound 35 | 5.41 | 50 | 3,070 | 6.14 | Blue | 389 hr |
| Example 7 | Compound 45 | 5.16 | 50 | 3,105 | 6.21 | Blue | 376 hr |
| Example 8 | Compound 50 | 5.51 | 50 | 3,130 | 6.26 | Blue | 417 hr |
| Example 9 | Compound 64 | 5.15 | 50 | 3,080 | 6.16 | Blue | 383 hr |
| Example 10 | Compound 76 | 5.95 | 50 | 3,070 | 6.14 | Blue | 414 hr |
| Example 11 | Compound 85 | 5.78 | 50 | 3,115 | 6.23 | Blue | 401 hr |
| Comparative Example 1 | $Alq_3$ | 7.11 | 50 | 2,275 | 4.55 | Blue | 168 hr |
| Comparative Example 2 | Compound A | 6.76 | 50 | 2,355 | 4.71 | Blue | 192 hr |

Organic light-emitting devices manufactured according to the Examples had a lower driving voltage, improved efficiency, and better lifespan characteristics than organic light-emitting devices according to the Comparative Examples.

A compound represented by Formula 1 or Formula 2 according to an embodiment of the present invention is suitable for use as an electron injection material or an electron transport material, and an organic light-emitting device including the compound has high efficiency, low voltage, high brightness, and a long lifespan.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the drawing, it will be understood by those of ordinary skill in the art that various changes in form and details may be made therein without departing from the spirit and scope of the present invention as defined by the following claims, and equivalents thereof.

What is claimed is:

1. A heterocyclic compound represented by Formula 1 or Formula 2 below:

Formula 1

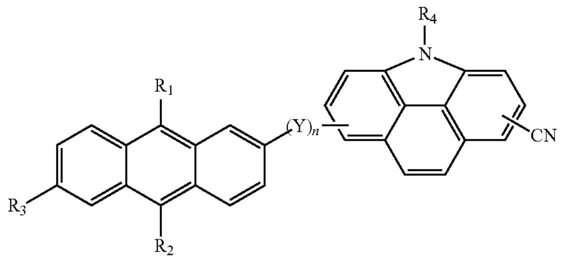

Formula 2

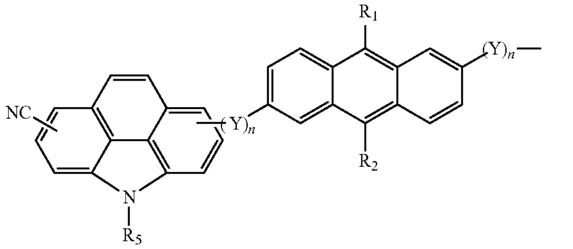

-continued

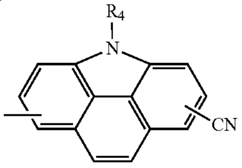

wherein in Formulae 1 and 2, $R_1$ to $R_5$ are each independently a hydrogen, a deuterium, a substituted or unsubstituted C1 to C60 alkyl group, a substituted or unsubstituted C2 to C60 alkenyl group, a substituted or unsubstituted C2 to C60 alkynyl group, a substituted or unsubstituted C3 to C60 cycloalkyl group, a substituted or unsubstituted C3 to C60 cycloalkenyl group, a substituted or unsubstituted C5 to C60 cycloalkynyl group, a substituted or unsubstituted C6 to C60 aryl group, a substituted or unsubstituted C2 to C60 heteroaryl group excluding a substituted or unsubstituted benzoimidazol group, or a substituted or unsubstituted C6 to C60 arylamino group;

Y is a substituted or unsubstituted C6 to C60 arylene group, or a substituted or unsubstituted C2 to C60 heteroarylene group; and n is 0 or 1.

2. The heterocyclic compound of claim 1, wherein $R_1$ and $R_2$ are each independently a substituted or unsubstituted C1 to C20 alkyl group or one of Formulae 2a to 2c:

2a

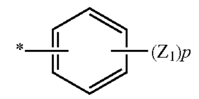

2b

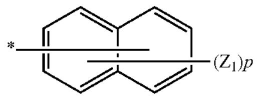

2c

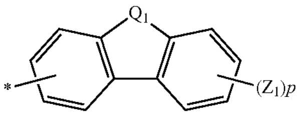

wherein in Formulae 2a to 2c, $Q_1$ is —$CR_{51}R_{52}$—, —O—, or —S—;

$R_{51}$, $R_{52}$, and $Z_1$ are each independently a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they are identical or different;

p is an integer of 1 to 5 in Formula 2a; an integer of 1 to 7 in Formula 2b; and an integer of 1 to 4 in Formula 2c; and

* indicates a binding site.

3. The heterocyclic compound of claim 1, wherein $R_3$ in Formula 1 is a hydrogen, a deuterium, or any one of Formulae 3a to 3f below:

3a

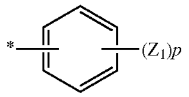

3b

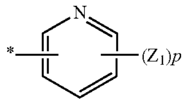

3c

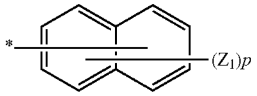

3d

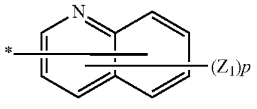

3e

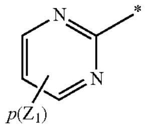

3f

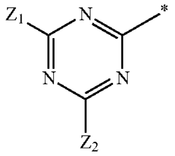

wherein in Formulae 3a to 3f, $Z_1$ and $Z_2$ are each independently a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they are identical or different;

p is an integer of 1 to 5 in Formula 3a; an integer of 1 to 4 in Formula 3b; an integer of 1 to 7 in Formula 3c; an integer of 1 to 6 in Formula 3d; and an integer of 1 to 3 in Formula 3e; and

* indicates a binding site.

4. The heterocyclic compound of claim 1, wherein $R_4$ and $R_5$ in Formulae 1 and 2 are each independently one of Formulae 4a to 4b:

4a

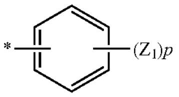

4b

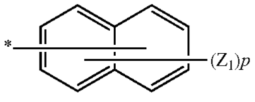

wherein in Formulae 4a and 4b, $Z_1$ is a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they are identical or different;

p is an integer of 1 to 5 in Formula 4a; and an integer of 1 to 7 in Formula 4b; and

* indicates a binding site.

5. The heterocyclic compound of claim 1, wherein

Y in Formula 1 and Formula 2 is any one of Formulae 5a to 5c below:

5a

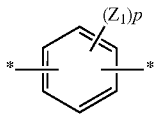

5b

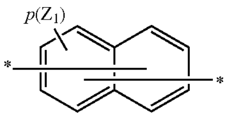

5c

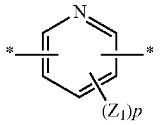

wherein in Formulae 5a to 5c, $Z_1$ is a hydrogen, a deuterium, a substituted or unsubstituted C1 to C20 alkyl group, a substituted or unsubstituted C6 to C20 aryl group, a substituted or unsubstituted C2 to C20 heteroaryl group, a substituted or unsubstituted C6 to C20 condensed polycyclic group, a halogen group, a cyano group, a nitro group, a hydroxyl group, or a carboxyl group, wherein when $Z_1$ is two or more, they are identical or different;

p is an integer of 1 to 4 in Formula 5a; an integer of 1 to 6 in Formula 5b; and an integer of 1 to 3 in Formula 5c; and

* indicates a binding site.

6. The heterocyclic compound of claim 1, wherein

The heterocyclic compounds represented by Formula 1 and Formula 2 are electron injection or electron transport materials for an organic light-emitting device.

7. The heterocyclic compound of claim 1, wherein the heterocyclic compound is represented by Formula 2, and $R_4$ and $R_5$ in Formula 2 are identical.

8. The heterocyclic compound of claim 1, wherein $R_1$ and $R_2$ in Formula 1 and Formula 2 are each independently a phenyl group, a naphthyl group, a phenanthryl group, a biphenyl group, a fluorophenyl group, a cyano phenyl group, or a fluorenyl group.

9. The heterocyclic compound of claim 1, wherein the heterocyclic compound is any one of the compounds below:

1

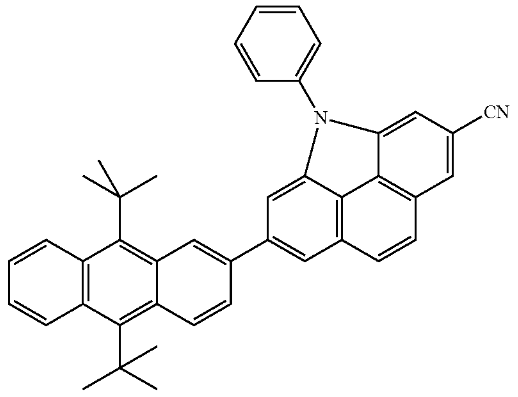

2

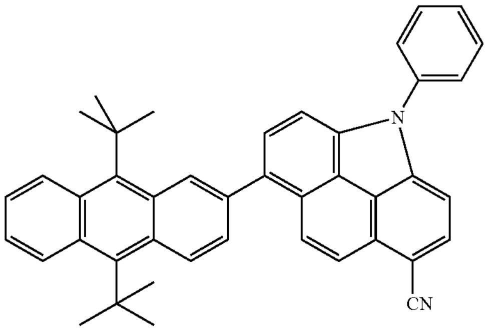

3

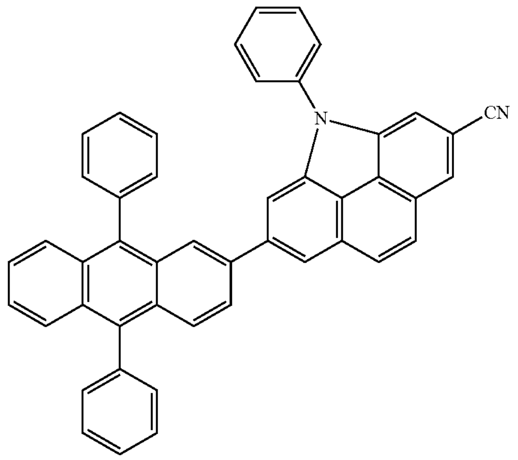

4

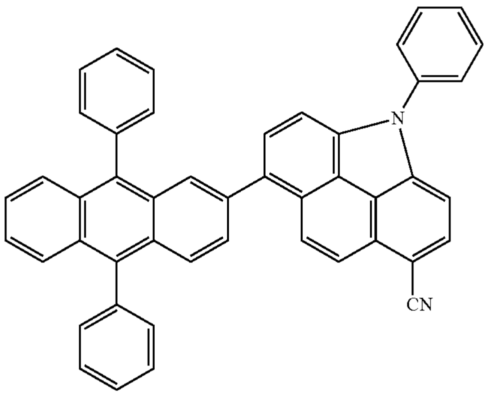

5

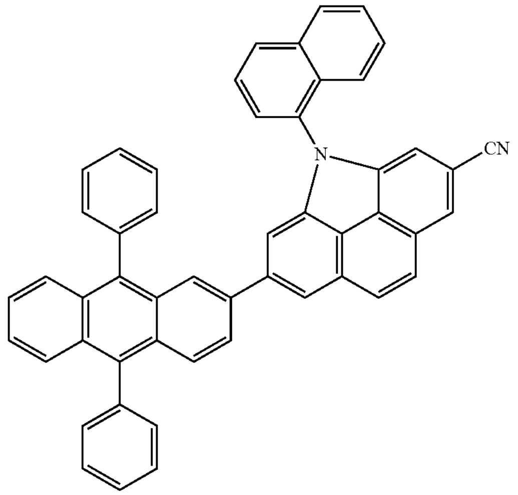

6

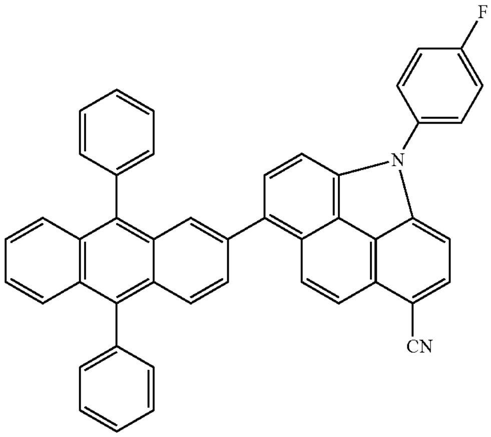

-continued
7
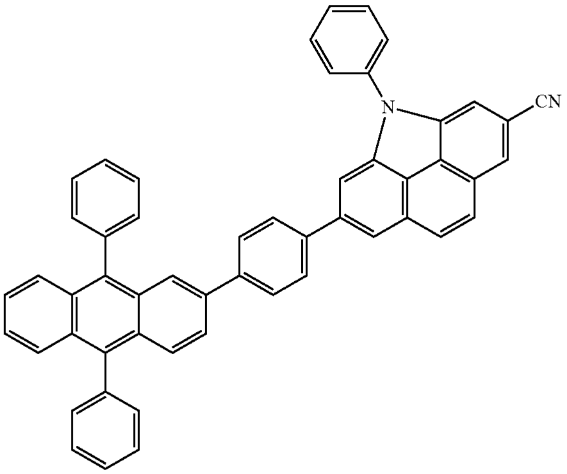
8
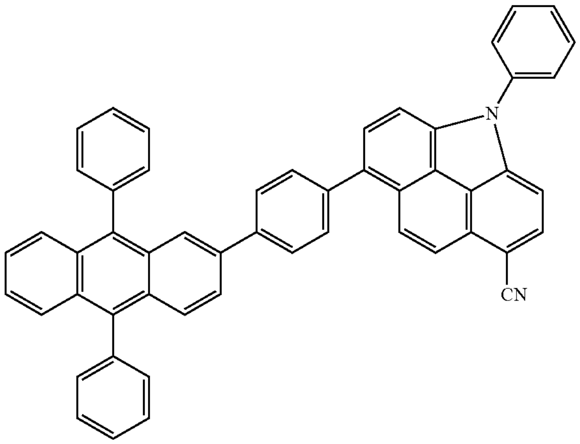
9
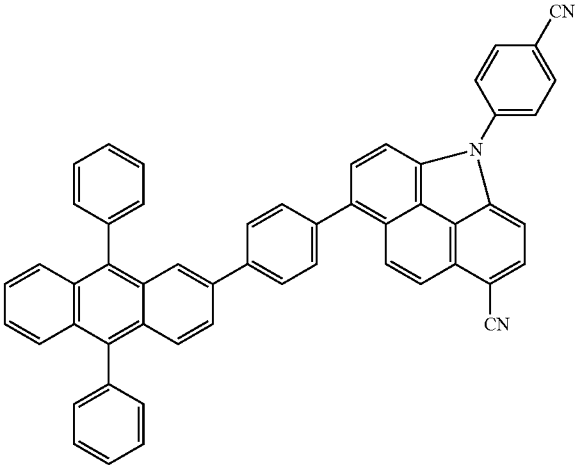
10
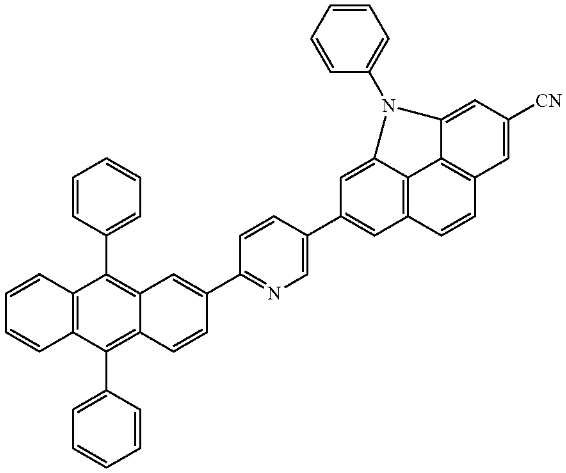
11
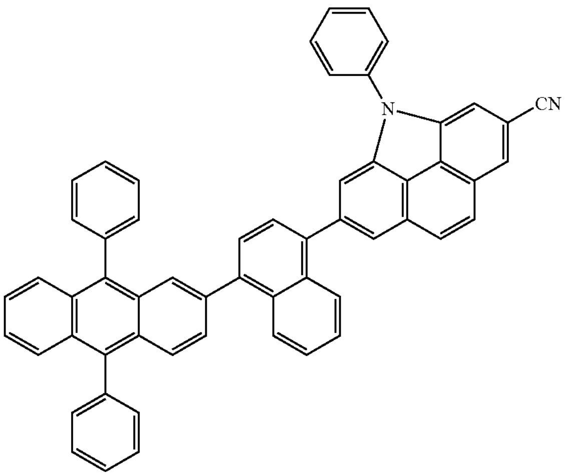
12
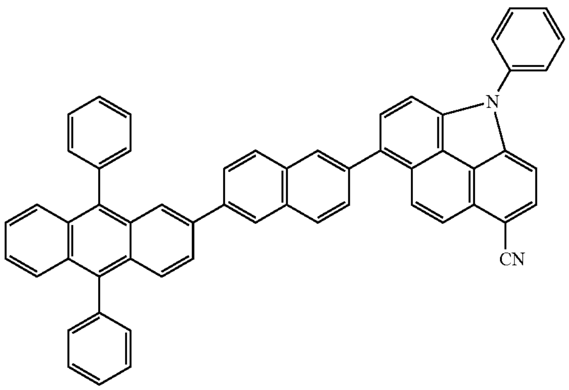

-continued
13
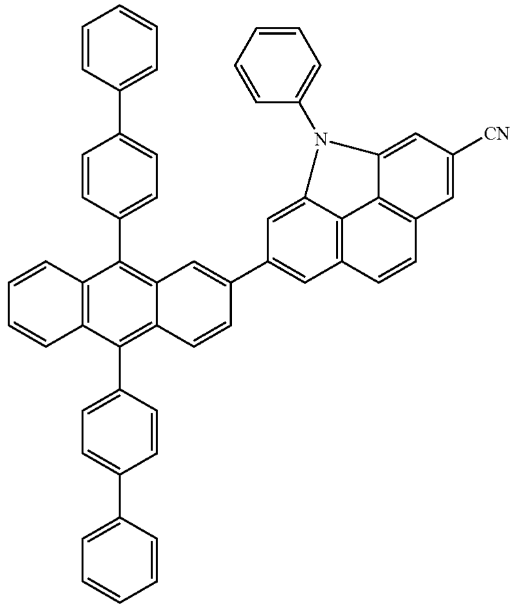
14
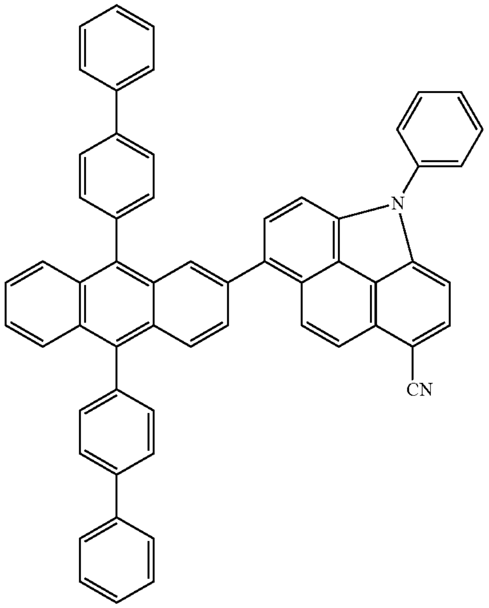
15
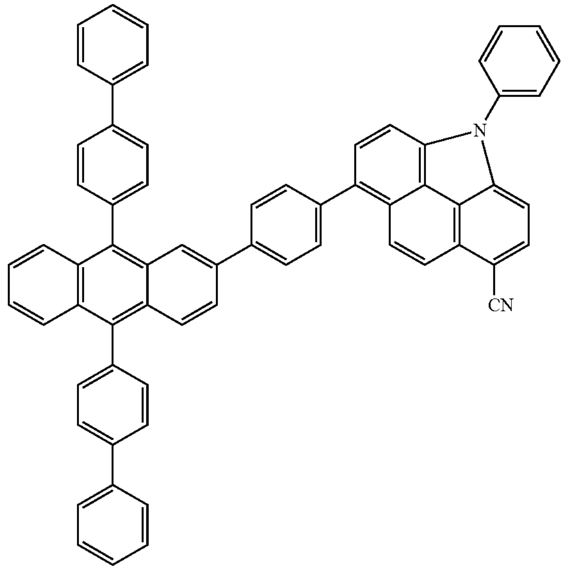
16
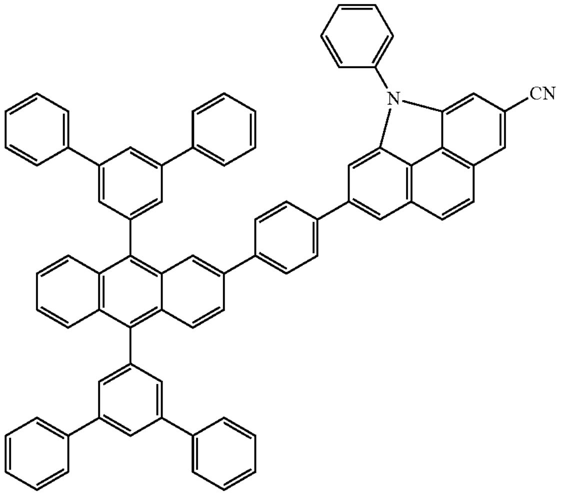

-continued
17
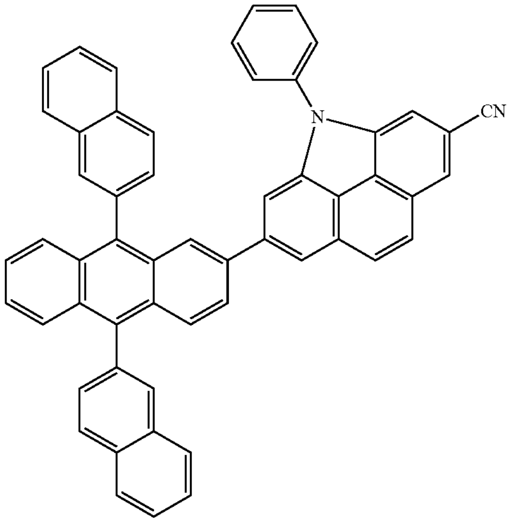
18
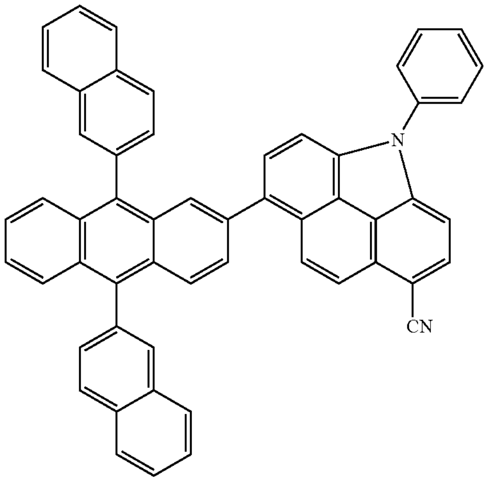
19
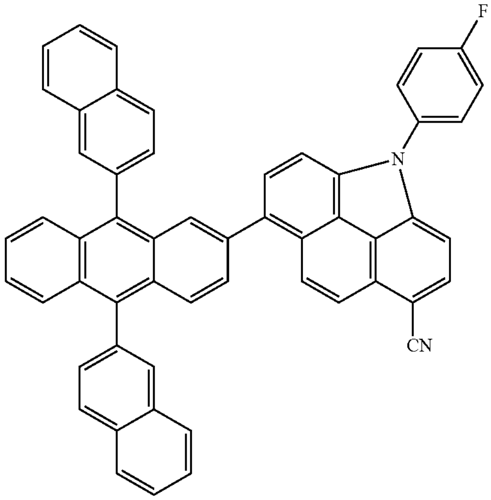
20
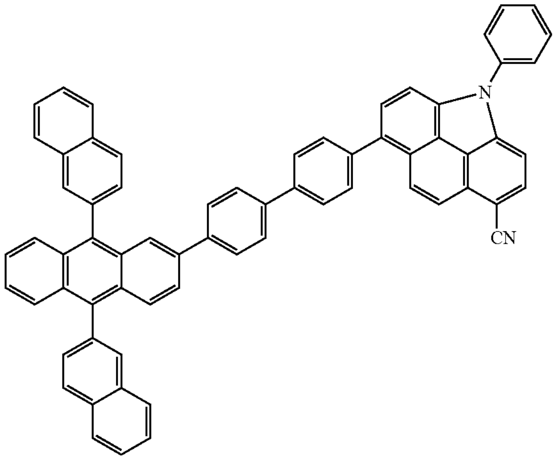
21
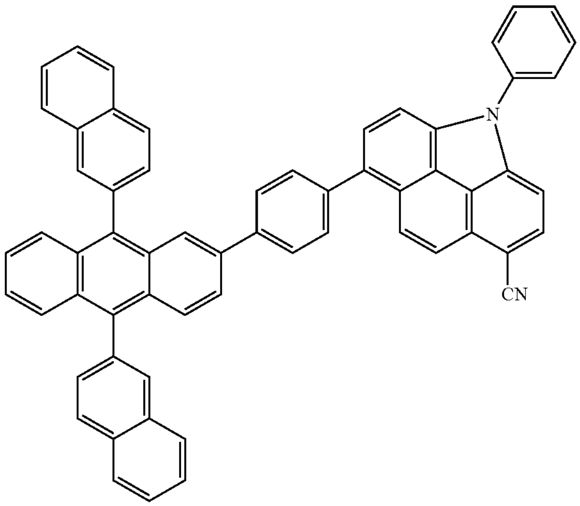
22
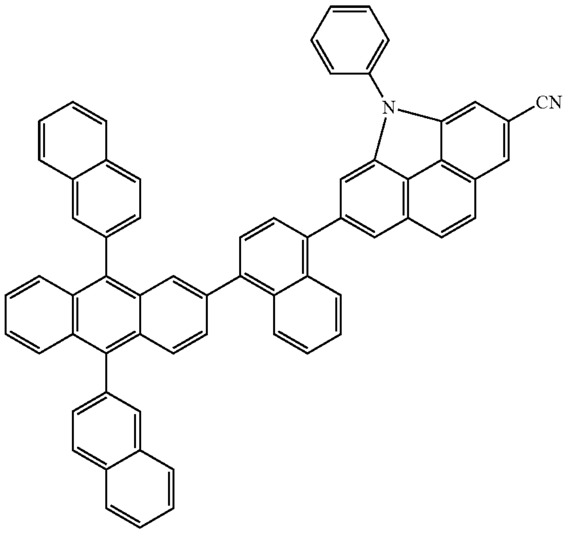

-continued
23
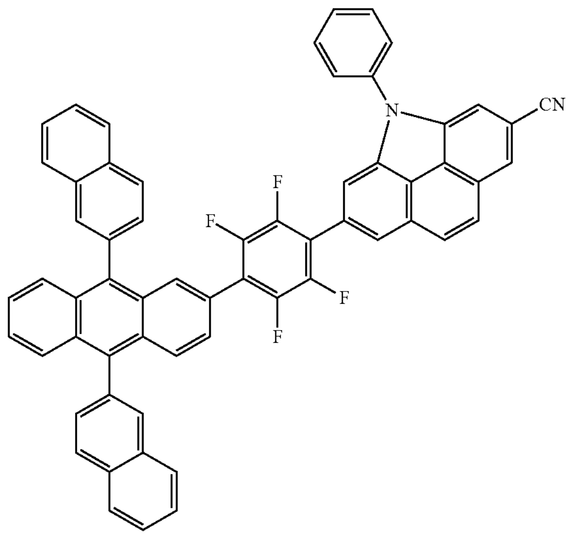
24
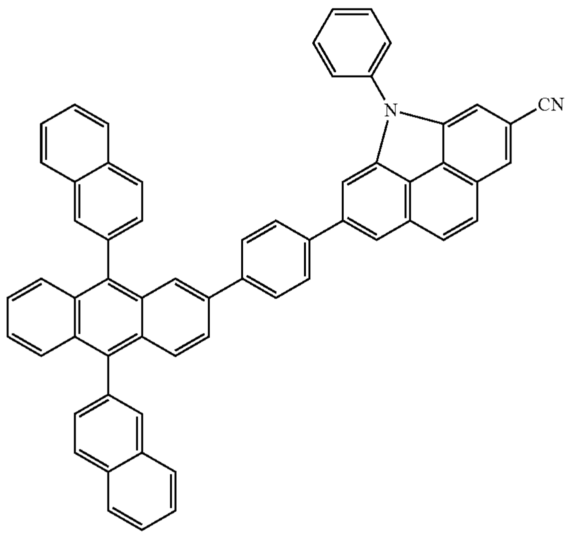
25
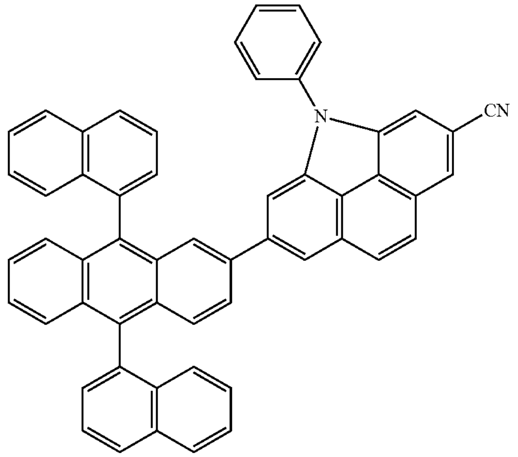
26
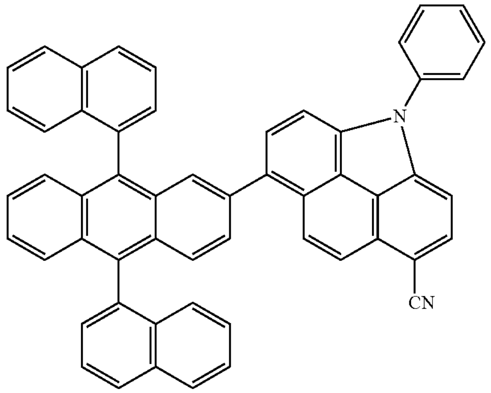
27
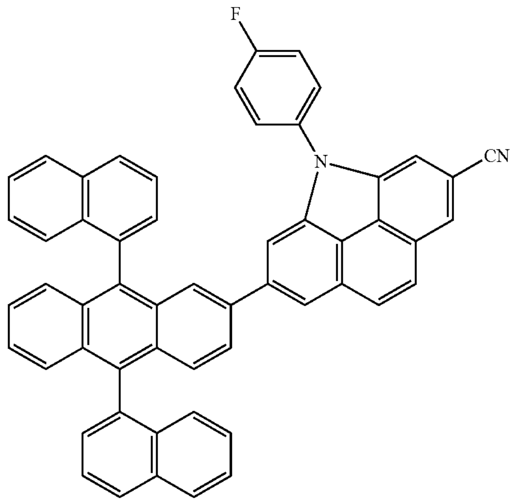
28
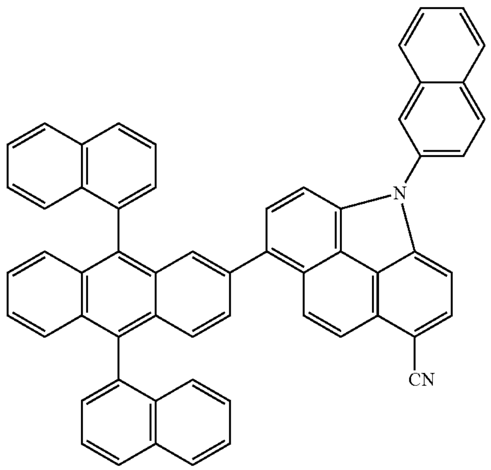

-continued
29
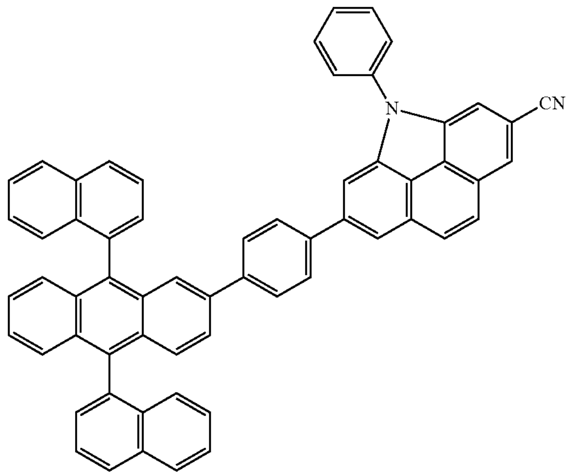
30
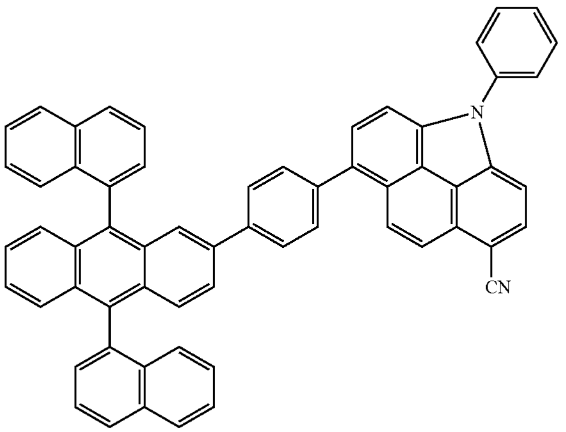
31
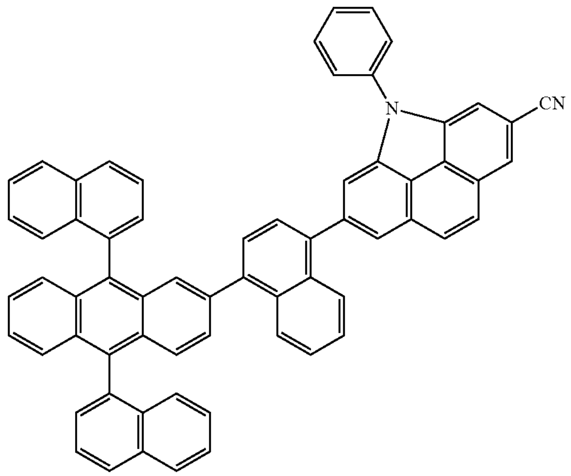
32
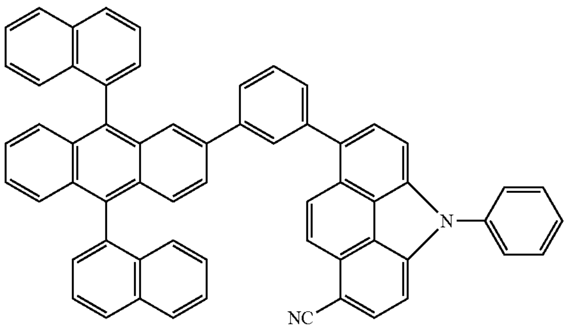
33
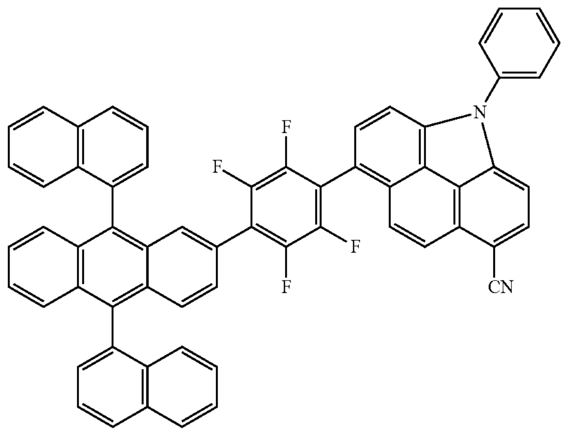
34
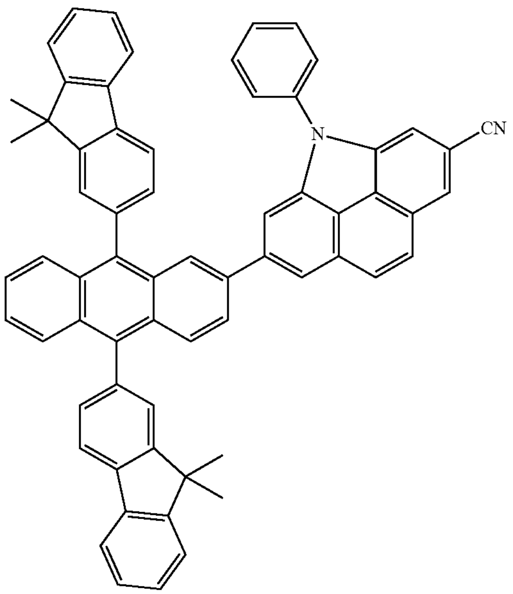

-continued
35
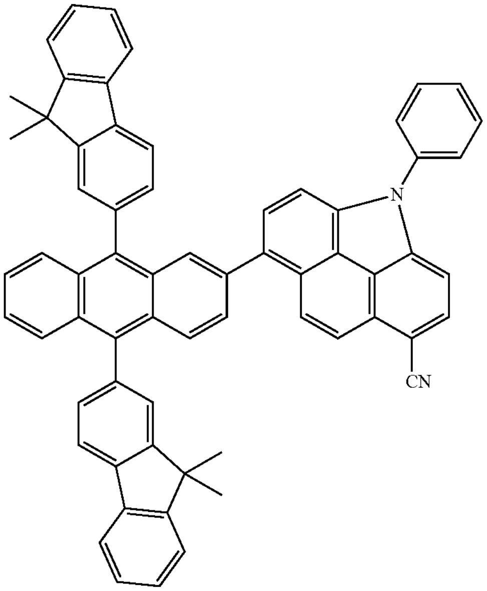
36
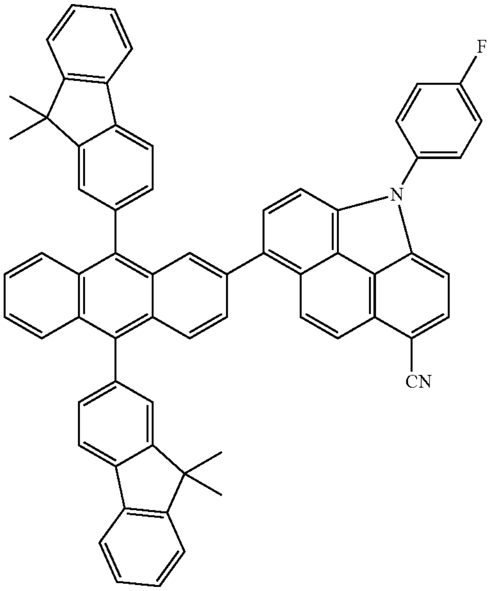
37
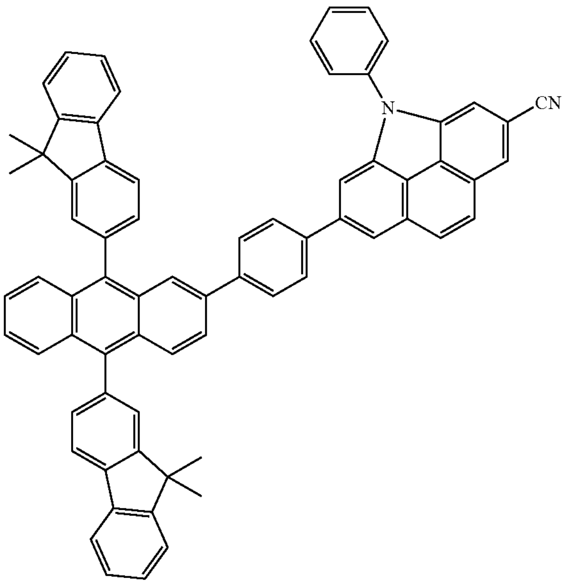
38
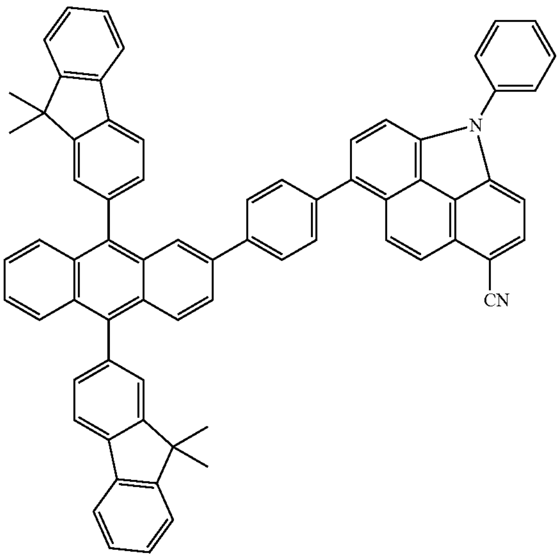

-continued
39
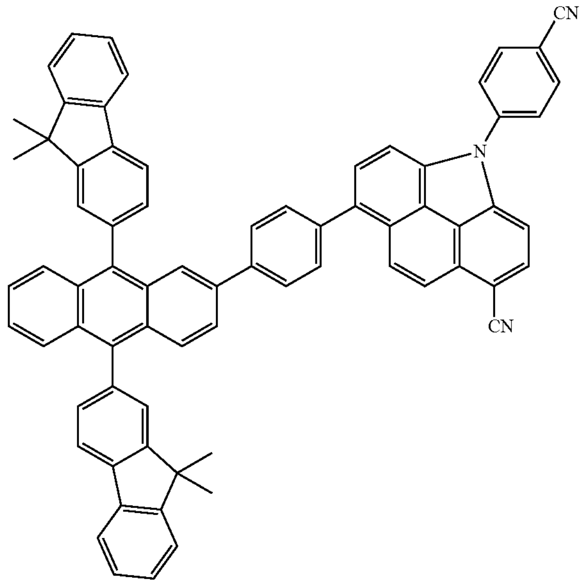
40
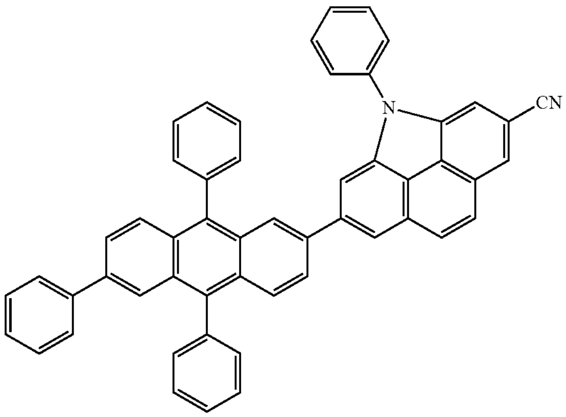
41
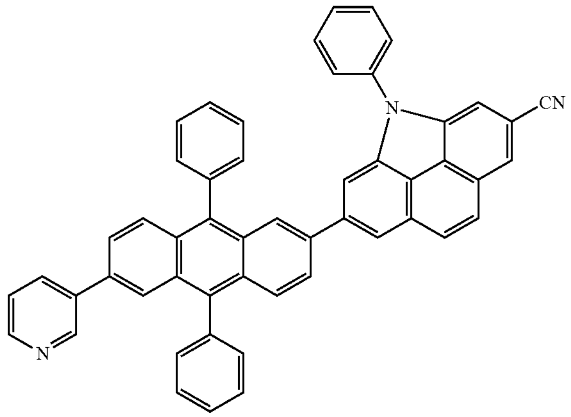
42
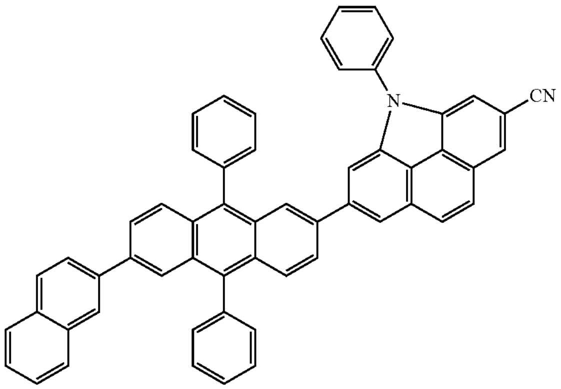
43
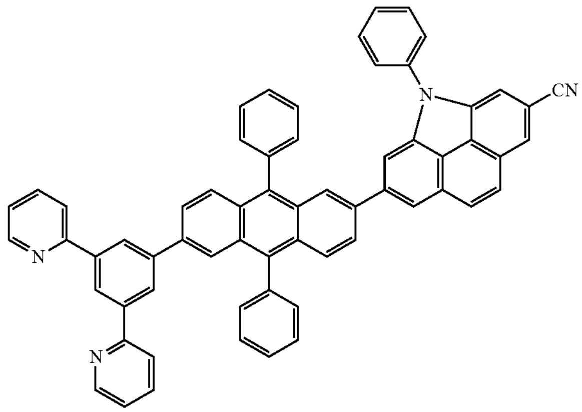
44
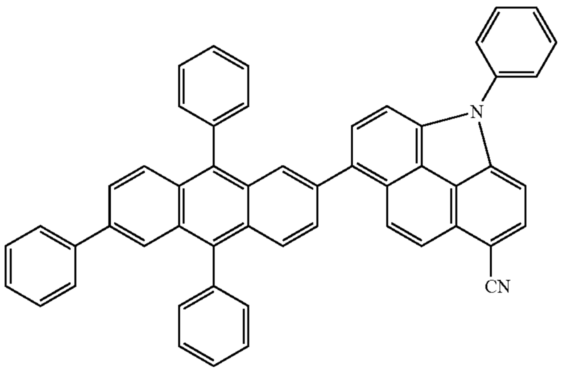

-continued
45
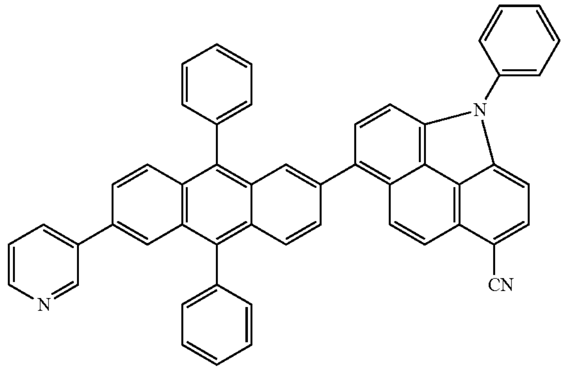
46
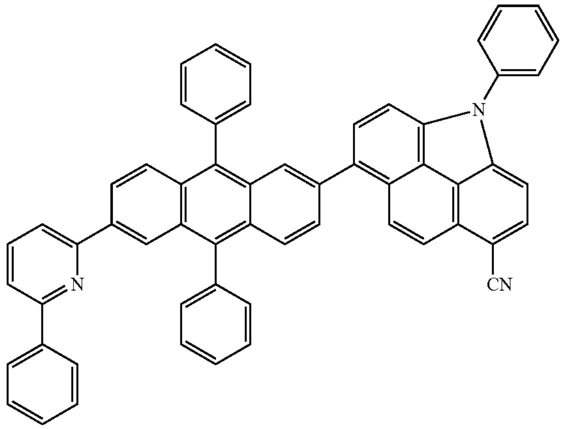
47
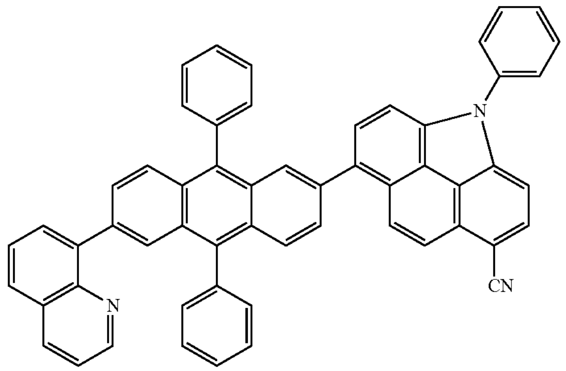
48
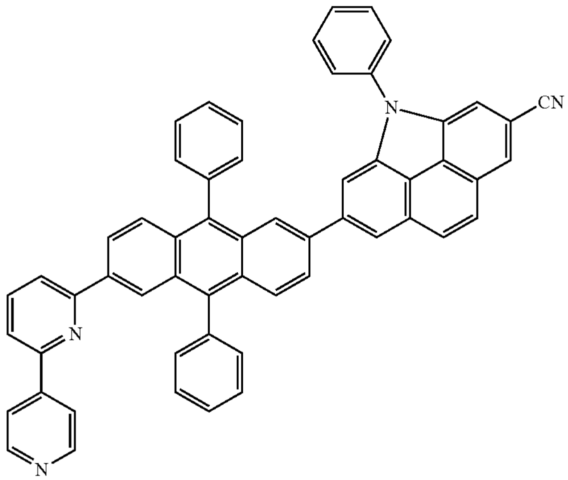
49
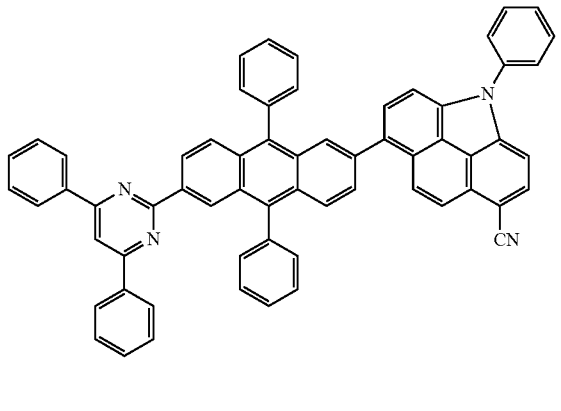
50
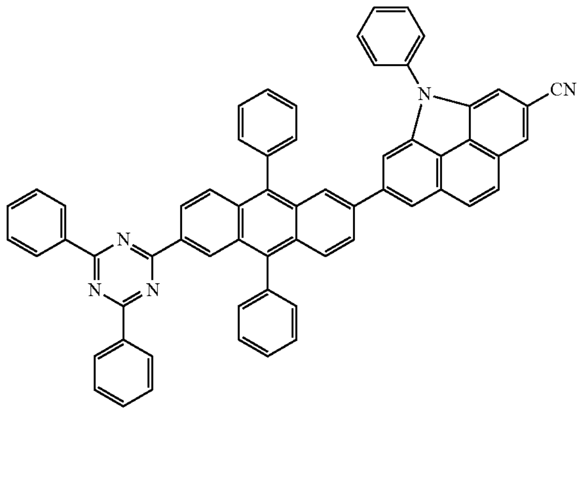

-continued
51
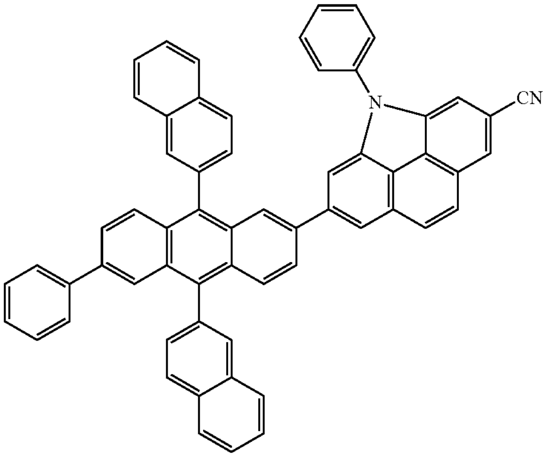
52
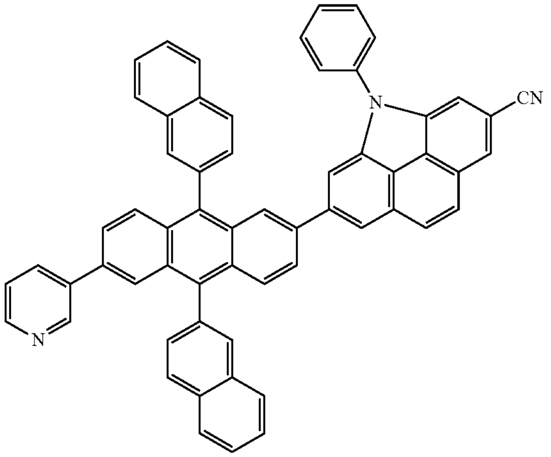
53
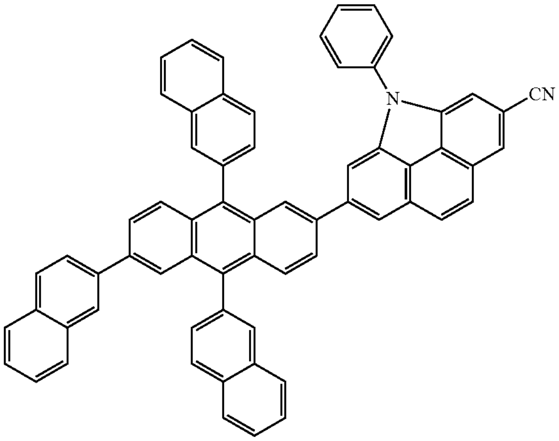
54
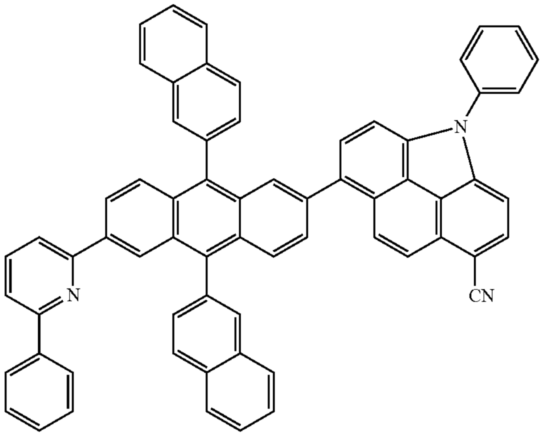
55
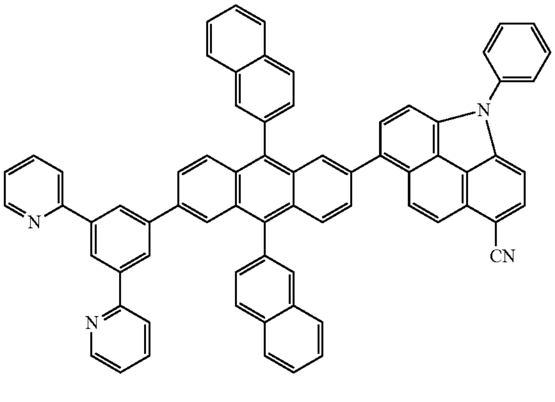
56
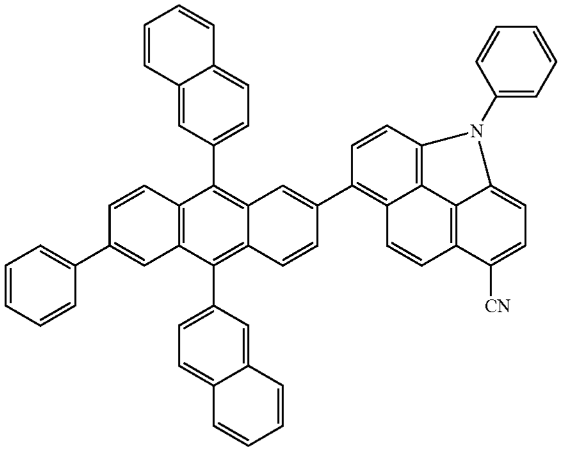

-continued
57
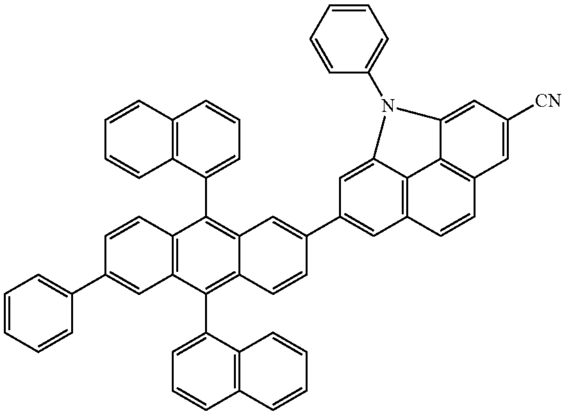
58
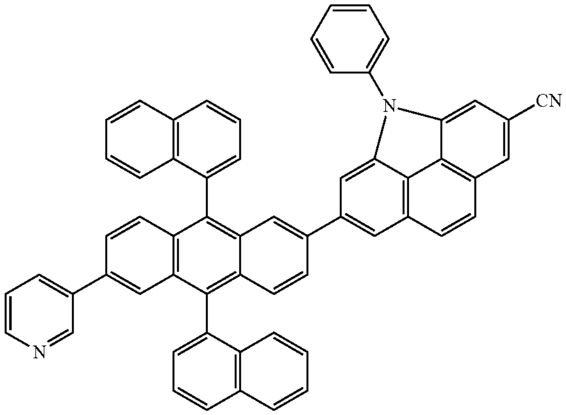
59
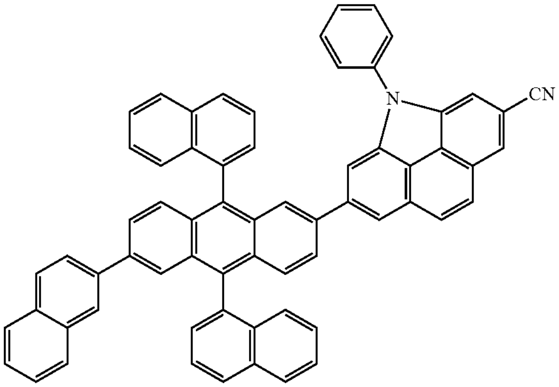
60
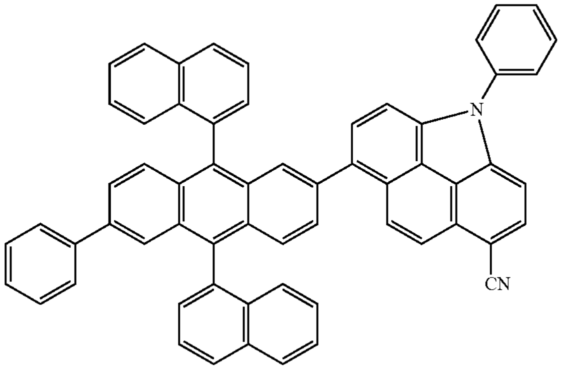
61
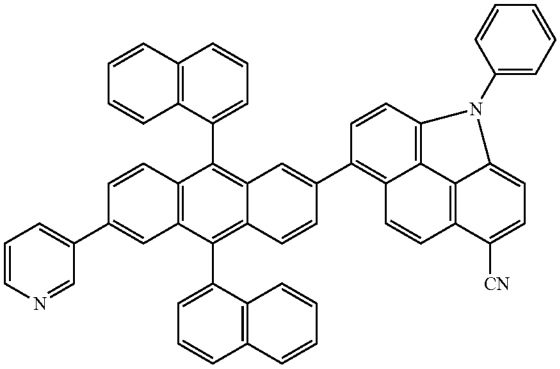
62
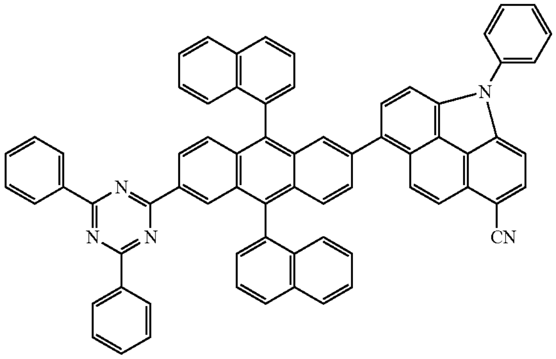

-continued
63
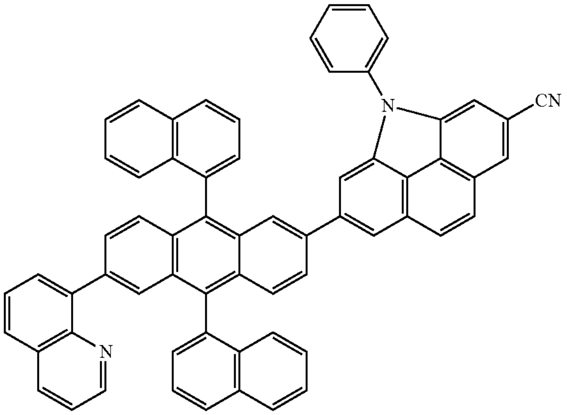
64
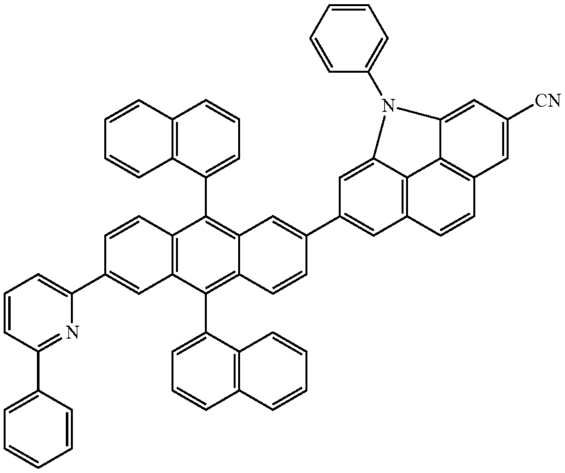
65
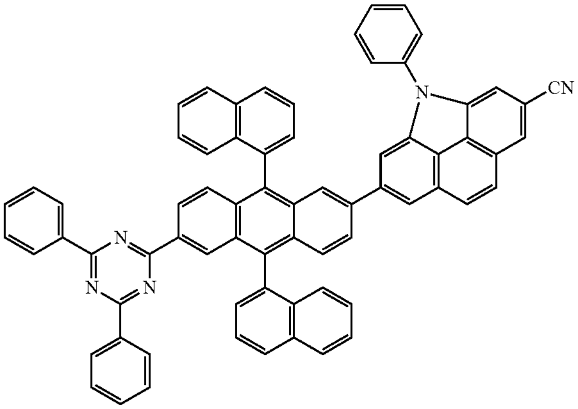
66
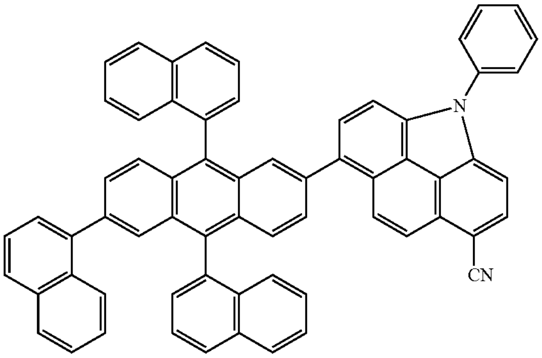
67
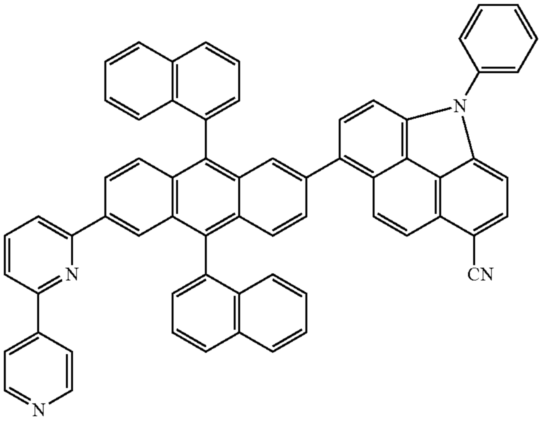
68
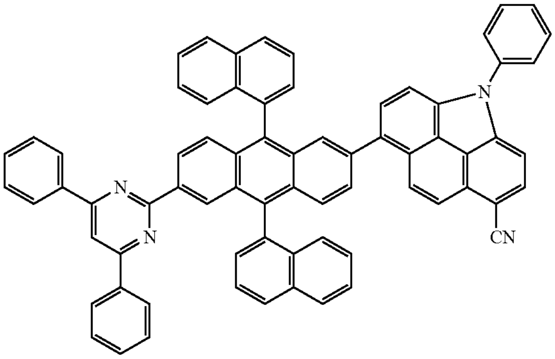

-continued
69
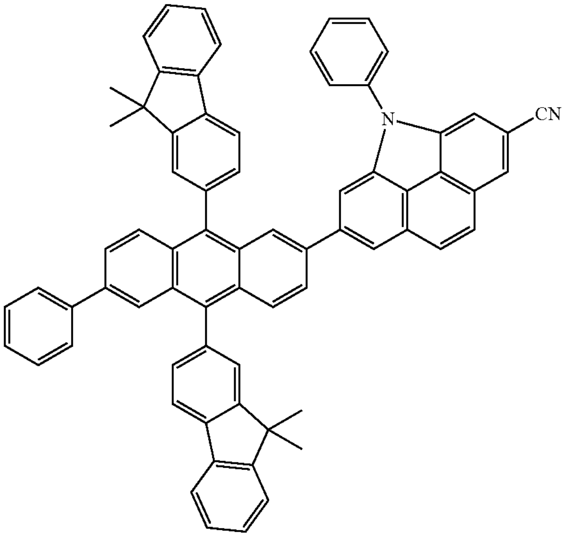
70
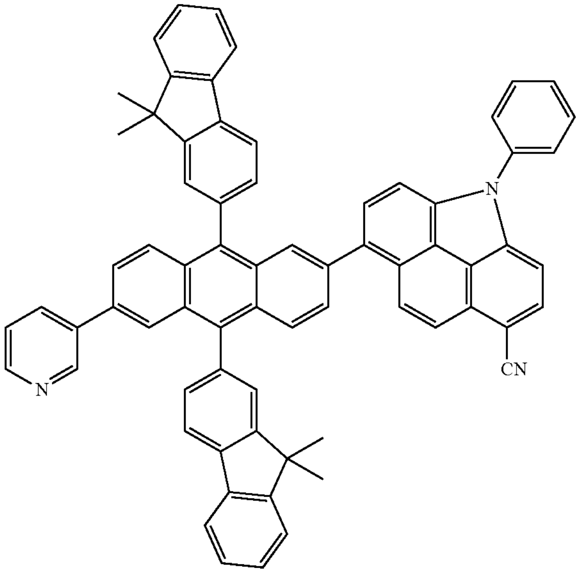
71
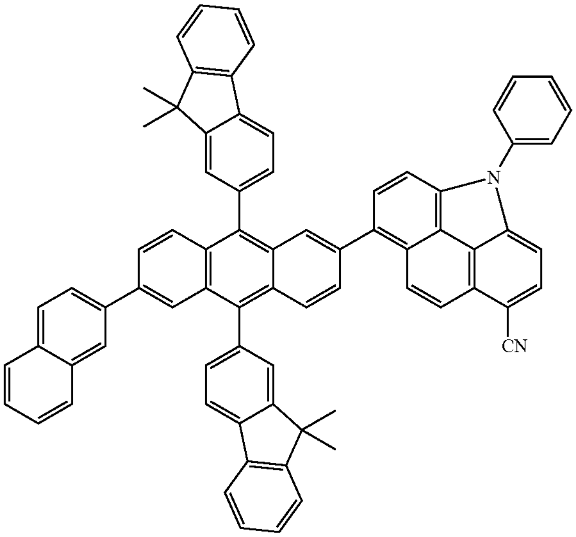
72
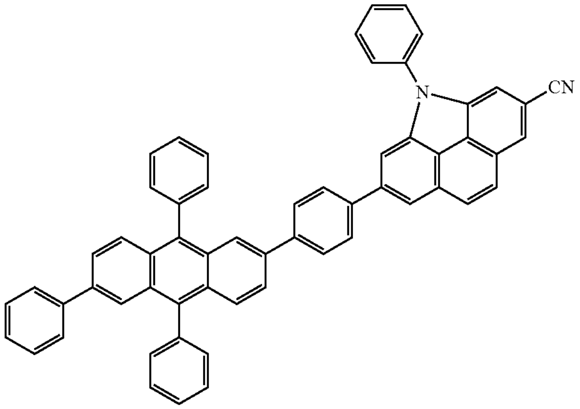
73
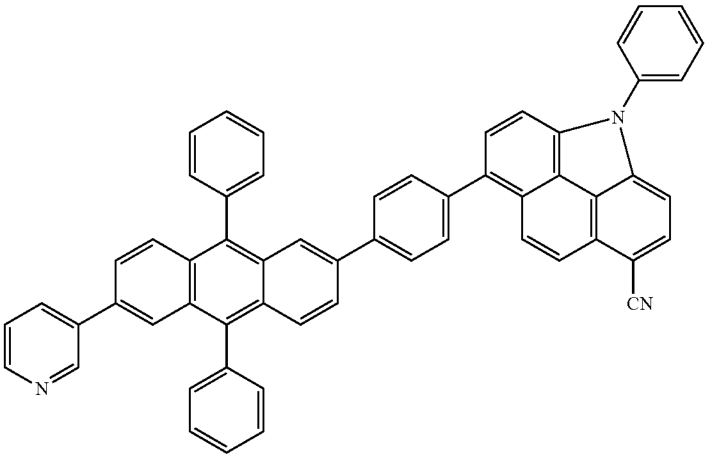

-continued
74
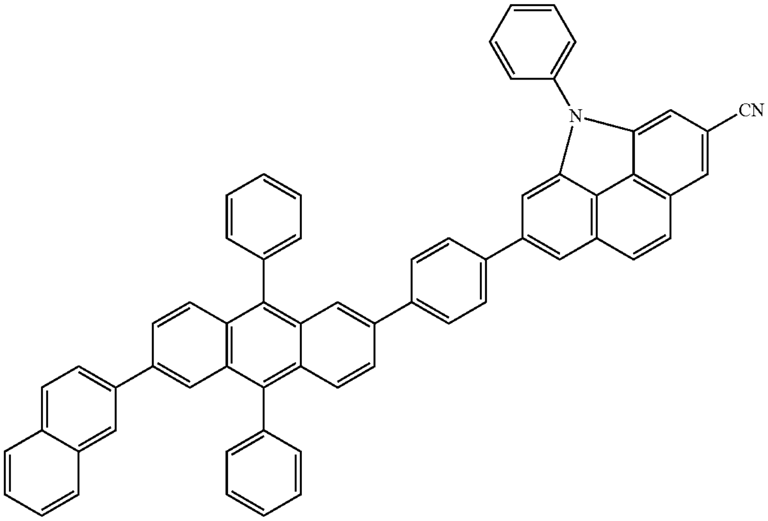
75
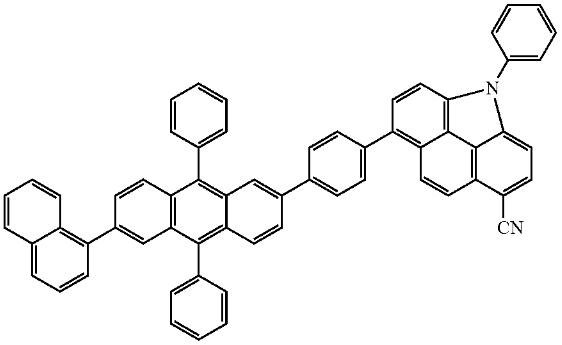
76
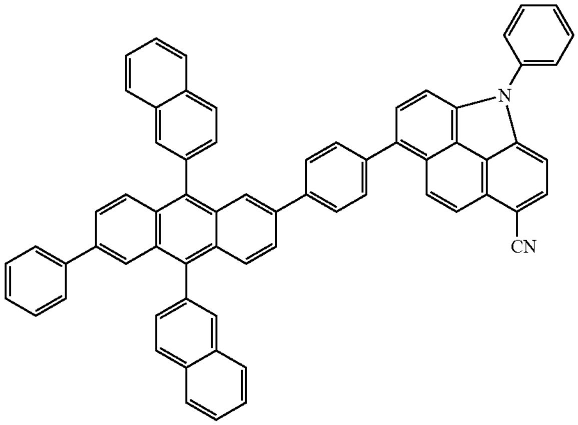
77
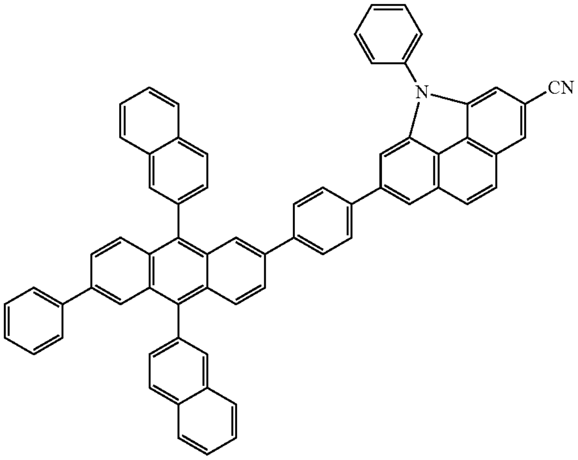
78
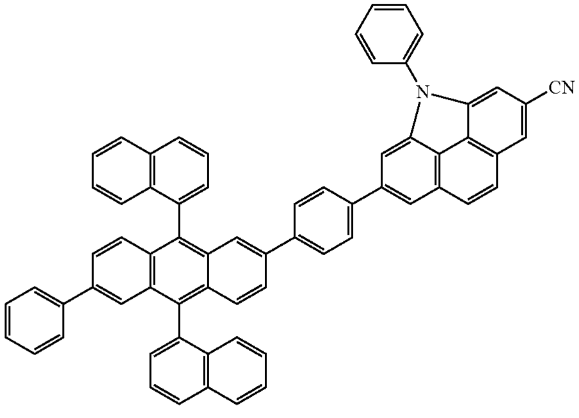

-continued
79
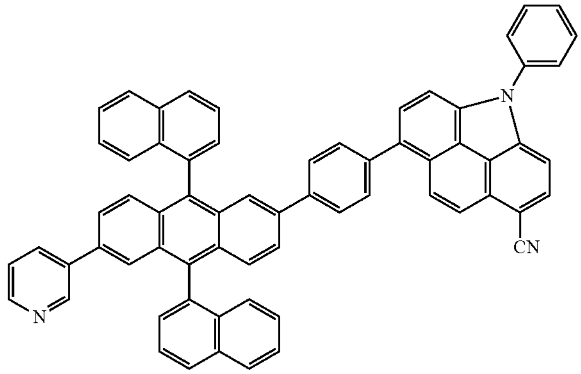
80
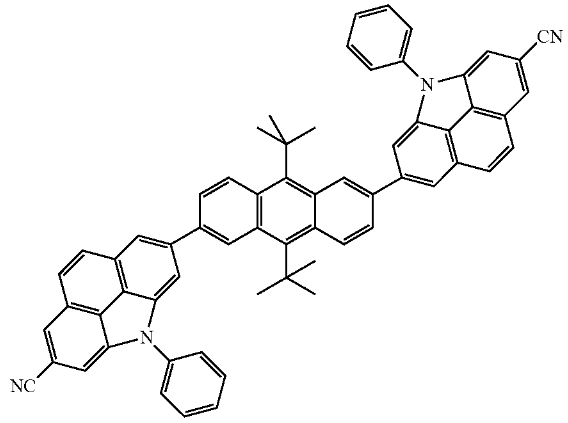
81
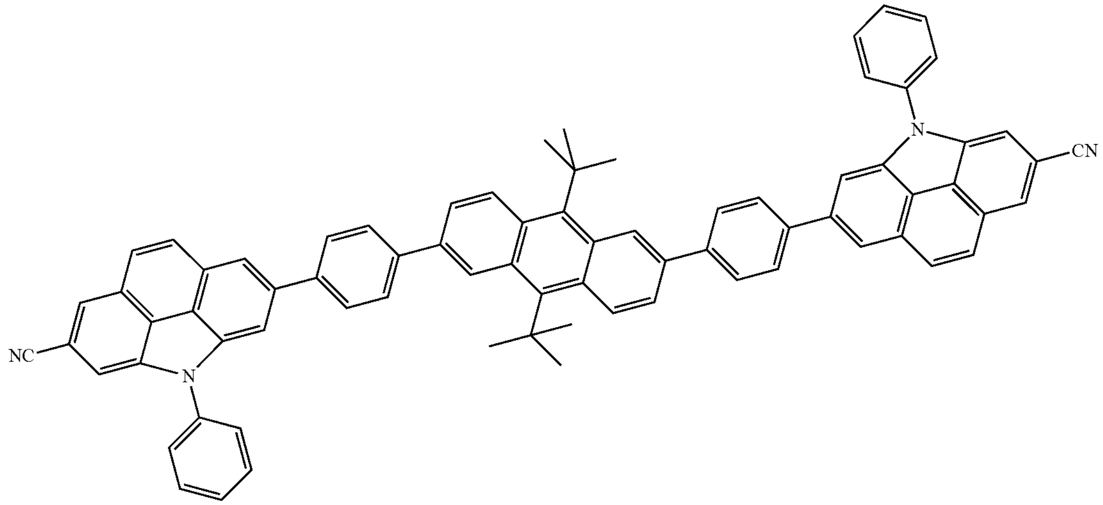
82
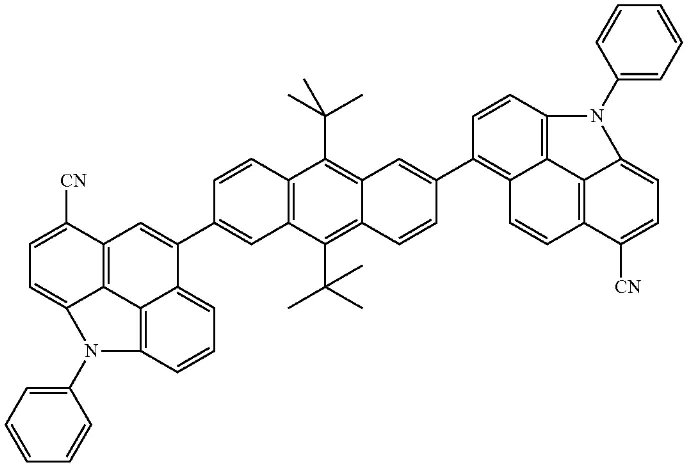

-continued
83
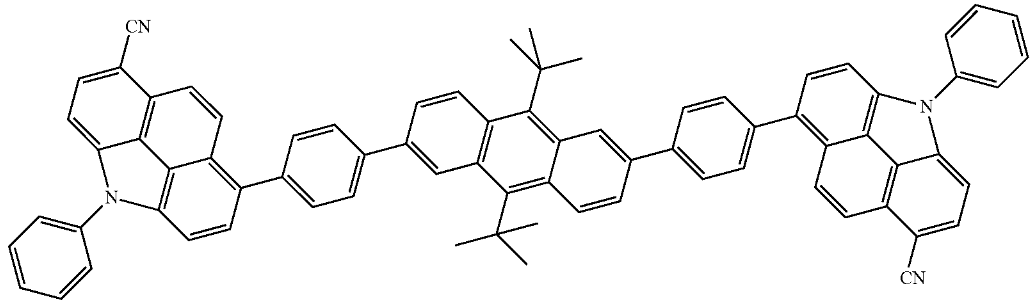
84
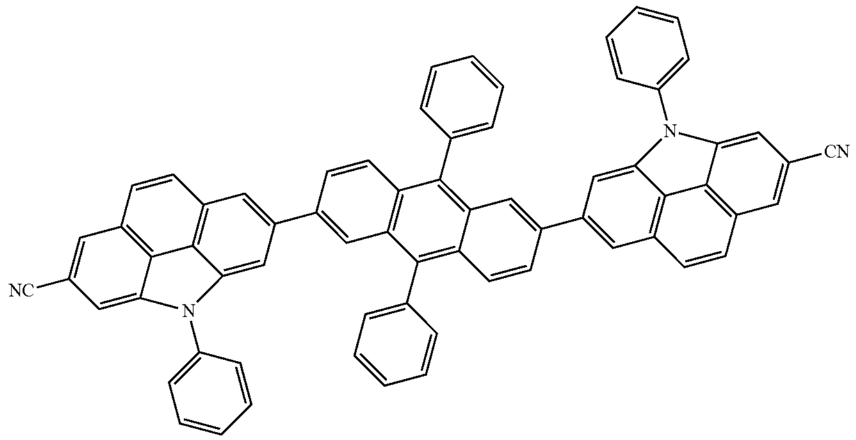
85
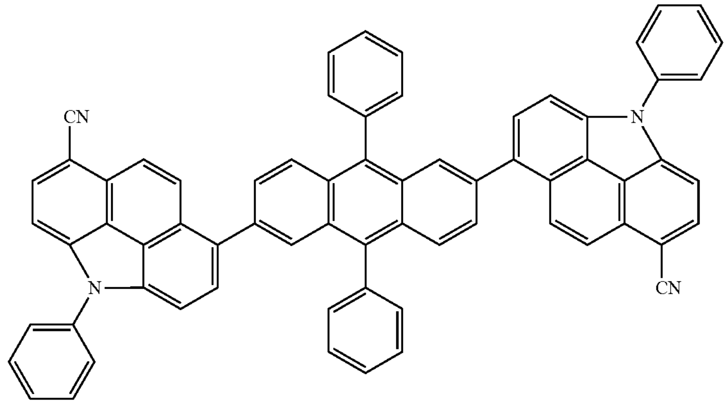
86
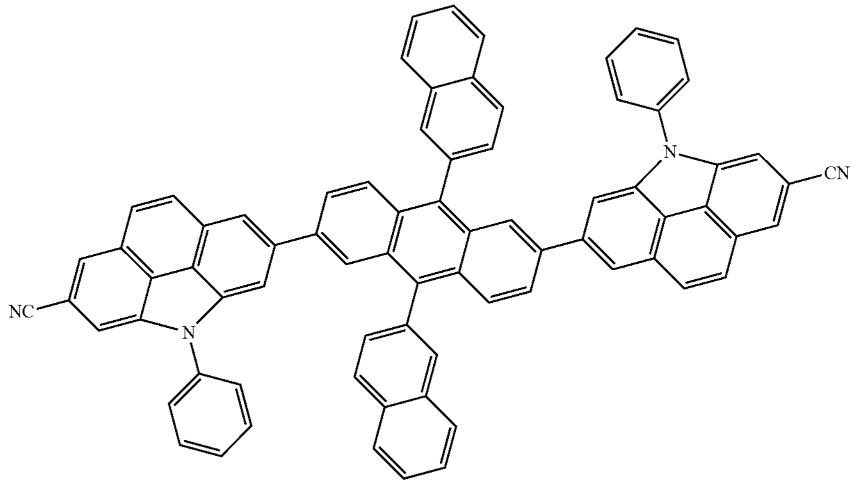

-continued
87
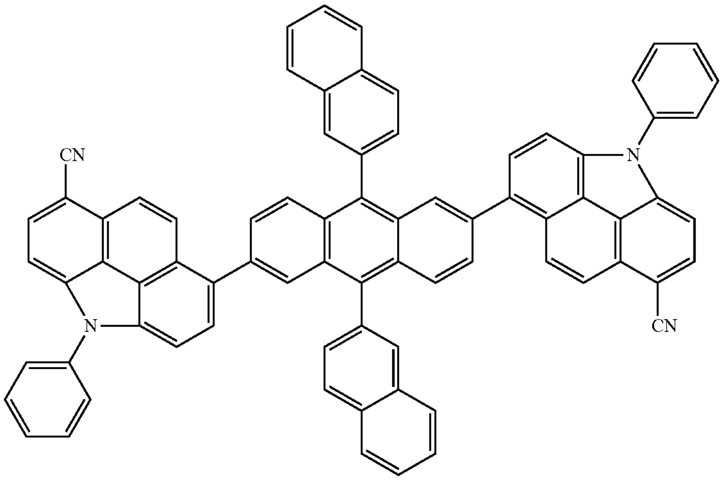
88
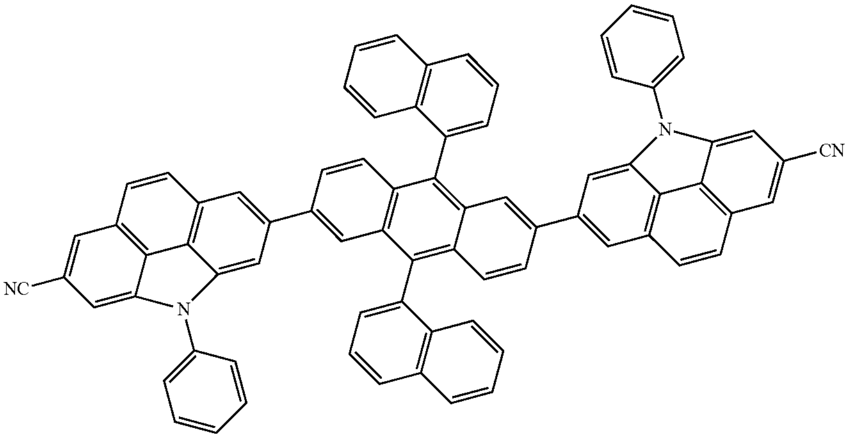
89
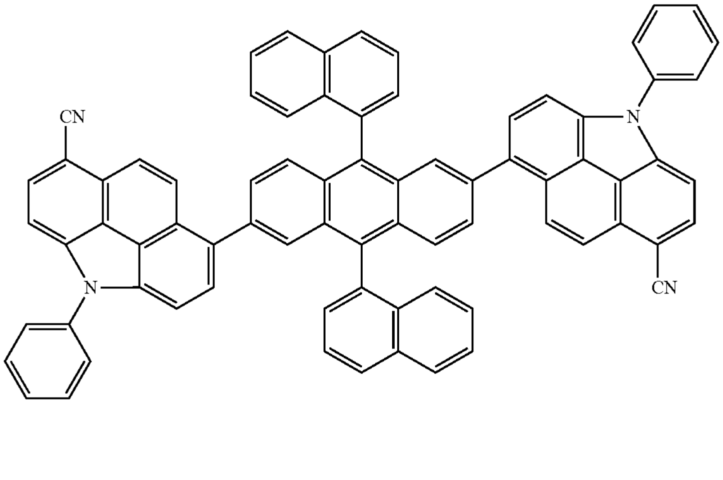

-continued
91
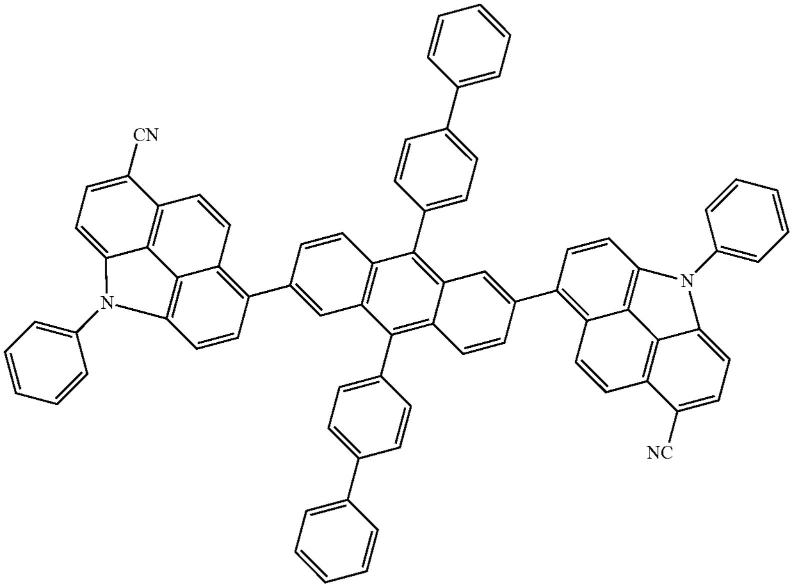
92
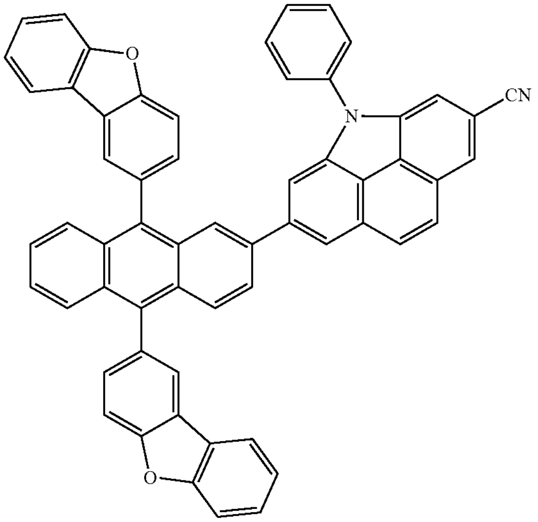
93
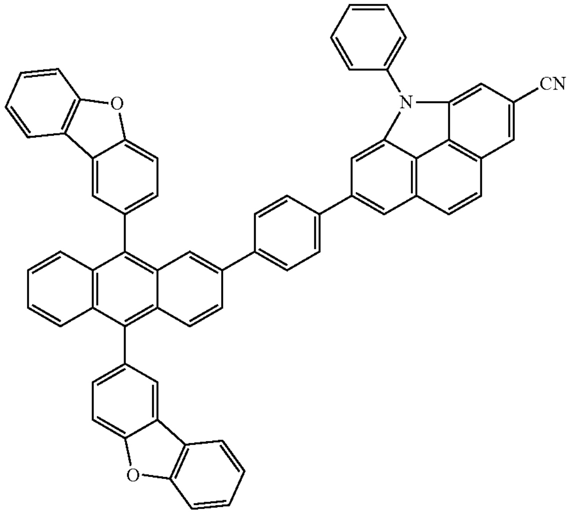
94
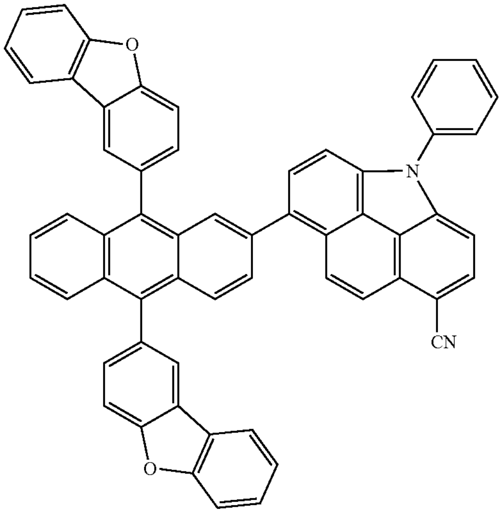
95
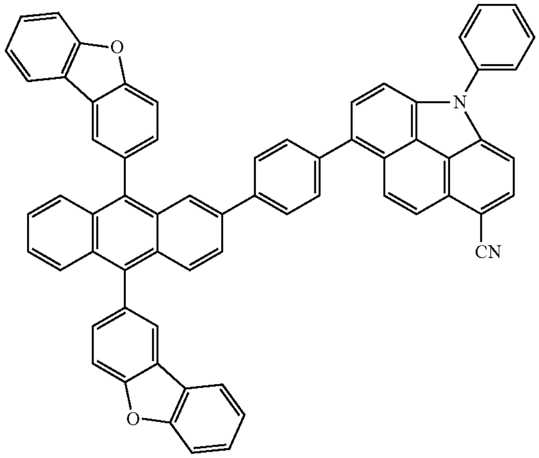

-continued

96

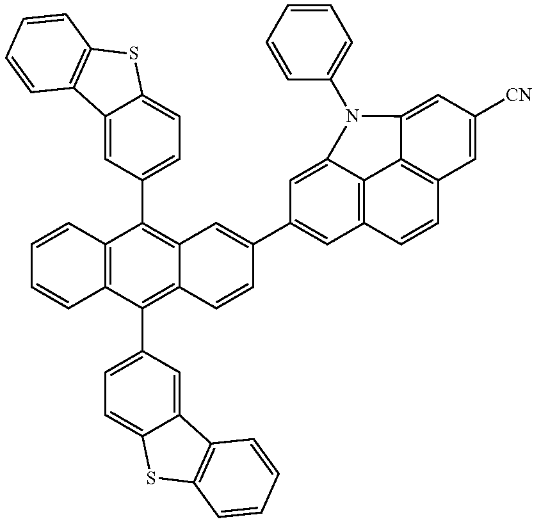

97

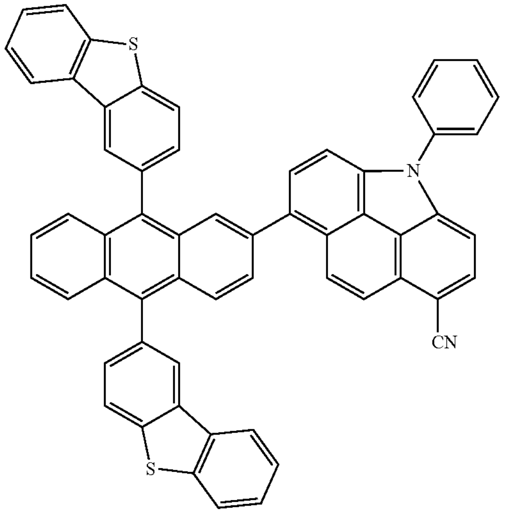

98

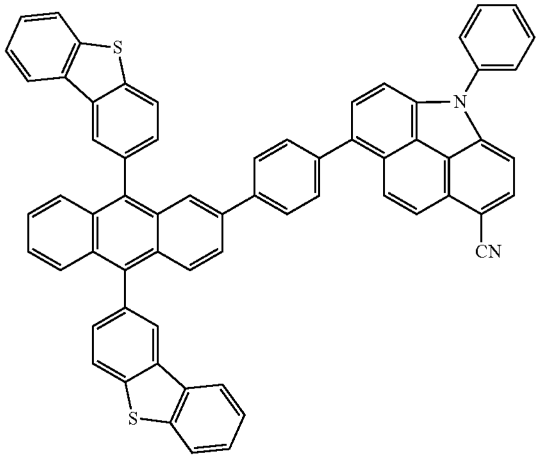

99

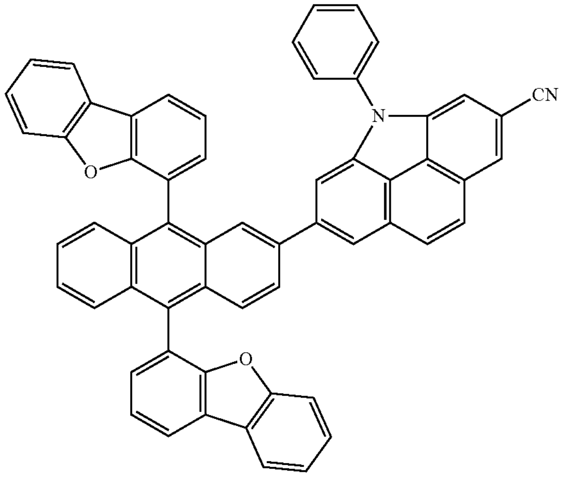

100

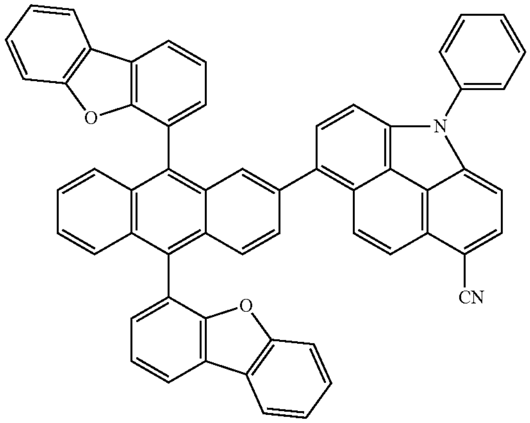

10. An organic light-emitting device comprising:
a first electrode;
a second electrode facing the first electrode; and
an organic layer between the first electrode and the second electrode,
wherein the organic layer comprises the heterocyclic compound of claim 1.

11. The organic light-emitting device of claim 10, wherein the organic layer is an electron injection layer or an electron transport layer.

12. The organic light-emitting device of claim 10, wherein the organic layer comprises an emission layer, and at least one selected from an electron injection layer, an electron transport layer, a functional layer having an electron injection capability and an electron transport capability, a hole injection layer, a hole transport layer, and a functional layer having a hole injection capability and a hole transport capability, and the emission layer comprises an anthracene-based compound, an arylamine-based compound, or a styryl-based compound.

13. The organic light-emitting device of claim 10, wherein the organic layer comprises an emission layer, and at least one selected from an electron injection layer, an electron transport layer, a functional layer having an electron injection capability and an electron transport capability, a hole injection layer, a hole transport layer, and a functional layer having a hole injection capability and a hole transport capability, and the emission layer comprises a red layer, a green layer, a blue layer, and a white layer, wherein any one of the red, green, and blue layers comprises a phosphorescent compound.

14. The organic light-emitting device of claim 13, wherein the organic layer comprises at least one selected from the hole injection layer, the hole transport layer, and the functional layer having a hole injection capability and a hole transport capability, and the at least one selected from the hole injection layer, the hole transport layer, and the functional layer having a hole injection capability and a hole transport capability comprises a charge-generation material.

15. The organic light-emitting device of claim 14, wherein the charge-generation material is a p-dopant.

16. The organic light-emitting device of claim 15, wherein the p-dopant is a quinone derivative, a metal oxide, or a cyano group-containing compound.

17. The organic light-emitting device of claim 10, wherein the organic layer comprises an electron transport layer comprising a metal complex.

18. The organic light-emitting device of claim 17, wherein the metal complex is an Li complex.

19. The organic light-emitting device of claim 10, wherein the organic layer is formed by performing a wet process using the heterocyclic compound.

20. The organic light-emitting device of claim 10, wherein the organic layer comprises a capping layer on the second electrode, wherein the capping layer comprises the heterocyclic compound.

21. A flat display apparatus comprising:

a thin film transistor comprising a source electrode and a drain electrode; and the organic light-emitting device of claim 10, wherein the first electrode of the organic light-emitting device is electrically connected to the source electrode or the drain electrode of the thin film transistor.

* * * * *